(12) United States Patent
Tachimori

(10) Patent No.: US 6,603,340 B2
(45) Date of Patent: Aug. 5, 2003

(54) DELAY CIRCUIT, VOLTAGE-CONTROLLED DELAY CIRCUIT, VOLTAGE-CONTROLLED OSCILLATION CIRCUIT, DELAY ADJUSTMENT CIRCUIT, DLL CIRCUIT, AND PLL CIRCUIT

(75) Inventor: Hiroshi Tachimori, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/917,934

(22) Filed: Jul. 31, 2001

(65) Prior Publication Data

US 2002/0033721 A1 Mar. 21, 2002

(30) Foreign Application Priority Data

Aug. 1, 2000 (JP) ........................................ 2000-232998

(51) Int. Cl.[7] ................................................. H03K 5/13
(52) U.S. Cl. ........................................ 327/262; 327/261
(58) Field of Search ................................ 327/158, 156, 327/100, 261, 264, 285, 276

(56) References Cited

U.S. PATENT DOCUMENTS

| | | | |
|---|---|---|---|
| 5,130,582 A | * 7/1992 | Ishihara et al. | ............. 307/591 |
| 5,175,512 A | 12/1992 | Self | ............. 331/57 |
| 5,412,349 A | 5/1995 | Young et al. | ............. 331/34 |
| 5,453,709 A | * 9/1995 | Tanimoto et al. | ........... 327/276 |
| 5,559,476 A | 9/1996 | Zhang et al. | ............. 331/57 |
| 5,880,579 A | 3/1999 | Wei et al. | ............. 323/282 |
| 5,889,439 A | 3/1999 | Meyer et al. | ............. 331/17 |
| 6,060,930 A | 5/2000 | Choi | ........................ 327/276 |
| 6,262,616 B1 | * 7/2001 | Srinivasan et al. | ......... 327/264 |

OTHER PUBLICATIONS

Zhang Z–X et a; "A 360MHz 3V CMOS PLL with 1V Peak–to–Peak Power Supply Noise Tolerance", IEEE International Solid State Circuits Conference, IEEE Inc., New York, U.S., vol. 39, Feb. 1, 1996, pp 134–135, 431.

* cited by examiner

Primary Examiner—Dinh T. Le
(74) Attorney, Agent, or Firm—Rader, Fishman & Grauer PLLC; Ronald P. Kananen, Esq.

(57) ABSTRACT

An inverter type delay circuit, voltage-controlled oscillation circuit, and voltage-controlled delay circuit capable of realizing simplification of circuit configuration, reduction of an effect of power source noise, and reduction of jitter, wherein a delay circuit, voltage-controlled oscillation circuit, and voltage-controlled delay circuit comprised of a plurality of delay stages controlled in drive current in accordance with a bias voltage or a control voltage and determined in delay time by the drive current, adding a change of a power source voltage to the above bias voltage or control voltage by a predetermined ratio and supplying a result of the addition to the above delay stages to suppress the power source voltage dependencies of the delay times of the delay stages, or connecting by a predetermined ratio a plurality of delay stages having different power source voltage dependencies, for example, power source voltage dependencies of opposite delay times, to suppress the power source voltage dependencies of delay times of the delay stages are realized.

65 Claims, 43 Drawing Sheets

EQUIVALENT CIRCUIT

OPERATION WAVEFORM OF Vcntn- Vthn ≦ VthL

OPERATION WAVEFORM OF Vcntn- Vthn ≧ VthL (a) CIRCUIT EXAMPLE OF VARIABLE CAPACITANCE ELEMENT FIG.38A DIGITAL POWER SOURCE NOISE < SEVERAL TENS OF μM OF AVERAGED BY TIME AXIS OF T/10

FIG.38B VOLTAGE-CONTROLLED OSCILLATOR fVCO

FIG.38C REFERENCE CLOCK Hsync

FIG.38D LAG FILTER Vcnt'

FIG.38E LAG-LEAD FILTER Vcnt

DELAY CIRCUIT, VOLTAGE-CONTROLLED DELAY CIRCUIT, VOLTAGE-CONTROLLED OSCILLATION CIRCUIT, DELAY ADJUSTMENT CIRCUIT, DLL CIRCUIT, AND PLL CIRCUIT

BACKGROUND OF THE INVENTION

1. Field of the Invention

The present invention relates to a delay circuit, for example, a delay circuit having a stable delay time or a voltage-controlled delay circuit capable of controlling a delay time in accordance with a control voltage, furthermore, a voltage-controlled oscillation circuit capable of controlling an oscillation frequency in accordance with a control voltage, a delay adjustment circuit using a delay circuit, a DLL (Delay Locked Loop) circuit, and a PLL (Phase Locked loop) circuit.

2. Description of the Related Art

A delay time of a delay circuit or a voltage-controlled delay circuit changes when there is a power source noise, such as changes of a power source voltage. Further, in an oscillation circuit configured by a plurality of delay circuits connected in a ring, it is possible to configure a voltage-controlled oscillation circuit (VCO) by controlling the delay times of the delay circuits in accordance with control voltages. When power source noise arises, the delay times of the delay circuits change, so the oscillation frequency of the VCO also changes accordingly.

In a PLL circuit configured by a phase comparison circuit, loop filter, VCO, etc., changes of the oscillation frequency of the VCO can be reduced by feedback control. Namely, when the oscillation frequency of the VCO changes due to power source noise, the deviations of phase and frequency of the oscillation signal generated by the effect of the power source noise can be corrected to a certain extent by detecting the deviations of the phase and frequency of the oscillation signal by the phase comparison circuit, generating a control signal in accordance with the result of detection of the phase deviation, and correcting the oscillation frequency of the VCO and therefore it is possible to suppress generation of jitter by the power source noise.

In displaying a video signal of a personal computer (PC) and displaying OSD (On Screen Display) letters of a television monitor, a dot clock signal multiplied by a PLL circuit using a horizontal synchronizing signal $H_{sync}$ as a reference clock is generated. Graphic data and text data are displayed by this dot clock signal. When jitter of the PLL circuit is not very small, it is visually perceived as a flicker or waving on the screen. For example, if exactly 24 dots/letter×32 letters= 768 dots are displayed in the horizontal direction, the effective horizontal period is 70%, and the allowable amount of jitter is ±⅛ dot, the amount of jitter has to be suppressed to about ±1/(768÷0. 7×8)=±⅟8777 of the cycle of the horizontal synchronization signal. The standard of the amount of jitter is ±7.1 ns when the frequency of the horizontal synchronization signal $f_H$=15.734 kHz, while the standard of the amount of jitter is ±2.4 ns when the frequency of the horizontal synchronization signal $f_H$=46.250 kHz. Further, the standard of the amount of jitter becomes ±1.1 ns when the frequency of the horizontal synchronization signal $f_H$=106.250 kHz.

It might appear that the target values of the amount of jitter described above can be easily satisfied, however, in the case of a PLL circuit of a high multiplication factor, when the cycle of the reference clock of the PLL circuit is $T_{ref}$ and the frequency thereof is $f_{ref}$, an effect due to digital noise generated in a much shorter period than $T_{ref}$ is corrected in its average value portion by a feedback loop of the PLL circuit, so the remaining portion deviated from the average value affects the amount of jitter.

As $T_{ref}$ becomes longer, the deviated portion is added, so when the amount of jitter is $T_j$, it is presumed that the relationship of $$(T_j \alpha \sqrt{F_{ref}} = 1\sqrt{f_{ref}})$$

stands.

FIG. 45 shows the relationship of a target value of the amount of jitter and ability of a PLL. As shown in the figure, there arises a case where even if a target value is cleared at a frequency of the horizontal synchronization signal $f_H$=15.734 kHz, target values cannot be cleared at frequencies of the horizontal synchronization signal $f_H$=47.250 kHz and $f_H$=106.250 kHz.

Namely, the amount of jitter at $f_{ref}$=100 kHz is presumed to become 14 times as much as the amount of jitter at $f_{ref}$=20 MHZ. The actual amount of jitter becomes still larger than this. Therefore, it is very difficult to design a PLL circuit of a very high multiplication factor wherein the multiplication factor is several thousand to ten thousand times.

There are many video signal standards for video signals of personal computers. For the horizontal synchronization signal, computers are required to be able to handle a frequency band of 31.436 kHz to 106.250 kHz.

Also, regarding TV monitors, a variety of specifications have come into existence along with the spread of digital broadcasting. For the horizontal synchronization signal, monitors are required to be able to handle a frequency band of 12.587 kHz to 47.250 kHz.

A PLL circuit used for such diverse applications is required to change characteristics of the filter etc. to match with the frequency $f_H$ of the horizontal synchronization signal. This cannot be done by changing outside parts, so it is preferable to design the PLL circuit to be built into the semiconductor integrated circuit except for some parts and to enable changes by a program.

A PLL circuit resistant to jitter even when receiving noise from other digital circuits is necessary when building it into a semiconductor integrated circuit.

PLL circuits have been designed by solving characteristic formulas of feedback loops, so the techniques for reducing jitter of a PLL or DLL have mainly focused on techniques for achieving both high speed pull-in and reduced jitter (making filter characteristics variable etc.)

It is considered better to reduce the gain of a PLL circuit by characteristic formulas to realize lower jitter, but when reducing the gain of the PLL circuit, there are problems that the pull-in speed declines and there is greater susceptibility to process variations. Various measures have therefore been taken in the circuit.

For example, an initial control voltage of the VCO is supplied by a digital/analog converter (DAC), and an output voltage of a charge pump when pull-in ends is stored. Rough control is performed by digitally changing the number of delay stages of the VCO circuit and a current supply ability of a current source transistor, while precise control is performed by an analog control voltage. Here, the circuit operates as a digital PLL in an unlocked state and operates as a PLL in a locked state. Measures are taken such as making the output current of the charge pump variable and making the output current of the charge pump small in a locked state etc.

Patent documents Japanese Unexamined Patent Publication (Kokai) No. 9-214340 "PLL Circuit", Japanese Unexamined Patent Publication (Kokai) No. 9-172370 "PLL Circuit", Japanese Unexamined Patent Publication (Kokai) No. 7-106959 "Phase Synchronization Circuit", Japanese Unexamined Patent Publication (Kokai) No. 10-242851 "PLL Circuit", etc. disclose PLL circuits improved as explained above.

However, since power source voltage dependency was not included in the characteristic formula of the feedback loop, designers of PLL circuits did not view design of a circuit having a small power source voltage dependency as being a general problem. Therefore, the above measures did not consider the jitter caused by power source noise in a locked state—which becomes a problem in a PLL of a high multiplication factor and low jitter used for displaying a video signal on a personal computer and displaying OSD letters on a TV monitor.

As prior art considering jitter caused by power source noise in a locked state, there is the patent document Japanese Unexamined Patent Publication (Kokai) No. 8-288801 "Low Jitter Broad Frequency Range Voltage-Controlled Oscillator". In the publication, there is reported that "an output frequency generated by a voltage-controlled oscillator is a linear function of a control voltage Vc. On the other hand, it changes together with a power source voltage $V_{dd}$ according to an inverse square root function of a supply voltage . . . . A change of about 3% of the frequency generated by the voltage-controlled oscillator corresponds to a change of 10% of a high PSRR:$V_{dd}$" and that "inverse relationship between a frequency and a supply voltage: this condition is useful in stabilizing a loop". The balance in the overall feedback loop was therefore considered, but high speed phenomena such as digital noise was not considered.

In recent years, in the field of ATM (Asynchronous Transfer Mode) communication etc., PLL by a voltage-controlled oscillator using a differential delay circuit and DLL by a voltage-controlled delay circuit (VCD circuit) using a differential circuit have been developed to deal with the increasingly higher frequency of system clocks and PLL or DLL being built into chips.

A differential circuit has a good CMRR (common mode rejection ratio). Furthermore, if designed well, it has a good PSRR (power supply rejection ratio) and becomes resistant to digital noise—which becomes a problem when building the circuit into the chip. In this way, differential circuit designers considered the design of a circuit having a small power source voltage dependency to be a general problem.

Since differential circuit does not require full swing of an input/output signal, it can operate at a high speed, but it has the disadvantage that the output amplitude is not constant and the delay time is liable to change since the signal does not fully swing. To solve this, a clamp circuit or feedback circuit for making the output amplitude of a VCO circuit and VCD circuit constant has been provided, and PLLs and DLLs having low jitter have been developed. Also, consideration has been given to the method of replacing a current source transistor connected to a current line side with a source-follower transistor to keep the effects of power source changes from being transferred to the differential transistor and controlling the oscillation frequency by a gate input voltage of the source follower.

A differential circuit is explained in detail in Masayuki MIZUNO et al., "Low-Power and High-Speed LSI Technologies. A 0.18 μm CMOS Hot-Standby PLL Using a Noise-Immune Adaptive-Gain VCO", IEICE Trans. Electron (Inst. Electron. Inf. Commun. Eng.), Vol. E80-C, No. 12, pp. 1560 to 1571, 1997; the patent document Japanese Unexamined Patent Publication (Kokai) No. 9-214299 "Voltage-Controlled Oscillator" and its related article Takehiko NAKAO et al., "Single-Chip 4-Channel 155 Mb/s CMOS LSI Chip for ATM SONET/SDE Framing and Clock/Data Recovery", Dig. Tech. Pap., IEEE Int. Solid State Circuits Conf., Vol. 40, pp. 160 to 161, 448, 1997; etc.

In the above differential PLL circuit and DLL circuit, both of the D and /D transistors operate. Therefore, the power consumption and layout area become twice compared with a non-differential circuit. Since the input/output signal does not have to fully swing, the speed becomes high. For example, assuming that it is sufficient to swing about half the amplitude, the speed becomes about two times higher. However, since a clamp circuit and feedback circuit have to be attached, there are disadvantages that the power consumption is further increased and the speed does not become as high as expected. Also, since a signal which does not fully swing has to be converted to a signal which fully swings at the time of taking out an output signal, the duty is liable to go wrong. Further, the differential circuit has a large number of transistors connected in the vertical direction so measures have to be made to secure an operating margin when reducing the power source voltage of the semiconductor integrated circuit. Therefore, there are many technical problems in differential PLL circuits and DLL circuits.

SUMMARY OF THE INVENTION

An object of the present invention is to provide an inverter type delay circuit, a voltage-controlled oscillation circuit, a voltage-controlled delay circuit, a delay adjustment circuit, a DLL circuit, and a PLL circuit able to realize simplification of the circuit configuration, reduction of an effect of power source noise, and reduction of jitter by controlling a drive current supplied to an inverter delay element and using delay elements having different power source voltage dependencies.

To achieve the above object, a delay circuit of the present invention is a delay circuit having a delay stage having a drive current controlled in accordance with a bias voltage and having a delay time determined by the drive current, comprising an adding means for adding a change of a power source voltage to the bias voltage by a predetermined ratio and supplying a result of the addition to the delay stage.

Alternatively, in the present invention, preferably, the adding means includes an alternating current adding means for adding an alternating current component included in the amount of change of the power source voltage to the bias voltage.

Alternatively, in the present invention, preferably, the adding means comprises a direct current adding means for adding a direct current component included in the amount of change of the power source voltage to the bias voltage.

Alternatively, in the present invention, preferably, the delay stage comprises a MOS type inverter; a first current source transistor connected between the inverter and a supply line of the power source voltage and having a gate to which is applied a first bias voltage; and a second current source transistor connected between the inverter and a supply line of a reference voltage and having a gate to which is applied a second bias voltage.

Alternatively, in the present invention, preferably, the adding means comprises a first alternating current adding means for adding alternating current components included in an amount of change of the power source voltage to the first bias voltage and a second alternating current adding means for adding alternating current components included in the amount of change of the power source voltage to the second bias voltage.

Alternatively, in the present invention, preferably, the adding means comprises a first direct current adding means for adding direct current components included in the amount of change of the power source voltage to the first bias voltage and a second direct current adding means for adding direct current components included in the amount of change of the power source voltage to the second bias voltage.

Alternatively, in the present invention, preferably, the delay stage comprises a MOS type inverter; a plurality of first current source transistors each having one terminal connected to a supply line of the power source voltage and having a gate to which is applied a first bias voltage; a plurality of second current source transistors each having one terminal connected to a supply line of the power source voltage and having a gate to which is applied a second bias voltage; a first switching circuit connected between the first current source transistor and the inverter for selecting any one or more of output currents of the plurality of first current source transistors and supplying the same to the inverter; and a second switching circuit connected between the second current source transistor and the inverter for selecting any one or more of output currents of the plurality of second current source transistors and supplying the same to the inverter.

Alternatively, in the present invention, preferably, the delay stage comprises a MOS type inverter; a switching transistor each having one terminal connected to an output terminal of the inverter and a gate to which is applied the bias voltage; and a capacitor having one electrode connected to the other terminal of the switching transistor and having another electrode connected to a supply line of a reference voltage.

Alternatively, in the delay circuit of the present invention, preferably, the adding means comprises a capacitor connected between a supply line of the power source voltage and a supply line of the bias voltage and couples the alternating current components of a change of the power source voltage with the bias voltage.

Alternatively, according to the present invention, there is provided a delay circuit having a delay stage having a delay time determined by a supplied drive current, wherein the delay stage comprises a MOS type inverter; a first current source circuit for supplying a first drive current to the inverter in accordance with a first bias voltage; and a second current source circuit for supplying a second drive current having a power source voltage dependency different from that of the first drive current to the inverter.

Alternatively, in the present invention, preferably further provision is made of a first adding means for adding a change of the power source voltage to the first bias voltage by a first ratio and supplying a result of the addition to the first current source circuit and a second adding means for adding the change of the power source voltage to the second bias voltage by a second ratio and supplying a result of the addition to the second current source circuit.

Alternatively, according to the present invention, there is provided a delay circuit comprised of a plurality of delay stages having different power source voltage dependencies comprising first delay stages having a first power source voltage dependency and second delay stages having a second power source voltage dependency opposite to the first power source voltage dependency; the numbers of the first delay stages and the second delay stages being determined by a predetermined ratio.

Alternatively, in the present invention, preferably, the ratio of the first delay stages and the second delay stages is determined within a delay time when jitter of the delay circuit is not more than a desired target value.

Furthermore, in the present invention, preferably, further provision is made of third delay stages having suppressed power source voltage dependency of a delay time in addition to the first and second delay stages.

Alternatively, according to the present invention, there is provided a delay adjustment circuit for outputting a delay signal obtained by adding a predetermined time to an input signal, comprising a bias circuit for generating a bias voltage; a delay circuit for delaying the input signal by a plurality of different delay times controlled in accordance with the bias voltage and outputting a plurality of delay signals; and a selection circuit for selecting any one or more of the plurality of delay signals output from the delay circuit in accordance with a selection signal. Note that the above delay circuit has measures against power source noise as explained above and is suppressed in power source dependency of a delay time.

Alternatively, according to the present invention, there is provided a voltage-controlled delay circuit including a delay stage having a drive current controlled in accordance with a control voltage and having a delay time determined by the drive current, comprising an adding means for adding a change of a power source voltage to the control voltage by a predetermined ratio and supplying a result of the addition to the delay stage.

According to the present invention, there is provided a voltage-controlled delay circuit having a delay stage having a delay time determined by supplied drive currents, wherein the delay stage comprises a MOS type inverter; a first current source circuit for supplying a first drive current to the inverter in accordance with a first control voltage; and a second current source circuit for supplying a second drive current having a power source voltage dependency different from that of the first drive current to the inverter.

Alternatively, according to the present invention, there is provided a voltage-controlled delay circuit comprised of a plurality of delay stages having different power source voltage dependencies, comprising first delay stages having a delay time controlled in accordance with a control voltage and having a first power source voltage dependency and second delay stages having a delay time controlled in accordance with the control voltage and having a second power source voltage dependency opposite to the first power source voltage dependency; the numbers of the first delay stages and the second delay stages being determined by a predetermined ratio.

Alternatively, according to the present invention, there is provided a DLL circuit comprising a phase comparison means for comparing phases of an input signal and a delay signal and outputting a phase difference signal in accordance with a result of the comparison; a voltage output means for outputting a control voltage in accordance with the phase difference signal; and a voltage-controlled delay circuit for delaying the input signal by a delay time controlled in accordance with the control voltage and outputting the delay signal, wherein the voltage-controlled delay circuit has measures against power source voltage noise as explained above and is suppressed in power source voltage dependency of a delay time.

Alternatively according to the present invention, there is provided a voltage-controlled oscillation circuit comprising delay stages each having a drive current controlled in accordance with a control voltage and having a delay time determined by the drive current connected in a ring, comprising an adding means for adding a change of a power source voltage to the control signal by a predetermined ratio and supplying a result of the addition to the delay stages.

Alternatively, according to the present invention, there is provided a voltage-controlled oscillation circuit comprised of delay stages each having a delay time determined by a supplied drive current connected in a ring, wherein each delay stage comprises a MOS type inverter; a first current source circuit for supplying a first drive current to the inverter in accordance with a first control voltage; and a second current source circuit for supplying a second drive current having a power source voltage dependency different from that of the first drive current to the inverter.

Alternatively, according to the present invention, there is provided a voltage-controlled oscillation circuit comprised of a plurality of delay stages having different power source voltage dependencies connected in a ring, comprising first delay stages having a delay time controlled in accordance with a control voltage and having a first power source voltage dependency; and second delay stages having a delay time controlled in accordance with the control voltage and having a second power source voltage dependency opposite to the first power source voltage dependency; the numbers of the first delay stages and the second delay stages being determined by a predetermined ratio.

Alternatively, according to the present invention, there is provided a PLL circuit comprising a phase comparison means for comparing phases of a reference signal and an oscillation signal and outputting a phase difference signal in accordance with a result of the comparison; a voltage output means for outputting a control voltage in accordance with the phase difference signal; and a voltage-controlled oscillation circuit for oscillating at an oscillation frequency controlled in accordance with the control voltage and outputting an oscillation signal; wherein the voltage-controlled oscillation circuit has measures against power source voltage noise as explained above and is suppressed in power source voltage dependency of a delay time.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
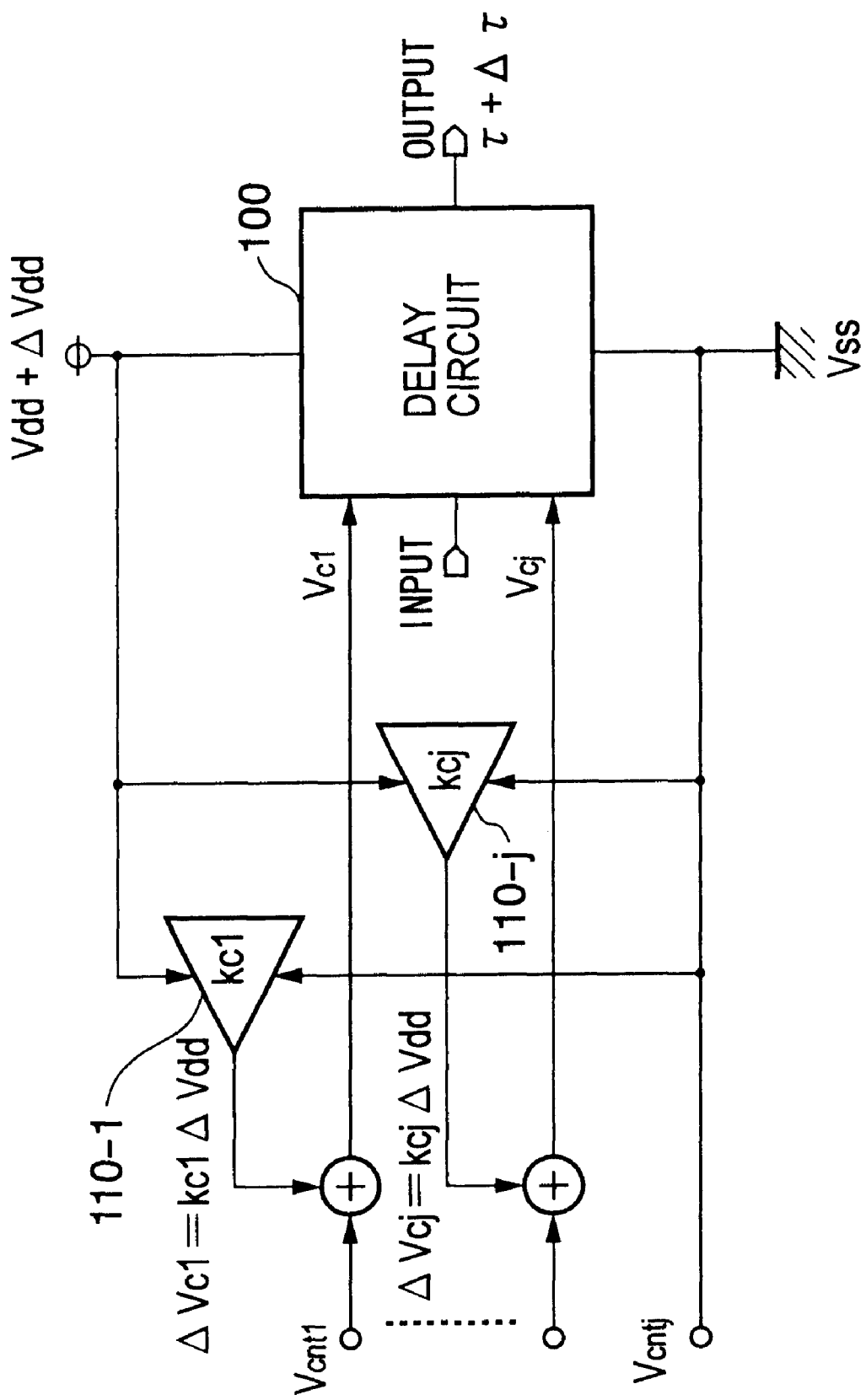
FIG. 1 is a schematic view of a first embodiment of a delay circuit, a voltage-controlled delay circuit, or a voltage-controlled oscillation circuit according to the present invention.

FIG. 1 is a schematic view of a first embodiment of a delay circuit according to the present invention.

As shown in the figure, a delay circuit of the present embodiment comprises a delay unit 100 comprised of delay elements and alternating current adding circuits (AC adding circuits) 110-1 to 110-j.

Also, bias voltages Vcnt1 to Vcntj are supplied by a not shown phase comparator, charge pump circuit, loop filter, and bias circuit.

The delay unit 100 is for example comprised of a plurality of delay elements connected in series. Note that each of the delay elements comprising the delay unit 100 of the present embodiment is an inverter type, for example including an inverter having a CMOS configuration, and outputs a logical inverse signal obtained by giving a predetermined delay time to an input signal. The total of the delay times of the delay elements is a delay time $T_D$ of the delay unit 100.

The AC adding circuits 110-1 to 110-j respectively output results $\Delta Vc1$ to $\Delta Vcj$ obtained by respectively multiplying alternating current components of a power source voltage $V_{dd}$ and a reference potential $V_{ss}$ with predetermined coefficients Kc1 to Kcj. Results obtained by adding bias voltages (or control voltages) Vcnt1 to Vcntj to outputs $\Delta Vc1$ to $\Delta Vcj$ of the AC adding circuits are supplied as control voltages Vc1 to Vcj to the delay circuit 100.

Here, when assuming the reference potential Vss=0 and that the alternating component of the power source voltage $V_{dd}$ added by the AC adding circuits 110-1 to 110-j is $\Delta V_{dd}$, the outputs $\Delta Vc1$ to $\Delta Vcj$ of the AC adding circuits 110-1 to 110-j are expressed by the formulas below.

$$\Delta Vc1 = Kc1 \cdot \Delta V_{dd}$$

$$\ldots$$

$$\Delta Vcj = Kcj \cdot \Delta V_{dd} \qquad (1)$$

Also, the control voltages Vc1 to Vcj are respectively determined by the formulas below.

$$Vc1 = Vcnt1 + \Delta Vc1 = Vcnt1 + Kc1 \cdot \Delta Vdd$$

$$\ldots$$

$$Vcj = Vcntj + \Delta Vcj = Vcntj + Kcj \cdot \Delta Vdd \qquad (2)$$

In the delay unit 100, delay times of the delay elements are controlled in accordance with the control voltages Vc1 to Vcj. Therefore, when the power source voltage $V_{dd}$ changes, the control voltage supplied to the delay unit 100 is controlled in accordance with an amount of change $\Delta V_{dd}$ of the power source voltage $V_{dd}$, and delay times of the delay elements comprising the delay unit 100 are controlled so that the amount of change of the power source voltage $V_{dd}$ is canceled. As a result, an effect by changes of the power source voltage $V_{dd}$ can be suppressed and a delay circuit having a stable delay time without any power source voltage dependency can be realized.

Note that in the present embodiment, the number of control sets comprising the AC adding circuit and bias circuit is not limited to two. More may be provided.

Note that when assuming that the voltages $V_{cnt1}, \ldots V_{cntj}$ input to the delay circuit in the figure are for example bias voltages maintained at a certain level, the delay time of the delay unit 100 is maintained constant. On the other hand, when assuming that the voltages $V_{cnt1}, \ldots V_{cntj}$ are for example control voltages output from a loop filter constituting the PLL circuit, the delay time of the delay unit 100 is controlled in accordance with the control voltages. Namely, the delay circuit of the present embodiment is capable of forming any one of a delay circuit of a constant delay time and a voltage-controlled delay circuit (VCD) capable of controlling a delay time in accordance with a control signal depending on usage. Furthermore, if an odd number of delay stages are connected in a ring in the delay unit 100, a voltage-controlled oscillation circuit (VCO) can be configured.

Figure 2:
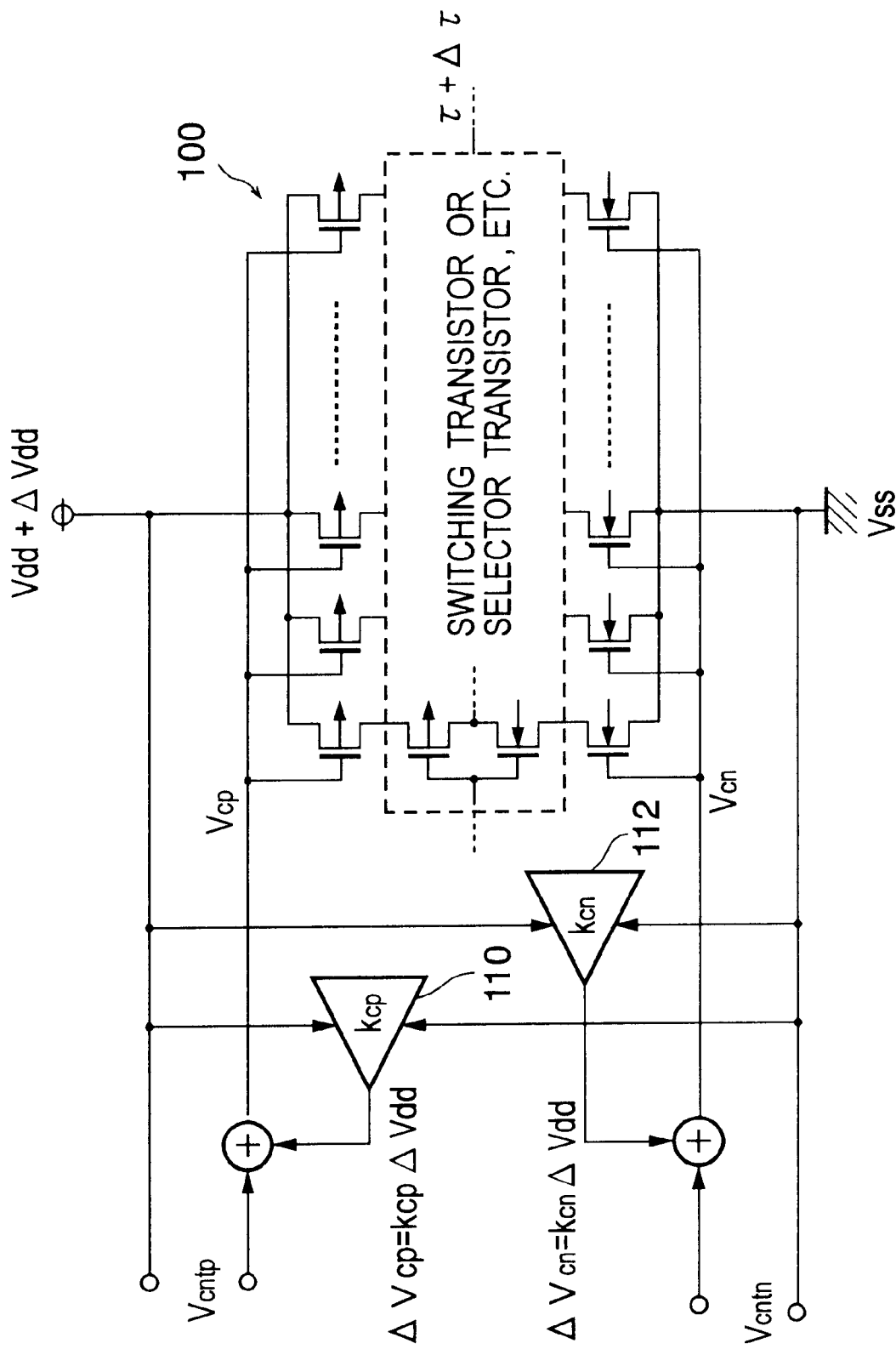
FIG. 2 is a view of the configuration of the first embodiment of the present invention.

FIG. 2 is a circuit diagram of an example of the configuration of the present embodiment. As shown in the figure, the delay unit 100 is configured including a current source transistor for supplying a drive current in a delay element comprised of a switching transistor or a selector transistor. For example, between each of the delay elements and the power source voltage $V_{dd}$ is connected a P-channel side current source transistor. A control terminal (gate) of the transistor is supplied with a control voltage $V_{cp}$ obtained by adding an alternating current adding circuit output $\Delta V_{cp}$ to a bias voltage $V_{cntp}$. At the same time, between each of the delay element and the reference potential $V_{ss}$ is connected an N-channel side current source transistor. A gate of the transistor is supplied with a control voltage $V_{cn}$ obtained by adding an alternating current adding circuit output $\Delta V_{cn}$ to a bias voltage $V_{cntn}$.

In the delay unit 100 configured in this way, delay times of the delay elements are controlled by an output current of the current source transistor. Namely, the delay times of the delay elements are controlled by control voltages $V_{c1}$ and $V_{c2}$. When the power source voltage $V_{dd}$ is changed, the effect of the change of the power source voltage $V_{dd}$ on the delay times of the delay elements is offset by adjusting the control voltages $V_{c1}$ and $V_2$ in accordance with the amount of change $\Delta V_{dd}$, So constant delay times can be realized.

In the delay circuit of the present embodiment, changes of delay times caused by changes of the power source voltage $V_{dd}$ can be suppressed by adding the change $\Delta V_{dd}$ of the power source voltage $V_{dd}$ to a control voltage at a suitable ratio and controlling so that changes of the delay times of the delay elements are offset.

The power source noise generated at the time of operating an output buffer is for example a pulse noise. The pulse width is at most several tens of nsec (nanosecond), so the effect can be obtained by providing at least an alternating current adding circuit. In a power source noise having a wider pulse width, direct current addition is preferable, but in this case, it is necessary to design the circuit so that a source of generation of a direct current level in a normal operation, such as an output of the charge pump and output of the bias circuit, does not compete with a direct current adding means.

Next, an explanation will be made of the suppression of changes in delay times by adding a change of a power source voltage at a suitable ratio to a control voltage and a bias voltage for a typical current source type delay circuit among inverter type delay circuits.

First Circuit Example

Figure 3:
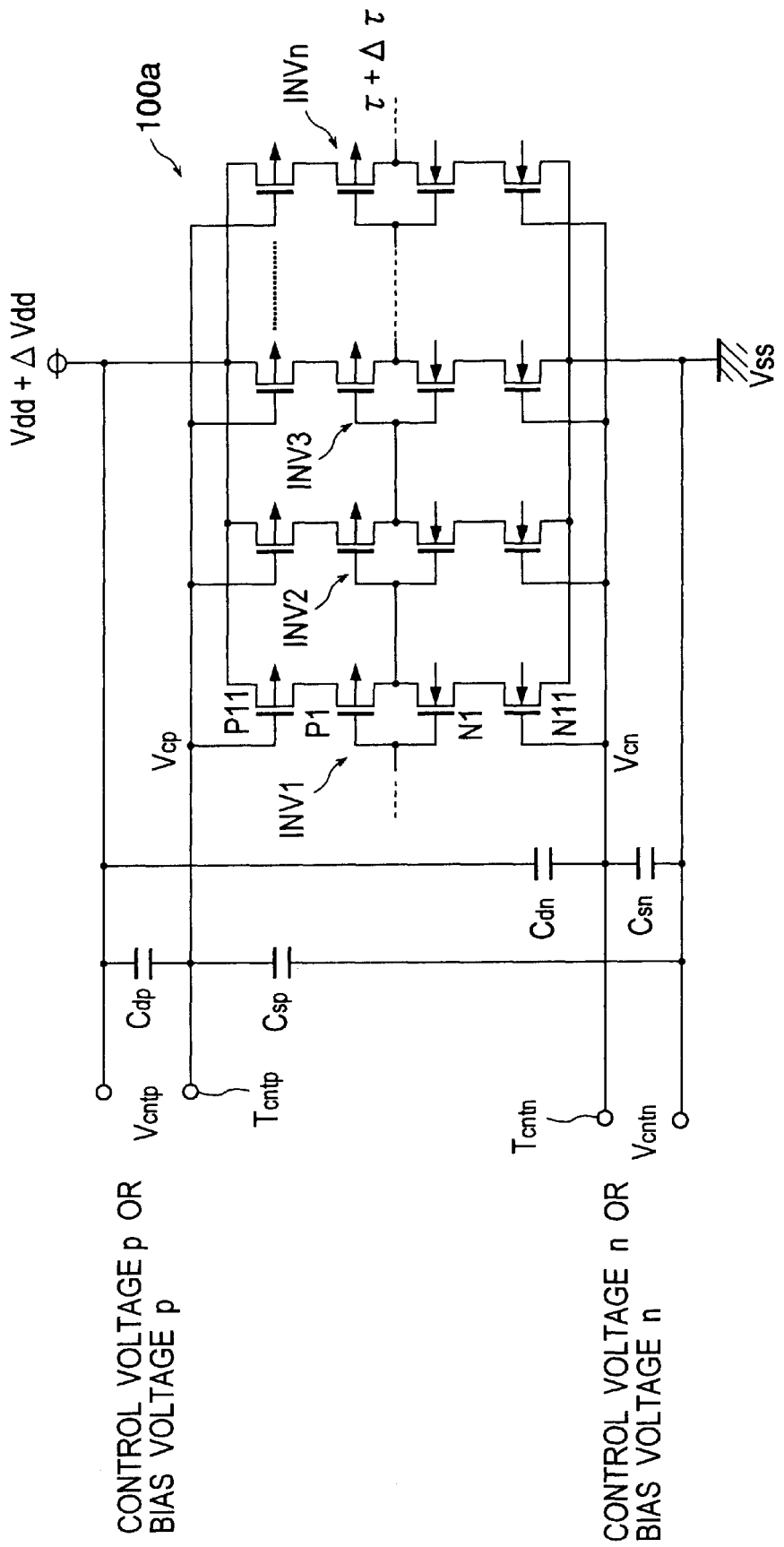
FIG. 3 is a circuit diagram of a first circuit example of the first embodiment of the present invention.

FIG. 3 is a view of an example of a first circuit of an inverter type delay circuit of the present embodiment. As shown in the figure, the delay circuit comprises a delay unit 100a and capacitors $C_{dp}$, $C_{sp}$, $C_{dn}$, and $C_{sn}$ for adding a change $\Delta V_{dd}$ of a power source voltage $V_{dd}$ by a certain ratio to control voltages $V_{cp}$ and $V_{cn}$ of the delay unit 100a.

A capacitor $C_{dp}$ is connected between the power source voltage $V_{dd}$ and an input terminal $T_{cntp}$, while a capacitor $C_{sp}$ is connected between the input terminal $T_{cntp}$ and a reference potential $V_{ss}$. The control $V_{cntp}$ is input to the input terminal $T_{cntp}$.

The capacitor $C_{dn}$ is connected between the power source voltage $V_{dd}$ and the input terminal $T_{cntn}$, while a capacitor $C_{sn}$ is connected between the input terminal $T_{cntn}$ and the reference potential $V_{ss}$. A control voltage $V_{cntn}$ is input to the input terminal $T_{cntn}$.

The delay unit 100a is comprised of n number of inverters INV1, INV2, . . . , INVn connected in series. Each of the inverters is comprised of a pMOS transistor and nMOS transistor having gates and drains connected in common. The pMOS transistor comprising a current source on the P-channel side is connected between a source of the pMOS transistor and the power source voltage $V_{dd}$, while the nMOS transistor comprising a current source on the N-channel side is connected between a source of the nMOS transistor and the reference potential $V_{ss}$. A control voltage $V_{cp}$ is applied to a gate of the transistor constituting the current source on the P-channel side, while a control voltage $V_{cn}$ is applied to a gate of the transistor constituting the current source on the N-channel side.

Supply currents of the current source on the P-channel side and the current source on the N-channel side are controlled in accordance with the control voltages $V_{cp}$ and $V_{cn}$. In accordance therewith, delay times of the n number of inverters INV1, INV2, . . . INVn provided as delay elements are controlled.

Below, an operation of a delay circuit of the present example will be explained.

Figure 4:
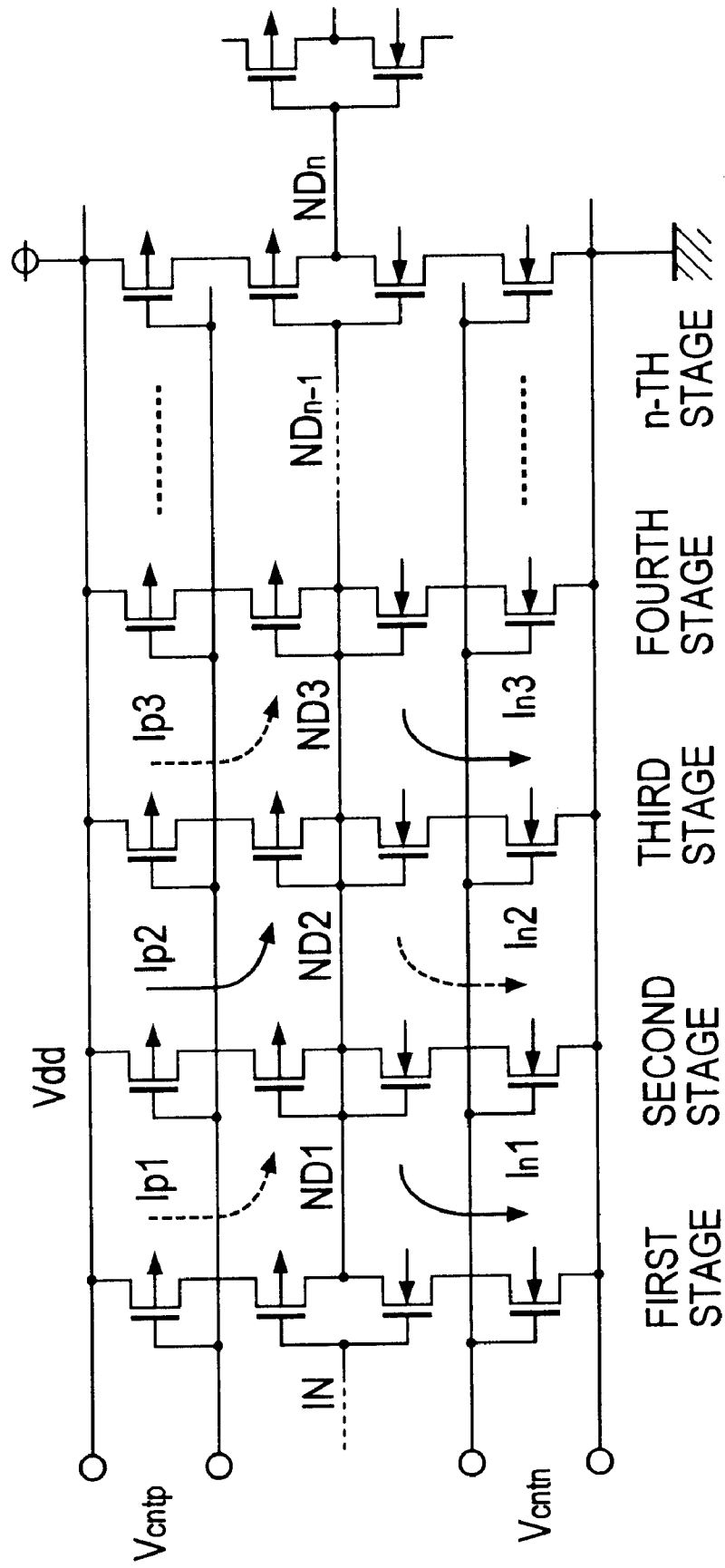
FIG. 4 is a circuit diagram of a delay unit configured by inverter type delay stages.
Figure 5A:
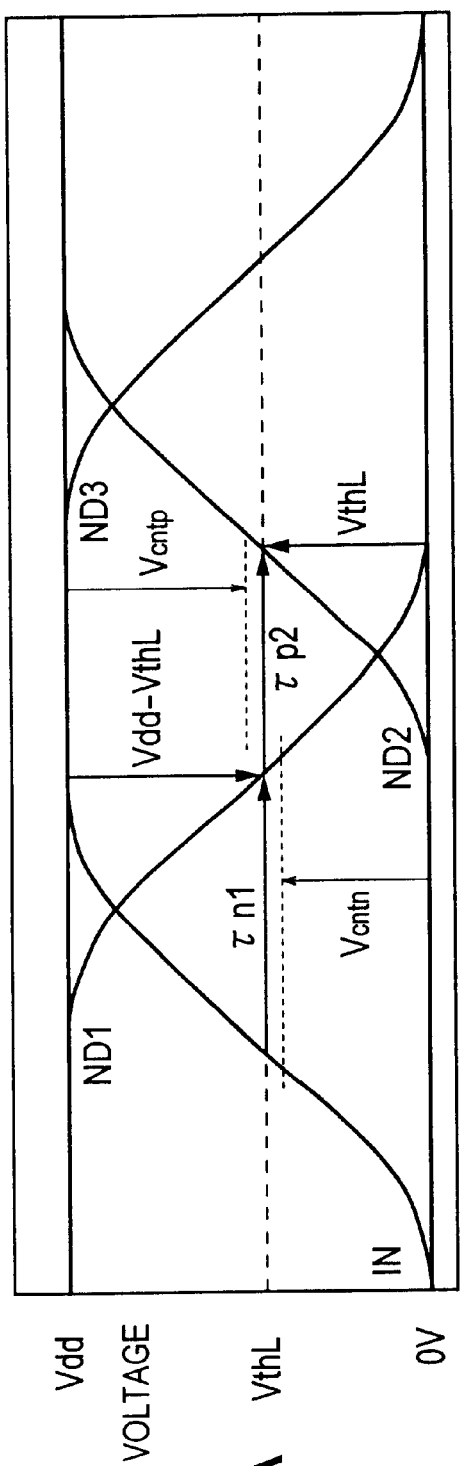
FIGS. 5A and 5B are waveform diagrams of an operation of a delay unit configured by inverter type delay stages.
Figure 5B:
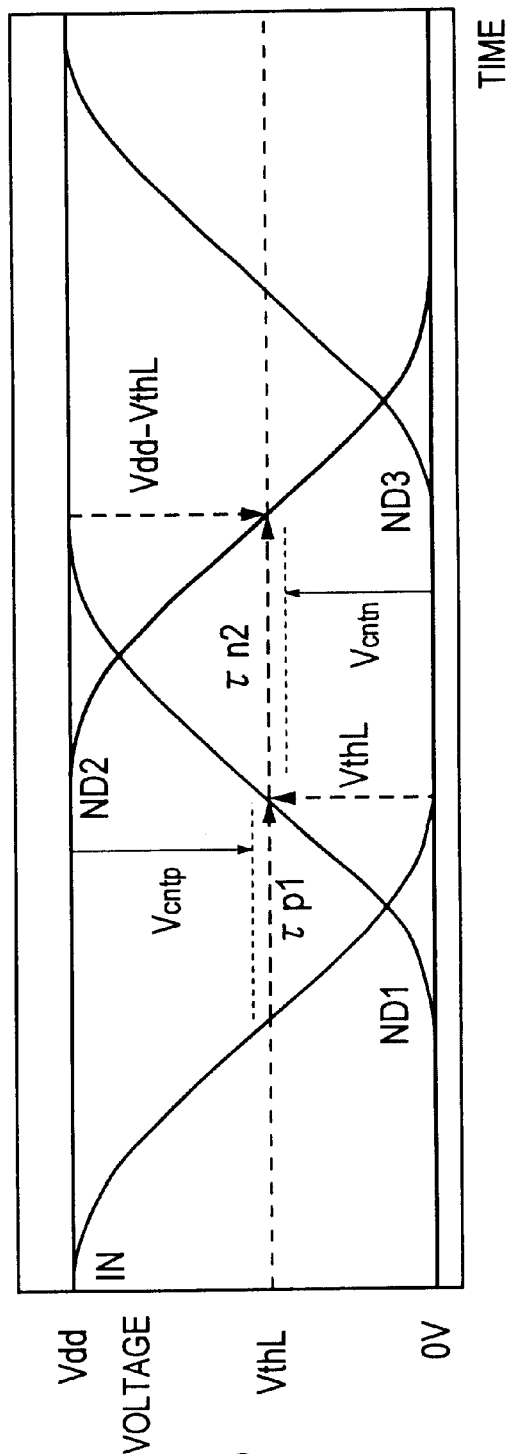

FIG. 4 is a circuit diagram of the configuration of the delay unit 100a, while FIGS. 5A and 5B are waveform diagrams of an operation of the delay unit 100a.

In the delay unit 100a, a drive current Ini (i=1, 2, . . . , n) regulated by the nMOS transistor constituting the N-channel side current source flows at the time of fall of an output signal of a delay stage, while a drive current Ipi controlled by the pMOS transistor constituting the P-channel side current source flows at the time of rise of the output signal of the delay stage.

In the operating waveform, the time from the point where an input signal level of a delay stage crosses a logical threshold voltage VthL to a point where an output signal level of the delay stage crosses a logical threshold voltage VthL (of the next stage) is considered the delay time of the delay stage. The delay time at the time of fall of an output signal is designated as τni and the delay time at the time of rise of the output signal is designated as τpi.

Here, when a load capacity of a delay stage output is CLi, the charge of the load capacity CLi is pulled in from Vdd to VthL is pulled in by an nMOS current source transistor for the period of τni of the fall of the output signal. Also, the charge of the load capacity Cli is stored from 0V to VthL by a PMOS current source transistor during the period of τpi at the time of rise of the output signal.

Accordingly, the formulas below stand.

$$\tau ni = Cli \times (Vdd - VthL)/Ini \quad (3)$$

$$\tau pi \approx Cli \times VthL/|Ipi| \quad (4)$$

Here, when assuming there was a change of a power source voltage Vdd, $$\ln(\tau ni) \ln(Cli) + \ln(Vdd - VthL) - \ln(Ini) \; \Delta\tau ni/\tau ni = (\Delta Vdd - \Delta VthL)/(Vdd - VthL) - \Delta Ini/Ini \quad (5)$$

so the following formulas are obtained:

$$\Delta\tau ni = \tau ni[\{(\Delta Vdd - \Delta VthL)/(Vdd - VthL)\} - (\Delta Ini/Ini)] \quad (6)$$

$$\Delta\tau pi = \tau pi\{(\Delta VthL - VthL) - (\Delta|Ipi|/|Ipi|)\} \quad (7)$$

When being designed balancing the NMOS transistor and pMOS transistor, since $Ini = |Ipi| = I_D$, $\tau ni = \tau pi = \tau d$, $VthL \approx V_{dd}/2$ in formula (6) and formula (7), the following formulas stand:

$$\Delta\tau ni \approx \tau d[\{(\Delta Vdd - \Delta VthL)/(Vdd/2)\} - (\Delta Ini/I_D)] \quad (8)$$

$$\Delta\tau pi \approx \tau d[\{\Delta VthL/(Vdd/2)\} - (\Delta|Ipi|/I_D)] \quad (9)$$

To reduce the effects of the power source noise for every delay stage, $\Delta\tau ni \approx 0$ and $\Delta\tau pi \approx 0$ are required, thus it is necessary that the next formulas stand from formula (8) and formula (9):

$$(\Delta Vdd - \Delta VthL)/(Vdd/2) \approx \Delta Ini/I_D \quad (10)$$

$$\Delta VthL/(Vdd/2) \approx \Delta|Ipi|/I_D \quad (11)$$

To ease the conditions and reduce the effects of the power source noise for every two consecutive delay stages, $\Delta\tau ni + \Delta\tau p(i\pm 1) \approx 0$ is required, thus the next formula is obtained from formula (8) and formula (9):

$$\Delta Vdd/(Vdd/2) \approx (\Delta Ini + \Delta|Ip(i\pm 1)|)/I_D \quad (12)$$

The control voltages Vcntn and |Vcntp| are generally values near Vdd/2. The NMOS current source transistor and pMOS current source transistor both operate in the saturated region. When the channel length modulation effect coefficients are λn and λp, the current formulas of the saturated region including the channel length modulation effect are given as follows:

$$Ini = (\frac{1}{2})\mu n \; Cox(Wni/Lni)(1 + \lambda n \; VthL)(Vcntn - Vthn)^{**}2 \quad (13)$$

$$|Ipi| = (\frac{1}{2})|\mu p|Cox(Wpi/Lpi)\{1 + |\lambda p|(Vdd - VthL)\}(Vcntp - Vthp)^{**}2 \quad (14)$$

There is no general definition of a logical threshold voltage of an inverter circuit having a current source transistor, but when defining that when the voltage of an inverter operating gate input signal is generally Vdd/2, the voltage of an output signal of a delay stage balances at VthL and Ini=|Ipi| stands, the following formula is obtained from formula (13) and formula (14):

$$VthL = \{(1/2)|\mu p|Cox(Wpi/Lpi)(1+|\lambda p|Vdd)(Vcntp - \qquad (15)$$
$$Vthp)**2 - (1/2)|\mu n|Cox(Wni/Lni)(1 +$$
$$\lambda n \cdot 0)(Vcntn - Vthn)**2\} \div$$
$$\{(1/2)|\mu p|Cox(Wpi/Lpi)|\lambda p|(Vcntp - Vthp)**2 -$$
$$(1/2)\mu n\, Cox(Wni/Lni)\lambda n(Vcntn - Vthn)**2\}$$

A change ΔVthL of the logical threshold voltage is found as follows from formula (15):

$$VthL=\{|\lambda p|/(\lambda n+|\lambda p|)\}\Delta Vdd \qquad (16)$$

If considering that values of λn and |λn| are small, the changes Δini and Δ|Ipi| of Ini and |Ipi| do not include the effect of channel length modulation even when found from current formulas (13) and (14) of saturated regions including effects of channel length modulation. The same results can be obtained even when finding them from current formulas of saturated regions shown in formulas (17) and (18):

$$Ini=(\tfrac{1}{2})\mu n\, Cox(Wni/Lni)(Vcntn-Vthn)**2 \qquad (17)$$

$$|Ipi|=(\tfrac{1}{2})|\mu p|Cox(Wpi/Lpi)(Vcntp-Vthp)**2 \qquad (18)$$

The changes ΔIni and Δ|Ipi| of Ini and |Ipi| are found as follows:

$$\Delta Ini=Ini\times 2\Delta Vcntn/(Vcntn-Vthn) \qquad (19)$$

$$\Delta|Ipi|=|Ipi|\times 2\Delta|Vcntp|/|Vcntp-Vthp| \qquad (20)$$

Considering Ini=|Ipi|=$I_D$, when entering formulas (16), (19), and (20) in conditional formulas (10) and (11) for reducing the effects of power source noise for every delay stage, the formulas below are obtained:

$$\Delta Vcntn \approx \{\lambda n/(\lambda n+|\lambda p|)\}\{(Vcntn-Vthn)/Vdd\}\Delta Vdd \qquad (21)$$

$$\Delta|Vcntp| \approx \{|\lambda p|/(\lambda n+|\lambda p|)\}\{|Vcntp-Vthp|/Vdd\}\Delta Vdd \qquad (22)$$

Namely, when there is a change of the power source voltage, the change of the delay time can be made very small by feeding this back to the voltage between gate sources of the nMOS current source transistors by a rate of $\{\lambda n/(\lambda n+|\lambda p|)\}\{(Vcntn-Vthn)/V_{dd}\}$ and feeding this back to the voltage between gate sources of the pMOS current source transistors by a rate of $\{|\lambda p|/(\lambda n+|\lambda p|)\}\{(Vcntp-V\,thp)/Vdd\}$.

Also, when entering the formulas (19) and (20) into the conditional formula (12) for reducing the effects of power source noise for every two consecutive delay stages, the following formula is obtained:

$$\{\Delta Vcntn/(Vcntn-Vthn)\}+(\Delta|Vcntp|/|Vcntp-Vthp|)\approx\Delta Vdd/Vdd \qquad (23)$$

Here, when $$\Delta Vcntn\approx An\times\{(Vcntn-Vthn)/Vdd\}\Delta Vdd \qquad (24)$$

$$\Delta|Vcntp|\approx Ap\times\{|Vcntp-Vthp|/Vdd\}\Delta Vdd \qquad (25)$$

the following formula can be obtained:

$$An+Ap\approx 1 \qquad (26)$$

Since the channel length modulation effect coefficient largely depends on the imply profile, λn≠|λp| in many cases, but when assuming that λn≈|λp| and entering it into the formulas (21) and (22), the following formulas are obtained:

$$\Delta Vcntn\approx(\tfrac{1}{2})\{(Vcntn-Vthn)/Vdd\}\Delta Vdd \qquad (27)$$

$$\Delta|Vcntp|\approx(\tfrac{1}{2})\{|Vcntp-Vthp|/Vdd\}\Delta Vdd \qquad (28)$$

At least the relations in the formulas (24), (25), and (26) are satisfied.

In the delay circuit shown in FIG. 3, as an AC means of adding a change of the power source voltage to a bias voltage or a control voltage by a suitable ratio, a gate input line of the nMOS current source transistor line is provided with a capacitor Csn between itself and a ground and is provided with a capacitor Cdn between itself and a power source line. Also, a gate input line of the pMOS current source transistor is provided with a capacitor Cdn between itself and the power source line and provided with a capacitor Csp between itself and the ground line.

According to the AC adding means, even if a control voltage line of a connection destination is an output terminal of a charge pump circuit held in a high impedance state or an output terminal of a passive loop filter when an output is off, since the AC adding means does not carry a DC current, there is a characteristic that no extra change of the control voltage which gives an effect on a control voltage while power source noise is generated and becomes a secondary effect after generation of power source noise is ended is caused.

Figure 6A:
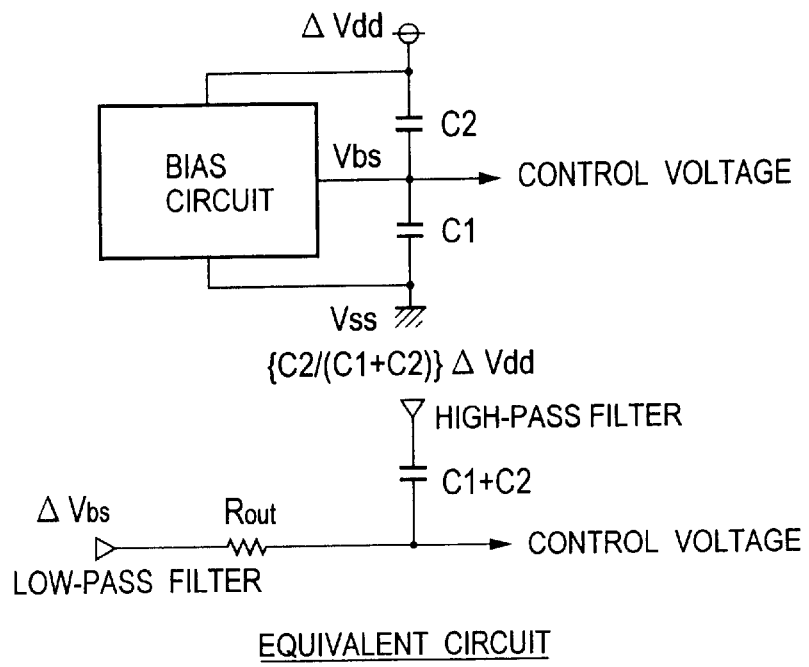
FIGS. 6A and 6B are views of the configuration and an equivalent circuit of a bias circuit and an alternating current adding means.
Figure 6B:
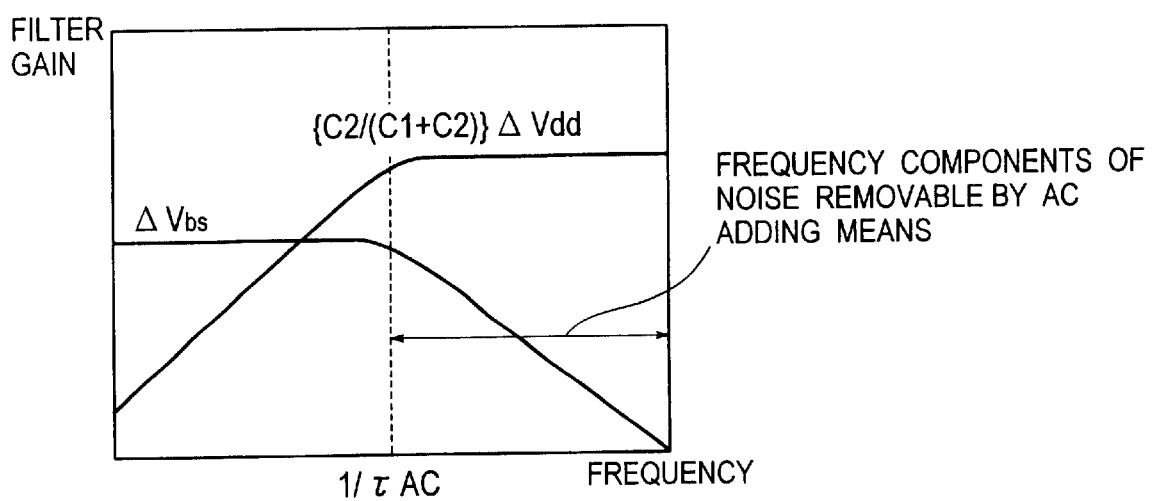
Figure 7:
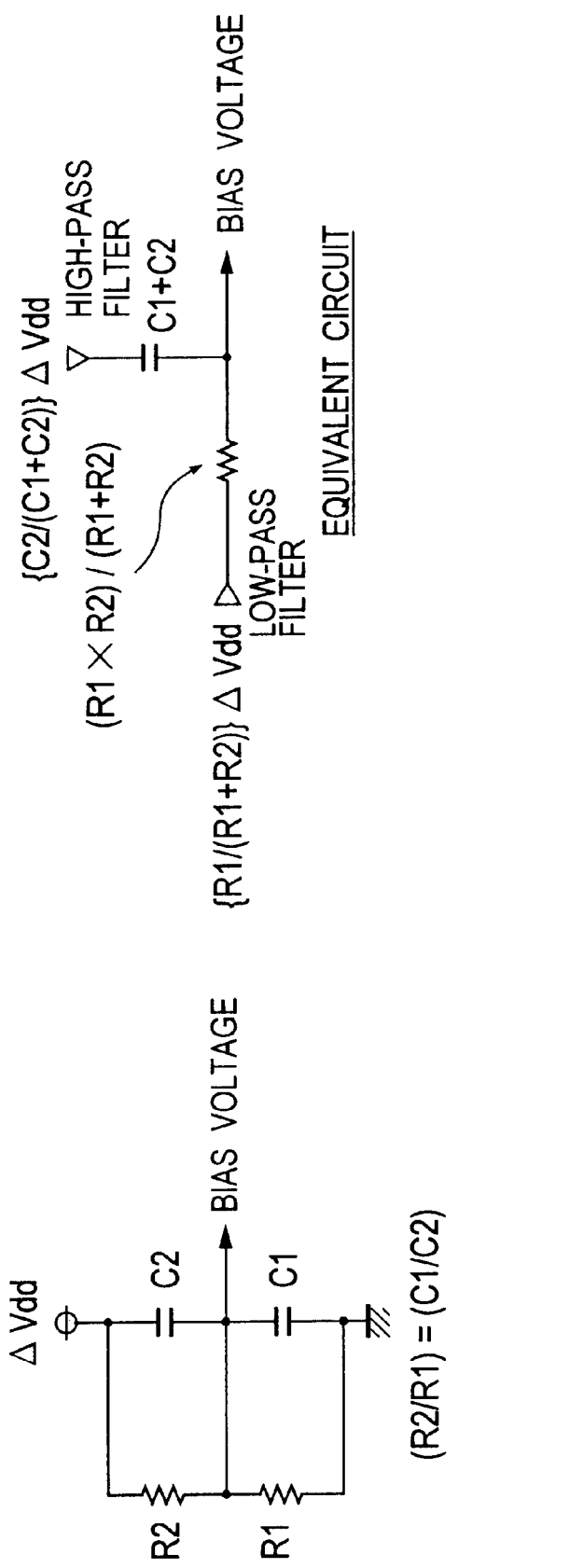
FIG. 7 is a circuit diagram of a direct current adding means and an alternating current adding means for transferring an effect of power source noise at a same ratio.

FIGS. 6A and 6B and FIG. 7 show the relationship of a bias circuit and AC adding means. AC addition is performed by voltage division of a capacitor C1 provided between the control voltage line and the ground line and a capacitor C2 provided between the control voltage line and the power source line. When the power source voltage $V_{dd}$ is changed by $\Delta V_{dd}$, this is modeled as an equivalent circuit as shown in FIG. 6A.

ΔVbs indicates a change of a bias circuit output voltage Vbs, while Rout indicates an output resistance of the bias circuit. This equivalent circuit is a low-pass filter when looking from the ΔVbs side, that is, from the output side of the bias circuit, and a high-pass filter when looking from the {C2/(C1+C2)}ΔVdd side, that is, from a supply side of the power source voltage Vdd. Thus, when assuming τAC= Rout×(C1+C2), the effect of {C2/(C1+C2)}ΔVdd becomes dominant at the high frequency side of the boundary of the frequency of 1/τAC, while the effect of the ΔVbs side becomes dominant at the low frequency side.

Here, when the width of the power source noise at the time of output buffer operation is tns, if designing the circuit to satisfy the following relation:

$$\tau AC=Rout\times(C1+C2)>tns \qquad (29)$$

the effect of the power source noise at the time of an output buffer operation can be reduced.

When an up signal $S_{up}$ and a down signal $S_{DW}$ are not output from a phase comparison circuit, if an output of an output terminal of a charge pump held in a high impedance state or a passive loop filter connected thereto is input as a control voltage, it is regarded that Rout=∞, so a value of C1+C2 may be determined as a capacitor of the loop filter and a ratio of C1 and C2 may be determined in accordance with the present invention.

FIG. 7 is a view of an adding means capable of reducing an effect of power source noise even when frequency components of the power source noise become lower to a certain extent by feedback in a DC adding means in the same way as feedback in the AC adding means. The AC adding means is also considered to operate as a speed-up capacitor of a DC adding means, so the amount of feedback can be added regardless of a time constant and it is possible to handle power source noise of wide frequency components.

Figure 8:
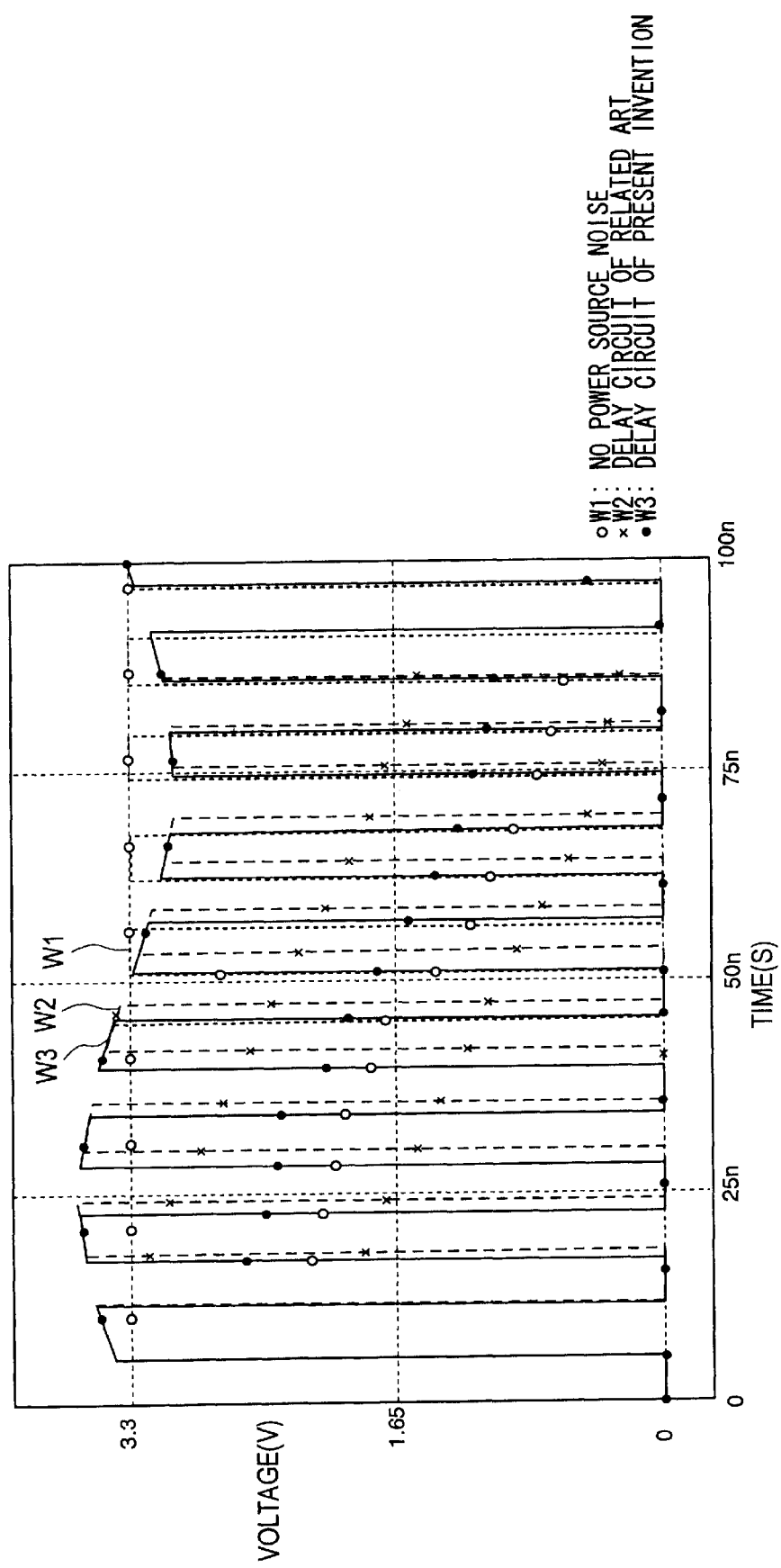
FIG. 8 is a view of results of simulation of a first circuit example of the first embodiment of the present invention.

FIG. 8 is a waveform diagram of results of simulation of a voltage-controlled oscillation circuit using a delay circuit of the present example. In FIG. 8, W1 indicates a simulation waveform of when there is no power source noise, W2 indicates a simulation waveform of the related art of when there is power source noise, and W3 indicates a simulation waveform of a circuit example of the present invention shown in FIG. 3 of when there is power source noise. As shown in the figure, in the delay circuit of the present invention, by controlling the control voltage to be supplied to the delay elements constituting the delay circuit in accordance with the amount of change of the power source voltage $V_{dd}$ when power source noise arises, effects due to the change of the power source voltage $V_{dd}$ can be canceled out and a change of a delay time of the delay circuit can be suppressed. It is clear that jitter is largely reduced in a voltage-controlled delay circuit and voltage-controlled oscillation circuit configured by using the delay circuit.

Second Circuit Example

Figure 9:
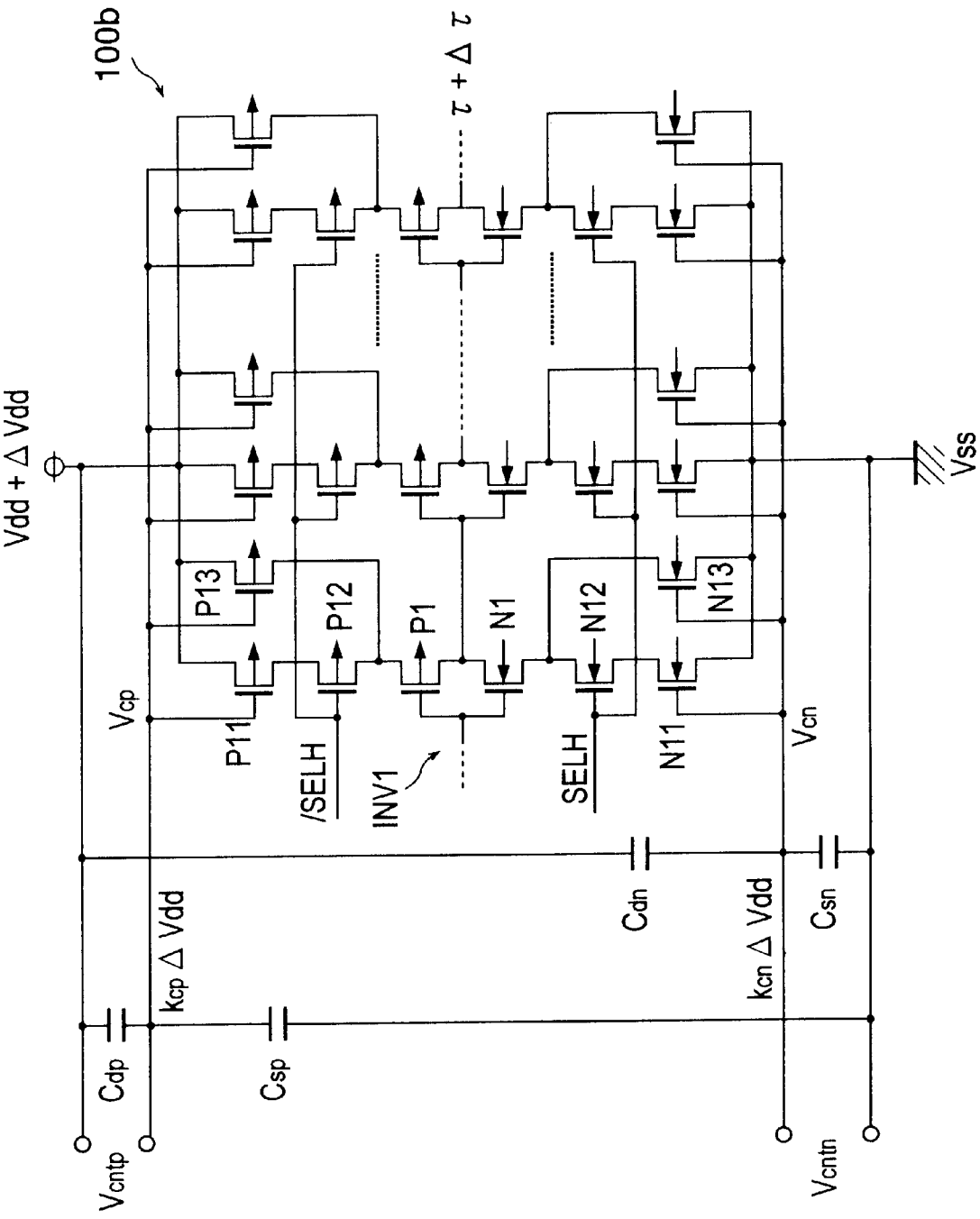
FIG. 9 is a circuit diagram of a second circuit example of the first embodiment of the present invention.

FIG. 9 is a circuit diagram of a second circuit example of a delay circuit of the present embodiment. As shown in the figure, a delay unit 100b in the delay circuit comprises a plurality of delay elements each comprised of a MOS inverter, a selection transistor, and current source transistors.

The MOS inverter is comprised of a pMOS transistor and nMOS transistor having gates and drains connected to each other. A connection point of the gates forms an input terminal of the inverter and a connection point of the drains forms an output terminal of the inverter. As shown in FIG. 9, between a source of the pMOS transistor P1 constituting part of the inverter INV1 and a power source voltage $V_{dd}$ is connected a current source transistor P11 and a selection transistor P12 in series, while between a source of the transistor P1 and the power source voltage $V_{dd}$ is connected a current source transistor P13. Between a source of the nMOS transistor constituting part of the inverter INV1 and a reference potential $V_{ss}$ is connected a selection transistor N12 and a current source transistor N11 in series. Also, between the source of the transistor N1 and the power source voltage $V_{dd}$ is connected a current source transistor N13.

In the delay unit 100b, a control voltage $V_{cp}$ is applied to a gate of a current source transistor on the P-channel side of each of the delay elements, while a control voltage $V_{cn}$ is applied to a gate of a current source transistor on the N-channel side. Also, a selection signal /SELH is applied to the selection transistor on the P-channel side, while a selection signal SELH is applied to the gate of the selection transistor on the N-channel side. Note that /SELH means a logically inverted signal of the signal SELH. Note that delay elements constituting other delay stages have substantially the same configuration.

In the delay unit 100b configured in this way, since the current to be supplied to the delay elements of the delay stages is controlled in accordance with a selection signal, the drive current supplied to the inverters can be controlled in two ways. For example, when the selection signal SELH is at a low level, only the current source transistor is connected to the inverter in each delay element of the delay stage. On the contrary, when the selection signal SELH is at a high level, both current source transistors are connected to the inverter in the delay elements of the delay stages.

Here, for example, in the delay stages, m number of current source transistors are connected in parallel in an inverter. When assuming that sizes of the current source transistors (channel width/channel length) are respectively W1/L1, W2/L2, . . . , Wm/Lm, a drive current $I_D$ supplied to the inverter is given by the following formula:

$$I_D = (1/2)\mu Cox(W1/L1)(1 + \lambda 1\ Vds)(Vcnt - Vth)**2 + \quad (30)$$
$$(1/2)\mu Cox(W2/L2)(1 + \lambda 2\ Vds)(Vcnt - Vth)**2 +$$
$$\vdots$$
$$(1/2)\mu Cox(Wm/Lm)(1 + \lambda_m Vds)(Vcnt - Vth)**2$$

Also, since channel length modulation coefficients $\lambda 1, \lambda 2, \ldots, \lambda m$ are small, when the channel length modulation coefficients of the current source transistors are made equally $\lambda$., the approximate following formula can be obtained based on formula (30):

$$I_D \approx (\frac{1}{2})\mu Cox\{\Sigma(Wi/Li)\}(1+\lambda Vds)(Vcnt-Vth)**2 \quad (31)$$

Comparing formula (13), formula (14), and formula (31), even if the current source transistors are connected in parallel in the delay elements, it is clear that the method of reducing the effect of power source noise of the present invention is effective.

Third Circuit Example

Figure 10:
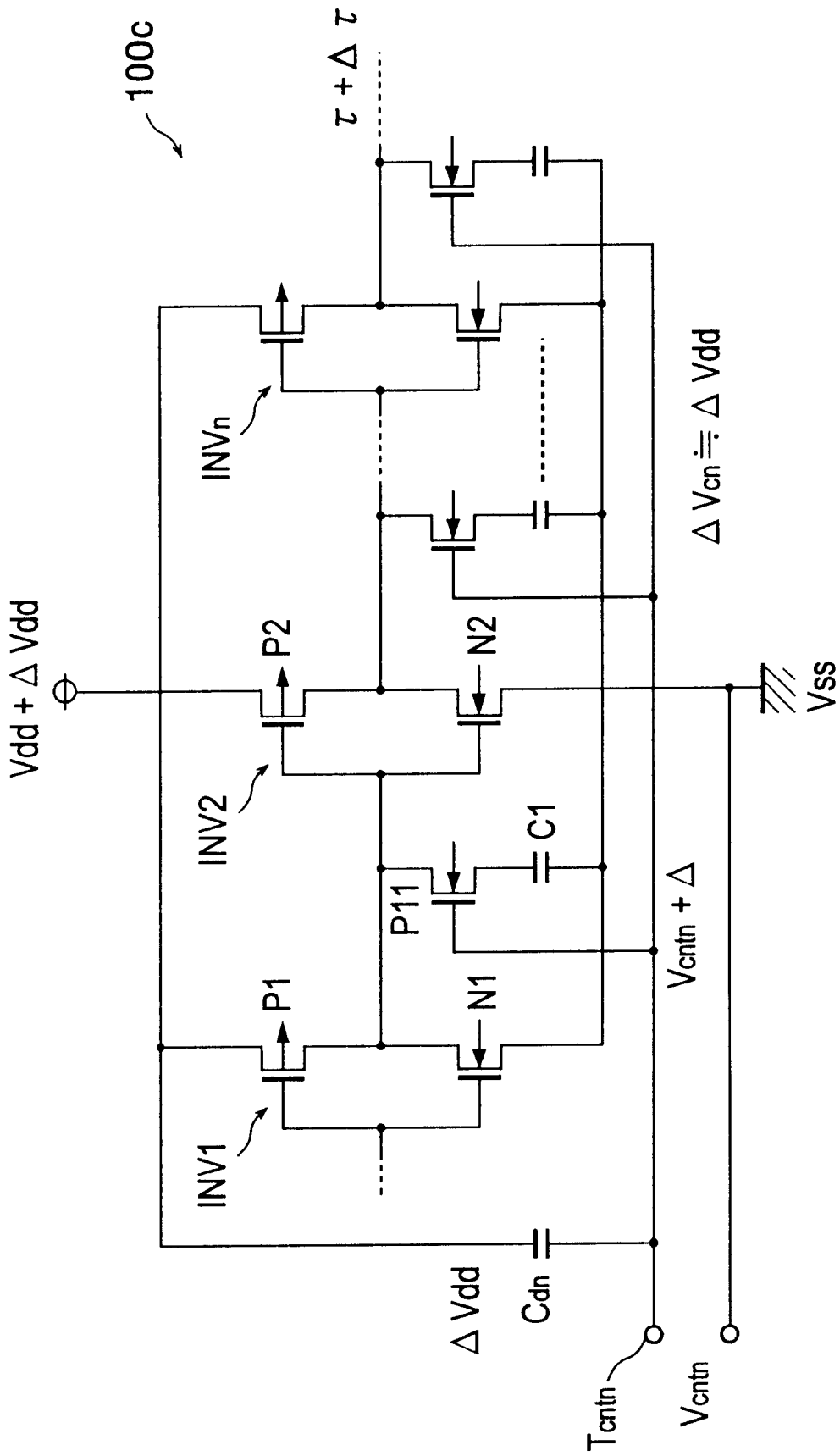
FIG. 10 is a circuit diagram of a third circuit example of the first embodiment of the present invention.

FIG. 10 is a circuit diagram of a third circuit example of a delay circuit of the present embodiment. As shown in the figure, in the delay circuit, the delay unit 100c is configured of a plurality of delay stages each comprised of a MOS inverter and a transmission gate and capacitor connected to the output terminal of the inverter. That is, the delay unit 100c of this example is comprised of so-called shunt type delay elements.

Between the power source voltage $V_{dd}$ and the control signal input terminal Tcntn is connected a capacitor Cdn. Due to the capacitor Cdn, the change $\Delta Vdd$ of the power source voltage $V_{dd}$ is fed back to the control voltage Vcntn. That is, in the delay circuit of this example, the control voltage Vcntn supplied to the delay stages in accordance with the change of the power source voltage $V_{dd}$ is controlled so that the change in the delay time due to the change in the power source voltage is canceled out, so the effect of power source noise can be suppressed.

Note that the transmission gate is for example comprised of an MOS transistor having a gate to which a control voltage is supplied. In the example of FIG. 10, the transmission gate connected to the output terminal of each delay stage is comprised of an nMOS transistor to the gate of which the control voltage Vcntn is applied. One of the source and drain of the transistor constituting the transmission gate is connected to the output terminal of the inverter, while the other is connected through the capacitor to the reference voltage $V_{ss}$.

Figure 11:
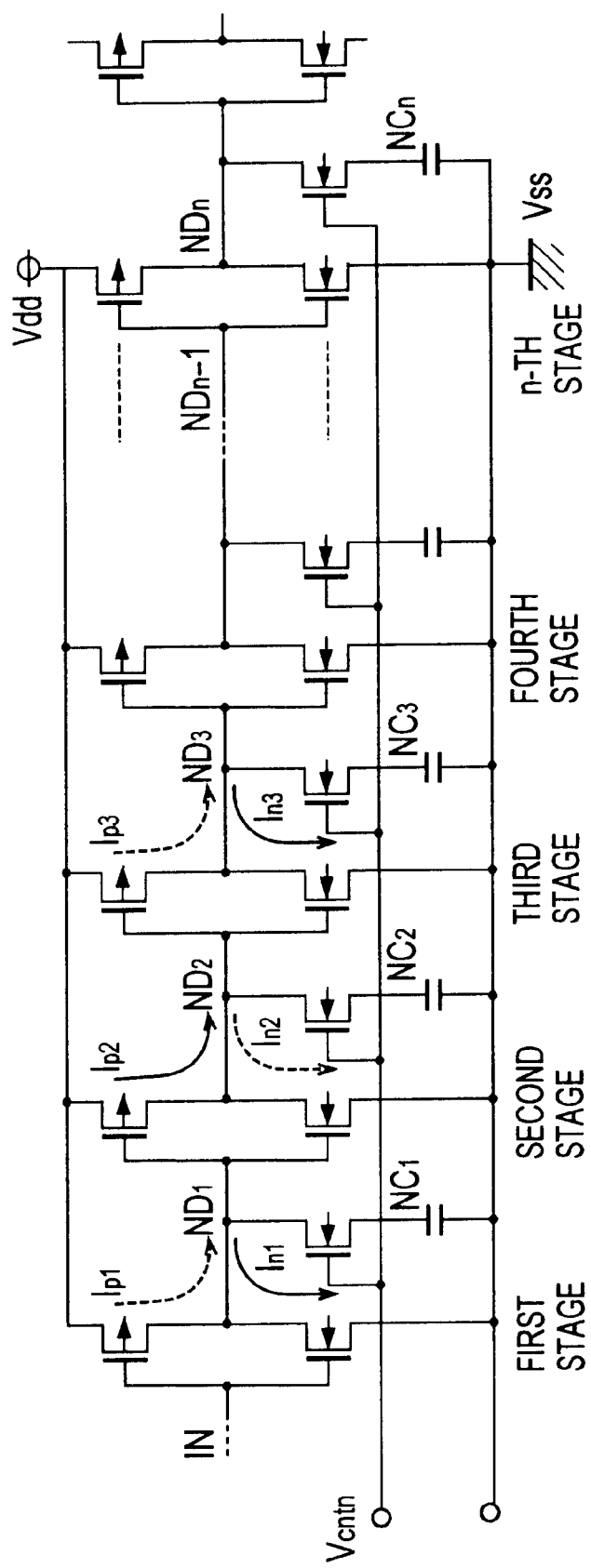
FIG. 11 is a circuit diagram of a delay unit configured by shunt type delay stages.
Figure 12A:
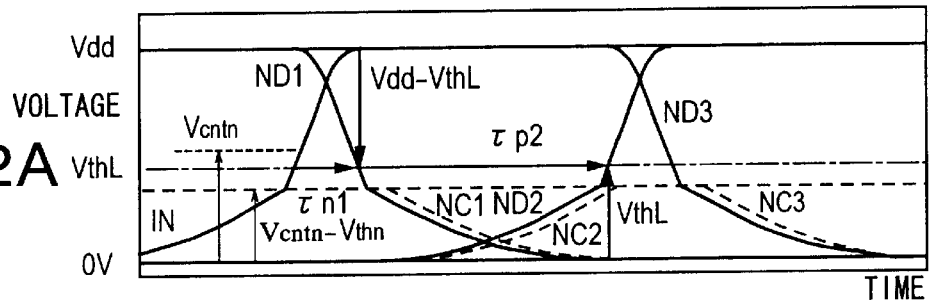
FIGS. 12A to 12D are waveform diagrams of an operation of a delay unit configured by shant type delay stages.
Figure 12B:
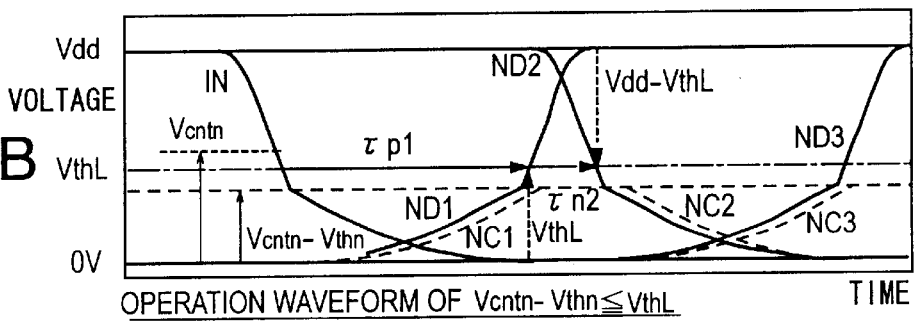
Figure 12C:
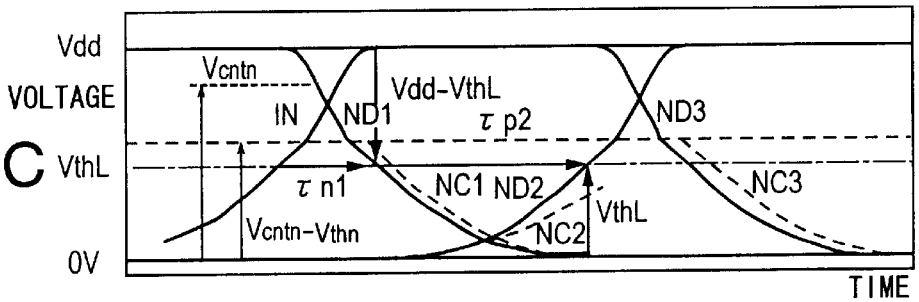
Figure 12D:
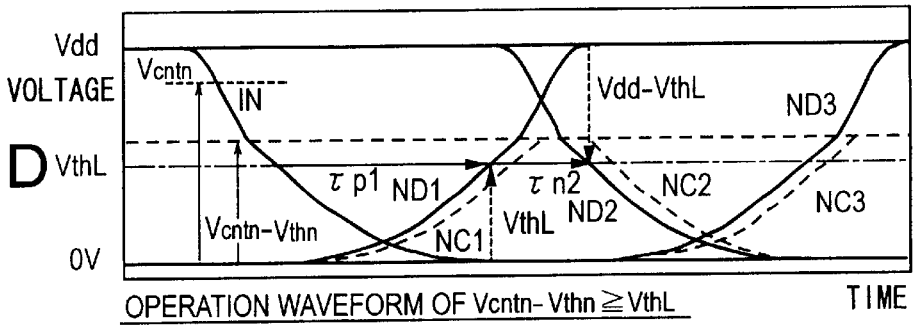

FIG. 11 is a circuit diagram of the configuration of a delay stage comprised of shunt type delay elements.

As shown in the figure, in each delay stage, between an output terminal of an inverter and a reference potential $V_{ss}$ are connected in series an nMOS transistor as a branch transmission gate and a capacitor. A control voltage Vcntn is applied to a gate of the transistor. In accordance with the control voltage Vcntn, the transmission gate turns on and off and a load capacity of the output terminal of the inverter changes, so the delay time is controlled.

FIGS. 12A to 12D are waveform diagrams of the operation of a shunt type delay stage at the time of rising and falling of an input signal IN. The operation waveform is shown in two ways in accordance with the level of the control voltage Vcntn of the branch transmission gate, namely, the transistor connected in series to the capacitor.

Below, an operation of the delay circuit of the present example will be explained with reference to FIG. 11 and FIGS. 12A to 12D.

First, the operation of the shunt type delay stage will be briefly explained. The branch transmission gate is turned on until the source voltage changes from the reference potential $V_{ss}$ to the gate voltage, that is, a level Vcntn−Vthn of a control voltage Vcntn input from the outside minus an amount of a threshold voltage Vthn of the transistor, but ends up being turned off when the source voltage becomes a higher voltage than that. Accordingly, the load capacitance which inverter has to drive changes at the boundary Vcntn−Vthn. If the capacitance on the branch side is Cs and the capacitance of a gate input of the next stage is Cg, when the output voltage of the inverter is more than Vcntn−Vthn, a load capacitance of Cg+Cs is driven, while when the output voltage of the inverter is less than Vcntn−Vthn, a load capacitance of Cg is driven. The ratio of the period of driving a heavy load capacitance of Cg+Cs and the period of driving a light load capacitance of Cg changes in accordance with a level of the control voltage Vcntn. When the control voltage Vcntn becomes high, the ratio of the period of driving the heavy load capacitance of Cg+Cs increases, so the delay time becomes long.

Note that to facilitate the explanation, the level when a threshold voltage of the transistor of the control voltage is reduced by one stage is expressed by the following formula:

$$Vsmax\ nt = Vcntn - Vthn(V_{SB}) \quad (32)$$

Here, when assuming that K is a substrate effect constant, $\Phi = 0.64V$, and a threshold of the transistor Vthn0 is $V_{SB} = 0V$, the following formula is obtained:

$$Vthn(V_{SB}) = Vthn0 + K\{\sqrt{(V_{SB}+\phi)} - \sqrt{\phi}\} \quad (33)$$

Note that $V_{SB} = Vsmax$.

When Vsmax=Vcntn−Vthn≤VthL, the following formulas stand:

$$\tau ni^{\alpha} Cg \times (Vdd - VthL)/Ini \quad (34)$$

$$\tau pi^{\alpha} (Cg \times VthL + Cs \times Vsmax)/|Ipi| \quad (35)$$

Furthermore, the following formulas are obtained by formula (34) and formula (35):

$$\tau ni \approx \tau nix[\{(\Delta Vdd - \Delta VthL)/(Vdd - VthL)\} - (\Delta Ini/Ini)] \quad (36)$$

$$\tau pi \approx \tau pix[\{(Cg \times \Delta VthL + Cs \times \Delta Vsmax)/(Cg \times VthL + Cs \times Vsmax)\} - \Delta|pi|/|Ipi|)] \quad (37)$$

Also, when Vsmax=Vcntn−Vthn≧VthL, the following formulas stand:

$$\tau ni\ \{Cg \times (Vdd - VthL) + Cs \times (Vsmax - VthL)\}/Ini \quad (38)$$

$$\tau pi\ (Cg+Cs) \times VthL/|Ipi| \quad (39)$$

Furthermore, the following formulas are obtained by formula (38) and formula (39):

$$\tau_{ni} \approx \tau_{ni} \times ([\{Cg \times (\Delta Vdd - \Delta VthL) + Cs \times (\Delta Vsmax - \Delta VthL)\}/ \{Cg \times (Vdd - VthL) + Cs \times (Vsmax - VthL)\}] - (\Delta Ini/Ini)) \quad (40)$$

$$\tau pi \approx \tau pi \times \{(\Delta VthL/VthL) - (\Delta|Ipi|/|Ipi|)\} \quad (41)$$

Here, a logical threshold voltage VthL of the inverter is given as follows:

$$VthL = [Vdd - |Vthp| + Vthn + \sqrt{\{(\mu nWni/Lni)/(\mu pWpi/Lpi)\}}]/[1 + \sqrt{\{(\mu nWni/Lni)/(\mu pWpi/Lpi)\}}] \quad (42)$$

The following formula is obtained from formula (42):

$$VthL = \Delta Vdd/[1 + \sqrt{\{(\mu nWni/Lni)/(\mu pWpi/Lpi)\}}] \quad (43)$$

When assuming that the maximum voltage of the control voltage Vcntn is the power source voltage Vdd, since Vsmax=Vcntn−Vthn, the maximum voltage of Vsmax becomes about 0.7×Vdd.

Therefore, when designing a shunt-type delay circuit, the threshold voltage VthL of the inverter is designed a little lower than Vdd/2. Here, it is assumed that the following formula stands:

$$\{(\mu nWni/Lni)/(\mu pWpi/Lpi)\} = 2 \quad (44)$$

Also, considering Vthn≈Vdd/6 or so, formula (42) and formula (43) can be approximated by the following formulas:

$$VthL \approx 0.44 \times Vdd \quad (45)$$

$$\Delta VthL \approx 0.41 \times \Delta Vdd \quad (46)$$

When the output voltage of the inverter changes to close to VthL, Ini and Ipi become nonsaturated, but they generally operate in a saturated region in a period defined by the delay time, thus the following formulas stand:

$$Ini^{\alpha}(\tfrac{1}{2})\mu n\ Cox(Wni/Lni)\}(Vdd-Vthn)^{**}2 \quad (47)$$

$$|Ipi|^{\alpha}(\tfrac{1}{2})|\mu p|Cox(Wpi/Lpi)(Vdd-|Vthp|)^{**}2 \quad (48)$$

From formula (47) and formula (48), $$\Delta Ini \approx Inix\{2\Delta Vdd/(Vdd-Vthn)\} \quad (49)$$

$$\Delta|Ipi| \approx |Ipi| \times \{2\Delta Vdd/(Vdd-|Vthp|)\} \quad (50)$$

Also, the following formula is obtained from the assumption of formula (44):

$$\Delta Ini \approx 2 \times I_D$$

$$|Ipi| \approx I_D \quad (51)$$

Also, the following formula is obtained from formula (32) and formula (33):

$$\Delta Vsmax = \Delta Vcntn/[1 + K\{2\sqrt{(Vsmax+\phi)}\}] \quad (52)$$

When considering that the substrate effect constant K is a value around 0.5 and Vsmax is a value around 0.44×Vdd, formula (52) is approximated as follows:

$$Vsmax \approx 0.85 \times \Delta Vcntn \quad (53)$$

Since a load capacitance value changes in the middle in the case of a shunt-type delay stage, it is difficult to consider generally. Therefore, the case of Vsmax=0.34×Vdd and the case of Vsmax=0.5×Vdd will be considered. Also, it is assumed that Vthn≈|Vthp|≈Vdd/6.

When Vsmax=0.34×Vdd≤VthL=0.44×Vdd, the following formulas are obtained by entering formulas (45), (46), (49), (50), (51), and (53) into formulas (34) to (37):

$$\tau ni^\alpha 0.28 \times Cg \times Vdd/I_D \qquad (54)$$

$$\tau pi^\alpha 3.84 \times Cg \times Vdd/I_D \qquad (55)$$

$$\Delta\tau ni \approx \tau ni \times \{(-1.35 \times \Delta Vdd/Vdd) \qquad (56)$$

$$\Delta\tau pi \approx \tau pi \times [\{(-2.29 \times \Delta Vdd)+(2.21 \times \Delta Vcntn)\}/Vdd] \qquad (57)$$

The following formula is obtained from formulas (54) to (57):

$$\Delta\tau ni+\Delta\tau p(i\pm 1) \{(-9.17 \times \Delta Vdd)+(8.49 \times \Delta Vcntn)\} \times Cg/I_D \qquad (58)$$

Here, it is sufficient to satisfy the following formula to attain Δτni+Δτp(i±1)≈0.

$$\Delta Vcntn \approx 1.08 \times Vdd \qquad (59)$$

When assuming that ΔVcntn≈ΔVdd and changing the control voltage Vcntn in accordance with changes in the power source voltage Vdd, the effect of the power source noise can be expected to be reduced to (9.17−8.49)/9.17≈7%.

When Vsmax=0.54×Vdd≥VthL=0.44×Vdd, the following formulas are obtained by entering formulas (45), (46), (49), (50), (51), and (53) into formulas (38) to (41):

$$\tau ni^\alpha 0.78 \times Cg \times Vdd/I_D \qquad (60)$$

$$\tau pi^\alpha 4.84 \times Cg \times Vdd/I_D \qquad (61)$$

$$\Delta\tau ni \approx \tau ni \times [\{(-4.65 \times \Delta Vdd)+(5.45 \times \Delta Vcntn)\}/Vdd] \qquad (62)$$

$$\Delta\tau pi \approx \tau pi \times \{(-1.47 \times \Delta Vdd)/Vdd\} \qquad (63)$$

Furthermore, the following formula is obtained from formulas (60) to (63):

$$\Delta\tau ni+\Delta\tau p(i\pm 1) \{(-10.74 \times \Delta Vdd)+(4.25 \times \Delta Vcntn)\} \times Cg/I_D \qquad (64)$$

It is sufficient to satisfy the following formula to attain Δτni+Δτp(i±1)≈0.

$$\Delta Vcntn \approx 2.53 \times Vdd \qquad (65)$$

When assuming ΔVcntn≈ΔVdd and changing the control voltage Vcntn in accordance with the power source voltage Vdd, the effect of the power source noise is expected to be reduced to (10.74−4.25)/10.74≈60%.

To sum up the above, the effect of power source noise can be roughly halved by providing a capacitor between a control voltage line and a power source line when the branch transmission gate is an NMOS transistor in a shant-type delay stage and by providing a capacitor between the control voltage line and a ground line when the branch transmission gate is a PMOS transistor.

Second Embodiment

Figure 13:
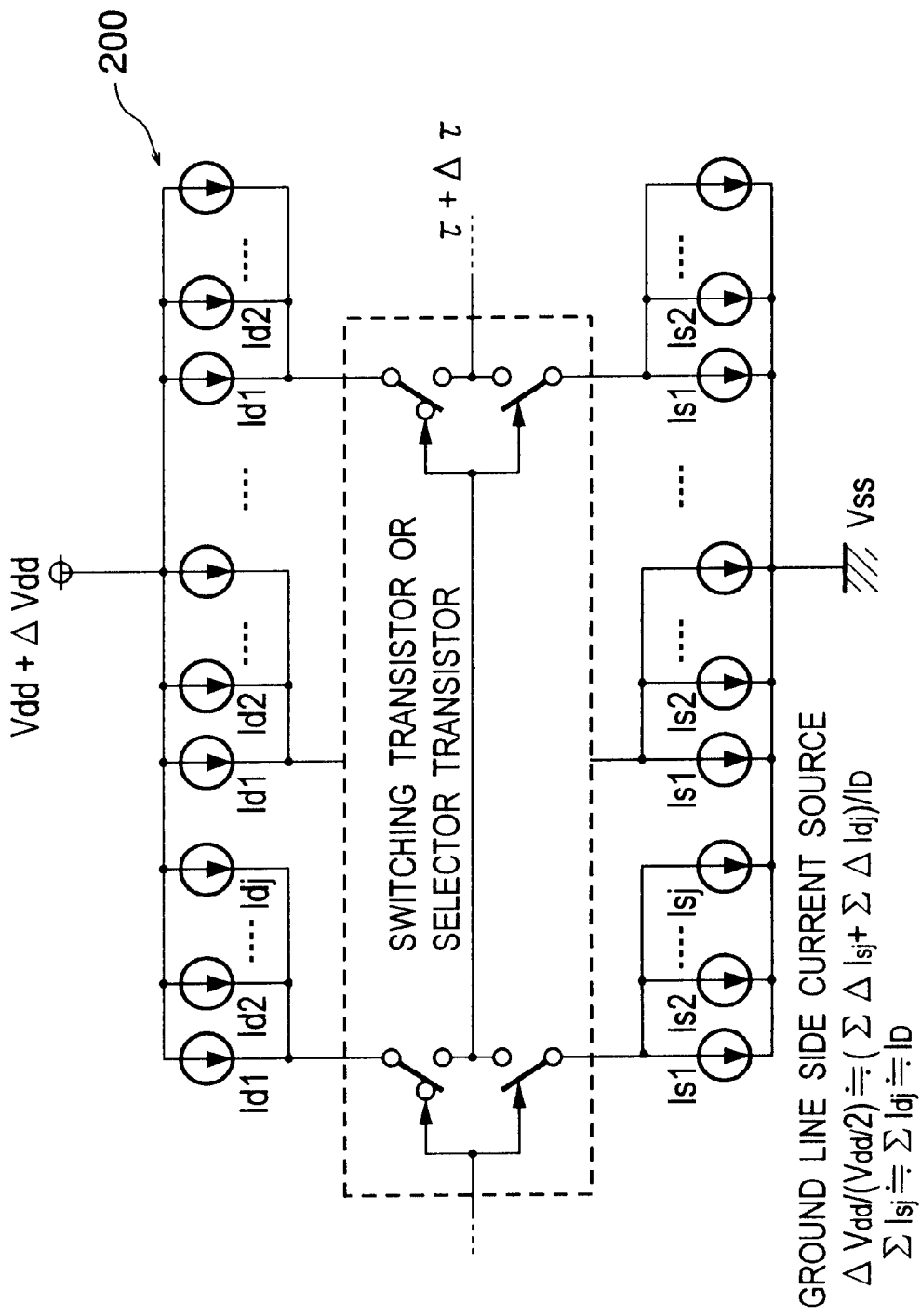
FIG. 13 is a view showing a concept of a second embodiment of the present invention.

FIG. 13 is a schematic view of a second embodiment of a delay circuit according to the present invention.

In the delay circuit of the present embodiment, by generating a drive current by adding a supply current of a current source having a different power source voltage dependency, the change of a delay time due to power source noise is suppressed and the effect of power source noise is reduced.

As shown in the figure, the delay circuit of the present embodiment is comprised of a plurality of delay stages connected in series. Eac delay stages is comprised for example of a delay element including a switching transistor or a selector transistor and a current source for supplying a drive current to the delay element. For example, as shown in the figure, at least two current sources for supplying drive currents $I_{d1}$, $I_{d2}$, ..., $I_{dj}$ are connected in parallel between the delay element and the power source voltage $V_{dd}$, and at least two current sources for supplying drive currents $I_{s1}$, $I_{s2}$, ..., $I_{sj}$ are connected in parallel between the delay element and a reference potential $V_{ss}$.

Furthermore, each of the current sources has a different current voltage dependency. Namely, if the current sources are changed in amounts of $\Delta I_{d1}$, $\Delta I_{d2}$, ..., $\Delta I_{dj}$ and $\Delta I_{s1}$, $\Delta I_{s2}$ and $\Delta I_{s1}$, $\Delta I_{s2}$, ..., $\Delta I_{sj}$ when the power source voltage $V_{dd}$ changes by an amount of $\Delta V_{dd}$, the dependency becomes $\Delta I_{d1}/I_{d1} \neq \Delta I_{s2}/\Delta I_{d2}$, ..., $\neq \Delta I_{dj}/I_{dj}$, also, $\Delta I_{s1}/I_{s1} \neq \Delta I_{s2}/\Delta I_{s2}$, ..., $\neq \Delta I_{sj}/I_{sjo}$.

The sum of the currents of the current sources simultaneously turned on at the power source line side becomes the drive current at the time of rising of the output, namely, Id=ΣIdj. The amount of change becomes Δid=ΣΔIdj.

On the other hand, the sum of the currents of the current sources simultaneously turned on at ground line side becomes the drive current at the time of falling of the output, namely, Is=ΣIsj. The amount of change becomes ΔIs=ΣΔisj.

Here, when τofi is a delay time at the time of falling of a delay stage output and τori is a delay time at the time of rising of the delay stage output, relations the same as the above formulas (6) and (7) can be obtained when the power source voltage $V_{dd}$ changes by ΔVdd:

$$\Delta\tau ofi=\tau ofi[\{(\Delta Vdd-\Delta VthL)/(Vdd-VthL)\}-(\Sigma\Delta Isj/\Sigma Isj)] \qquad (66)$$

$$\Delta\tau ori=\tau ori\{(\Delta VthL/VthL)-(\Sigma\Delta Idj/\Sigma Idj)\} \qquad (67)$$

To attain Δτofi≈0 and Δτori≈0, it is sufficient to design the relative amount of change (substantially equal to a relative amount $\Delta V_{dd}$ of the power source voltage) of an output amplitude and the relative amount of change (equal to a relative amount of change of the drive current) of the sum of the current values of a current sources to become the same. That is, the following formulas are obtained:

$$\{(\Delta Vdd-\Delta VthL)/(Vdd-VthL)\}=(\Sigma\Delta Isj/\Sigma Isj) \qquad (68)$$

$$(\Delta VthL/VthL)=(\Sigma\Delta Idj/\Sigma Idj) \qquad (69)$$

When ΣIsj≈ΣIdj≈$I_D$ and VthL≈$V_{dd}$/2, in the same way as in formula (12), $$\Delta Vdd/(Vdd/2) \approx (\tau\Delta Isj+\Sigma\Delta Idj)/I_D.$$

Figure 14:
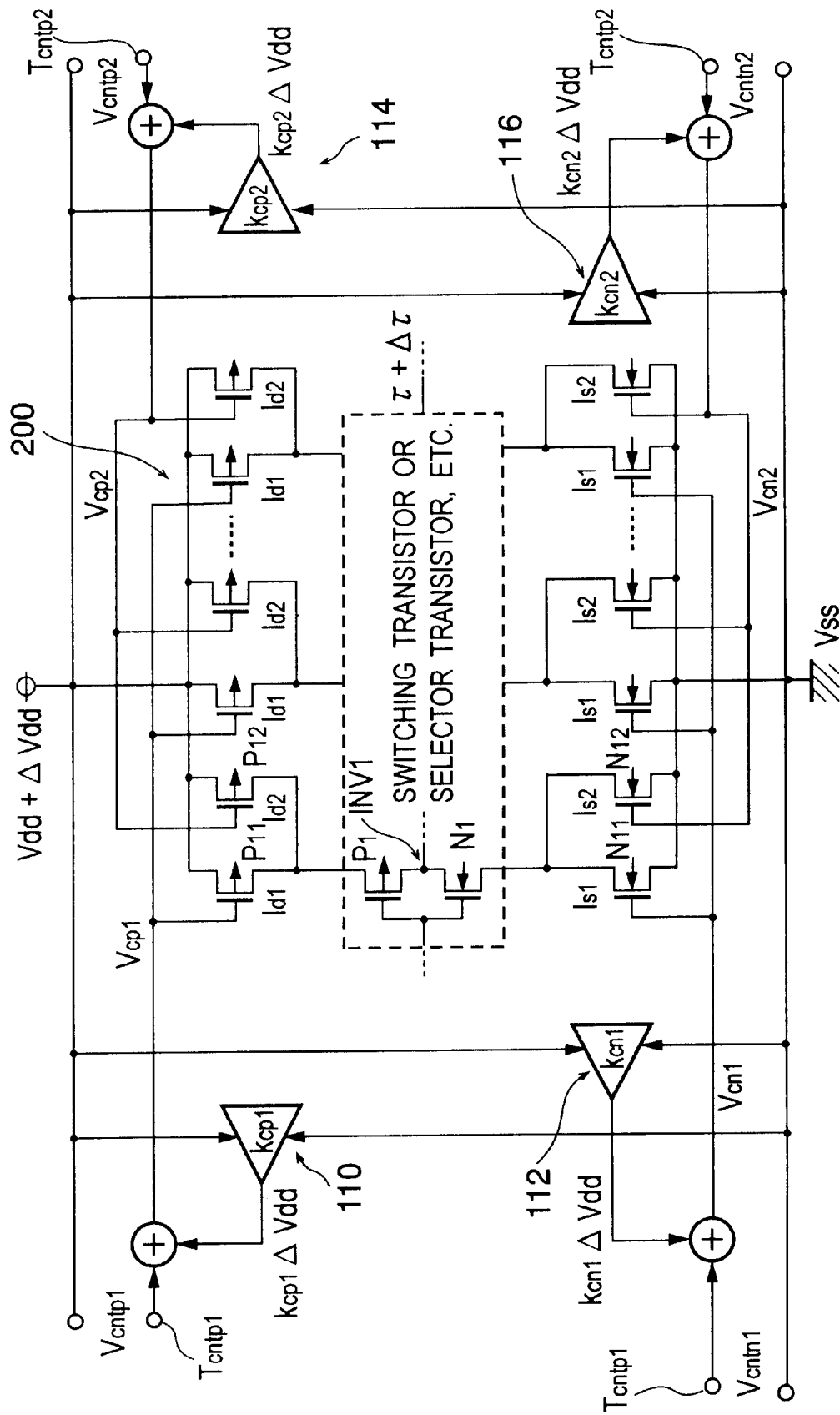
FIG. 14 is a view of the configuration of the second embodiment of the present invention.

FIG. 14 is a view of the configuration of an example of a delay circuit of the present embodiment.

As shown in the figure, the delay circuit of the present embodiment comprises a delay unit 200 and alternating current adding circuits (AC adding circuits) 110, 112, 114, and 116.

Bias voltages $V_{cntn}1$, $V_{cntp}1$, $V_{cntn}2$ and $V_{cntp}2$ are supplied from a not shown phase comparator, a charge pump circuit, a loop filter, a bias circuit, etc.

The delay unit 200 is comprised of for example a plurality of delay elements connected in series. Note that each of the delay elements constituting the delay unit 200 of the present embodiment includes for example a CMOS inverter and outputs a logically inverted signal of the input signal given a predetermined delay time. The total of the delay times of the delay elements is the delay time $T_D$ of the delay unit 200.

The AC adding circuits 110, 112, 114, and 116 output results of multiplying alternating components of the power source voltages $V_{dd}$ and reference potentials $V_{ss}$ with a predetermined constant as $\Delta V_{cn}1$, $\Delta V_{cp}1$, $\Delta V_{cn}2$, and $\Delta V_{cp}2$. The bias voltages (or control voltages) and outputs of the AC adding circuits are added and the results are supplied as control voltages to the delay unit 100.

In the delay unit 200, each of the delay stages is comprised of a MOS-type inverter and a current source transistor. For example, as shown in the figure, a first delay stage is comprised of an inverter INV1 comprised of a pMOS transistor P1 and an NMOS transistor N1, current source transistors P11 and P12 for supplying a current to the P-channel side of the inverter INV1, and current source transistors N11 and N12 for supplying a current to the N-channel side of the inverter INV1.

The control voltage $V_{cp1}$ is applied to a gate of the current source transistor P11 on the P-channel side, while the control voltage $V_{cp2}$ is applied to a gate of the transistor P12.

The control voltage $V_{cn1}$ is applied to a gate of the current source transistor N11 on the N-channel side, while the control voltage $V_{cn2}$ is applied to a gate of the transistor N12.

In the delay unit 200 having the above configuration, the delay times of the delay stages are controlled by currents supplied to the inverters of the delay stages. In the present invention, the effect of power source noise can be suppressed by having currents supplied to the delay stages controlled to have different power source voltage dependencies.

From the relationships in formulas (19) and (20), formulas (68) and (69) are respectively rewritten to forms corresponding to FIG. 14 as shown below:

$$\{(\Delta Vdd-\Delta VthL)/(Vdd-VthL)\}=(\Sigma[\{2\times Isj/(Vcntnj-Vthn)\}\Delta Vcnj]/\Sigma Isj) \quad (70)$$

$$(\Delta VthL/VthL)\}=(\Sigma[\{2\times Ipj/|Vcntpj-Vthp|\}\Delta|Vcpj|]/\Sigma Idj) \quad (71)$$

Furthermore, in FIG. 14, when $\Delta Vcnj=kcnj\Delta Vdd$ and $\Delta|Vcpj|-kcpj\Delta V_{dd}$, assuming that $VthL\approx Vdd/2$, $Vcntnj\approx|Vcntpj|Vdd/2$, and $Vthn\approx|Vthp|\approx Vdd/6$, the relationship of formulas (70) and (71) can be expressed by just kcnj and Isj and kcpj and Idj as shown below:

$$6\times\Sigma(kcnj\times Isj)\approx\Sigma Isj \quad (72)$$

$$6\times\Sigma(kcpj\times Idj)\approx\Sigma Idj \quad (73)$$

When satisfying formulas (72) and (73) and the above assumption, the effect of power source noise can be made very small.

For example, when kcn1=0 and kcn2=0.5, formula (72) becomes $$6\times\{0\times Is1+0.5\times Is2\}\approx\{Is1+Is2\}$$

and it is sufficient to design (Is1/is2)≈(5/1).

Also, when Kcn=0 and Kcn2=1.0, formula (72) becomes $$6\times\{0\times Is1+1.0\times Is2\}\approx\{Is1+Is2\}$$

and it is sufficient to design (Is1/Is2)≈(5/1).

Also, when Kcn=0.05 and Kcn2=0.5, formula (72) becomes $$6\times\{0.05\times Is1+0.5\times Is2\}\approx\{Is1+Is2\}$$

and it is sufficient to design (Is1/Is2)≈(2.86/1).

First Circuit Example

Figure 15:
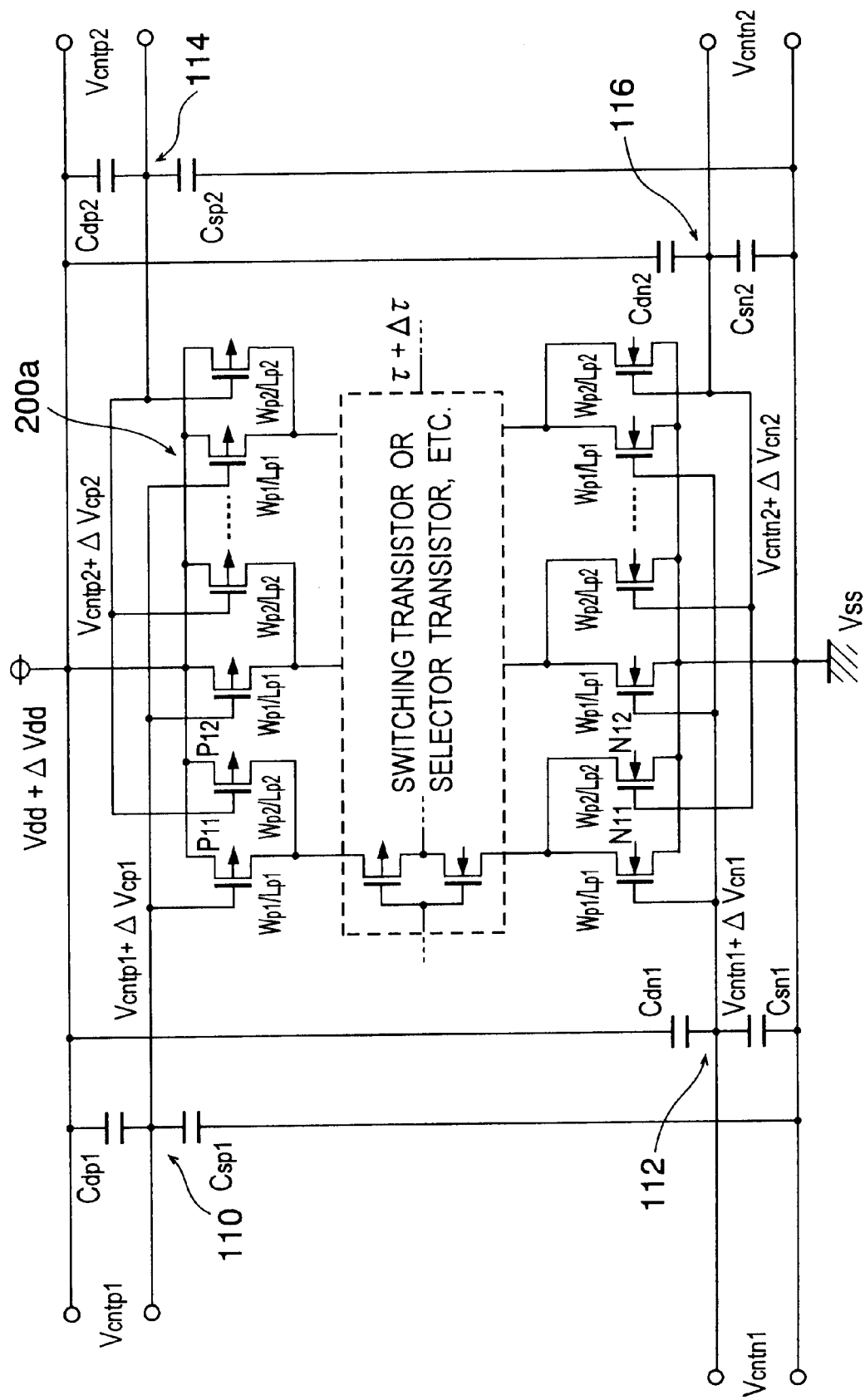
FIG. 15 is a circuit diagram of a first circuit example of the second embodiment of the present invention.

FIG. 15 is a circuit diagram of a first circuit example using the second embodiment of a delay circuit according to the present invention.

As shown in the figure, a delay circuit of the present example is comprised of a delay unit 200a and an AC adding means for supplying a control voltage or a bias voltage to the delay unit 200a. The delay unit 200a is comprised of an inverter type delay stage provided with MOS type current source transistors on the power source line side and the ground line side and is supplied with Vcntp1, Vcntp2, Vcntn1, and Vcntn2 as control voltages or bias voltages of the current sources.

For example, the current source on the power source line side on the first delay stage is comprised of a PMOS current source transistor P11 receiving as input Vcntp1 between its gate and source and having a transistor size of Wp1/Lp1 and Vcntp2 and a PMOS current source transistor P12 receiving as input Vcntp2 between its gate and source and having a transistor size of Wp2/Lp2 connected in parallel.

Also, the current source on the ground line of the first delay stage is comprised of the NMOS current source transistor N11 receiving as input Vcntp1 between its gate and source and having a transistor size of Wn1/Ln1 and the NMOS current source transistor N12 receiving as input Vcntn2 between its gate and source and having a transistor size of Wn2/Ln2 connected in parallel.

Supply lines of the control voltage or bias voltages Vcntp1, Vcntp2, Vcntn1, and Vcntn2 are provided with AC adding means for feeding back changes of the power source voltage at a suitable ratio.

For example, in the first delay stage, the AC adding means for adding a voltage of $\Delta Vcn1$ at Vgs of the above transistor N11 is comprised of an AC voltage division circuit consisting of a capacitor Csn1 provided between the gate input line of NMOS1 and the ground line and a capacitor Cdn1 provided between the gate input line of N11 and the power source line, while the AC means for adding a voltage of $\Delta Vcn2$ at Vgs of the transistor N12 is comprised of an AC voltage division circuit consisting of a capacitor Csn2 provided between the gate input line of N12 and the ground line and a capacitor Cdn2 provided between the gate input line of N12 and the power source line.

The AC means for adding a voltage of $\Delta Vcp1$ at Vgs of the transistor P11 is comprised of an AC voltage division circuit consisting of a capacitor Cdp1 provided between the gate input line of P11 and the ground line and a capacitor Csp1 provided between the gate input line of P11 and the power source line, while the AC means for adding a voltage of $\Delta Vcp2$ at Vgs of the transistor P12 is comprised of an AC voltage division circuit consisting of a capacitor Cdp2 provided between the gate input line of P12 and the ground line and a capacitor Csp2 provided between the gate input line of P12 and the power source line.

Namely, the amounts of changes of control voltages obtained by the voltage division circuits are found by the following formulas:

$$\Delta Vcnj=\{Cdnj/(Csnj+Cdnj)\}\Delta Vdd=kcnj\times Vdd \text{ Provisos } kcnj=\{Cdnj/(Csnj+Cdnj)\} \quad (74)$$

$$|\Delta Vcpj|=\{Cspj/(Cdpj+Cspj)\}\Delta Vdd=kcpj\times Vdd \text{ Provisos } kcpj=\{Cspj/(Cdpj+Cspj)\} \quad (75)$$

From the relationship of formulas (19) and (20), formulas (70) and (71) are respectively rewritten to a form corresponding to FIG. 15 as follows:

$$\{(\Delta Vdd-\Delta VthL)/(Vdd-VthL)\}=2\Sigma\{(Wnj/Lnj)(Vcntnj-Vthn)\Delta Vcnj\}/\Sigma\{(Wnj/Lnj)(Vcntnj-Vthn)**2\} \quad (76)$$

$$(\Delta VthL/VthL)=2\Sigma\{(Wpj/Lpj)(|Vcntpj-Vthp|)\Delta|Vcpj|\}/\Sigma\{(Wpj/Lpj)(Vcntpj-Vthp)**2\} \quad (77)$$

By designing a delay circuit so as to satisfy the above formulas (74) to (77), an inverter type delay circuit, voltage-controlled delay circuit, and voltage-controlled oscillation circuit wherein an effect of power source noise is small can be realized. When referring to the process of deriving formula (28) from formula (3), even if VthL is unknown, when it is sufficient that the effect of the power source noise can be absorbed in two consecutive delay stages, the left sides of formulas (76) and (77) can be substituted with $\Delta Vdd/Vdd$. That is, the following formulas are obtained:

$$(\Delta Vdd/Vdd)=2\Sigma\{(Wnj/Lnj)(Vcntnj-Vthn)\Delta Vcnj\}/\Sigma\{(Wnj/Lnj)(Vcntnj-Vthn)**2\} \quad (78)$$

$$(\Delta Vdd/Vdd)=2\Sigma\{(Wpj/Lpj)(|Vcntpj-Vthp|)\Delta|Vcpj|\}/\Sigma\{(Wpj/Lpj)(Vcntpj-Vthp)**2\} \quad (79)$$

Second Circuit Example

Figure 16:
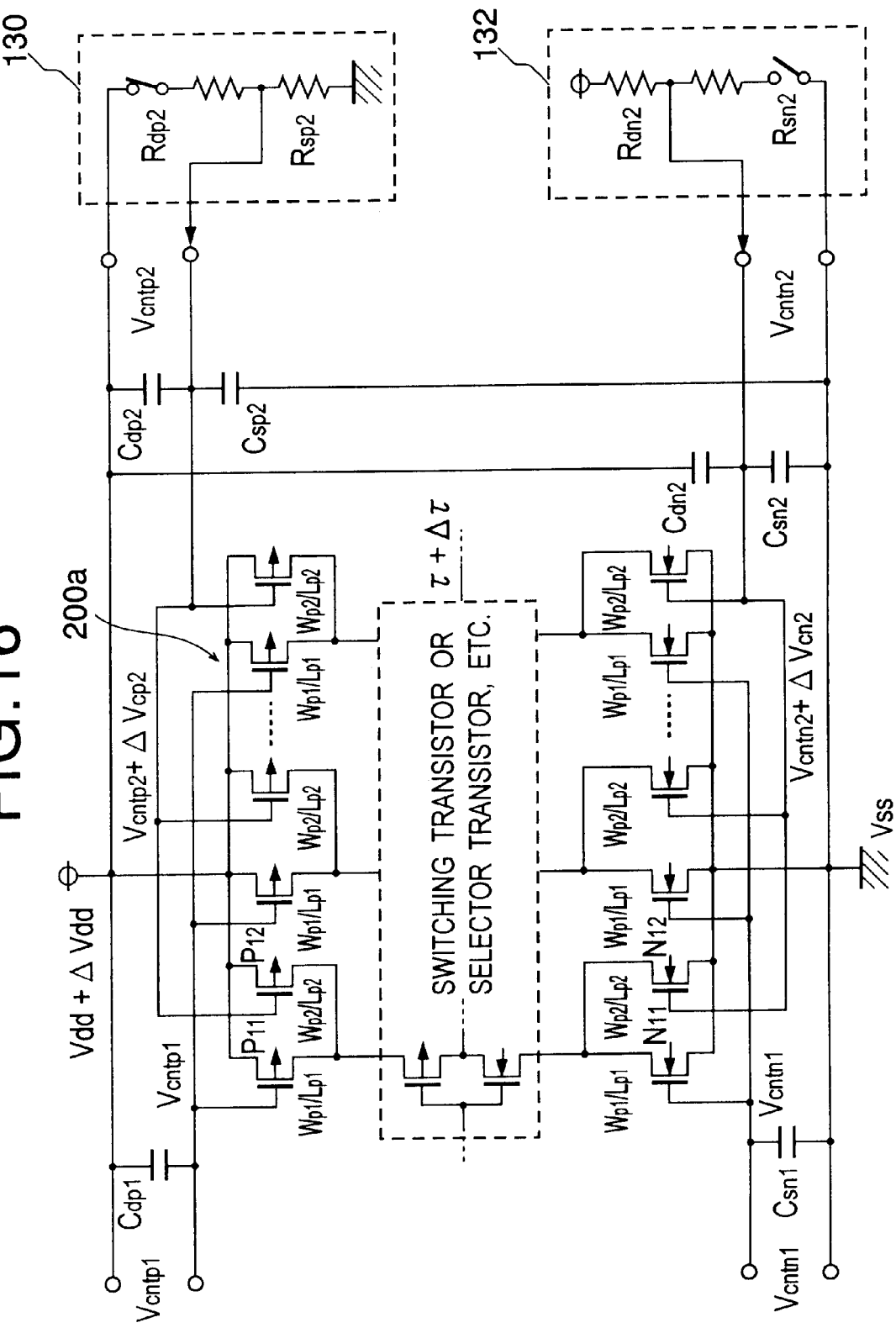
FIG. 16 is a circuit diagram of a second circuit example of the second embodiment of the present invention.

FIG. 16 is a circuit diagram of a second circuit example using the second embodiment of the delay circuit according to the present invention.

As shown in the figure, the points where the delay circuit of the present example differs from the first circuit example of the present embodiment shown in FIG. 15 is that in the delay circuit of the present example, AC adding means are provided for Vcntp2 and Vcntn2 among Vcntp1, Vcntp2, Vcntn1, and Vcntn2 supplied as control voltages or bias voltages, while AC adding means using voltage division of capacitors are not provided for Vcntp1 and Vcntn1—only capacitors Cdp1 and Csn1 for preventing an effect of changes of the power source voltage and stabilizing voltages between the gate and source are provided.

A capacitor Csn1 is provided between the gate input line of N11 and the ground line as a means to suppress an effect by a change $\Delta Vdd$ of the power source voltage at Vgs of the transistor NM11, while a capacitor Cdp1 is provided between the gate input line of P11 and the power source line as a means to suppress an effect by a change of the power source voltage at Vgs of the transistor P11. Namely, $\Delta Vcn1=0$ and $\Delta Vcp1=0$. As a result, the input control voltages or bias voltages Vcntp1 and Vcntn1 are supplied to the delay unit 200a without being affected by the change of the power source voltage $V_{dd}$.

In the delay unit 200a, for example in the first delay stage, a control voltage Vcp1=Vcntp1 is applied to the gate of the current source transistor P11 connected to the power source line side of the CMOS inverter, while a control voltage Vcp2=Vcntp2+$\Delta$Vcp2 is applied to the gate of the current source transistor P12.

On the other hand, a control voltage Vcn1=Vcntp1 is applied to the gate of the current source transistor N11 connected to the ground line side of the CMOS inverter, while a control voltage Vcn2=Vcntp2+$\Delta$Vcn2 is applied to the gate of the current source transistor N12.

An AC adding means to Vgs of the transistor N12 is comprised of a capacitor Csn2 provided between the gate input line of N12 and the ground line and a capacitor Cdn2 provided between the gate input line and the power source line, while an AC adding means to Vgs of the transistor P12 is comprised of a capacitor Cdp2 provided between the gate input line of P12 and the power source line and a capacitor Csp2 provided between the gate input line of P12 and the ground line. Namely, effects $\Delta Vcn2$ and $\Delta Vcp2$ given to the control voltages Vcntn2 and Vcntp2 by a change $\Delta Vdd$ of the power source voltage $V_{dd}$ is determined by the following formulas:

$$\Delta Vcn2=\{Cdn2/(Csn2+Cdn2)\}\times \Delta Vdd \quad (80)$$

$$|\Delta Vcp2|=\{Csp2/(Cdp2+Csp2)\}\times \Delta Vdd \quad (81)$$

The values of capacitors Csn2, Cdn2, Cdp2, and Csp2 are set to ratios by which an AC voltage division and DC voltage division match. That is, the following formulas are obtained:

$$\{Cdn2/(Csn2+Cdn2)\}=(Vcntn2/Vdd) \quad (82)$$

$$\{Csp2/(Cdp2+Csp2)\}=(|Vcntp2|/Vdd) \quad (83)$$

Accordingly, $\Delta Vcn2$ and $\Delta Vcp2$ are respectively found by the following formulas:

$$\Delta Vcn2=(Vcntn2/Vdd)\times \Delta Vdd \quad (84)$$

$$\Delta Vcp2=(Vcntp2/Vdd)\times \Delta Vdd \quad (85)$$

Here, entering $\Delta VCN=0$ and $\Delta Vcp1=0$ and formulas (84) and (85) to formulas (70) and (79) the ratios of transistor sizes enabling reduction of the effect of power source noise are given by the following formulas:

$$\{(Wn1/Ln1)/(Wn2/Ln2)\}\approx \{(Vcntn2-Vthn)(Vcntn2+Vthn)\}/\{(Vcntn1-Vthn)**2\} \quad (86)$$

$$\{(Wp1/Lp1)/(Wp2/Lp2)\}\approx \{(Vcntp2-Vthp)(Vcntp2+Vthp)\}/\{(Vcntp1-Vthp)**2\} \quad (87)$$

For example, when $Vcntn1\approx |vcntp1|\approx (\frac{1}{2})Vdd$, $Vcntn2\approx |Vcntp2|\approx (\sqrt{5/6})Vdd\approx 0.373Vdd$, and further $Vthn\approx |Vthp|\approx (\frac{1}{6})V_{dd}$, $\{(Wn1/Ln1)/(Wn2/Ln2)\}\approx \{(Wp1/Lp1)/(Wp2/Lp2)\}\approx 1$ stands.

By configuring the circuit in this way, it is possible to design for different purposes such as using Vcntn1 and Vcntp1 as supply lines exclusively for a control voltage connected to the charge pump output, while using Vcntp2 and Vcntn2 as supply lines exclusively for a bias power source for reducing an effect of power source noise.

Further preferably, a bias circuit for generating Vcntn2 and bias circuits 130 and 132 for generating Vcntp2 are provided and the bias circuits are made to function as DC adding means for reducing an effect of power source noise.

In the bias circuit 132 for generating the bias voltage vcntn2, a voltage division voltage Vcntn2 shown by the following formula is generated by the voltage division ratio of the resistance component Rsn2 between the gate input line of the current source transistor P12 and ground line and the resistance component Rdn2 between the gate input line of the current source transistor N12 and the power source line.

$$Vcntn2=\{Rsn2/(Rsn2+Rdn2)\}\times Vdd \quad (88)$$

In the bias circuit 130 for generating the bias voltage Vcntp2, a voltage division voltage Vcntp2 shown by the following formula is generated by the voltage division ratio of the resistance component Rdp2 between the gate input line of the current source transistor P12 and the power source line and the resistance component Rsp2 between the gate input line of the current source transistor P12 and the ground line.

$$|Vcntp2|=\{Rdp2/(Rdp2+Rsp2)\}\times Vdd \quad (89)$$

DC addition is of course found by the following formulas from formulas (88) and (89), respectively:

$$\Delta Vcn2=(Vcntn2/Vdd)\times\Delta Vdd \quad (90)$$

$$\Delta Vcp2=(Vcntp2/Vdd)\times\Delta Vdd \quad (91)$$

In the delay circuit of the present example, not only AC adding means comprised of capacitors, but also DC adding means comprised of resistors are provided, so the example is effective against power source noise of a wide frequency component.

Third Circuit Example

Figure 17:
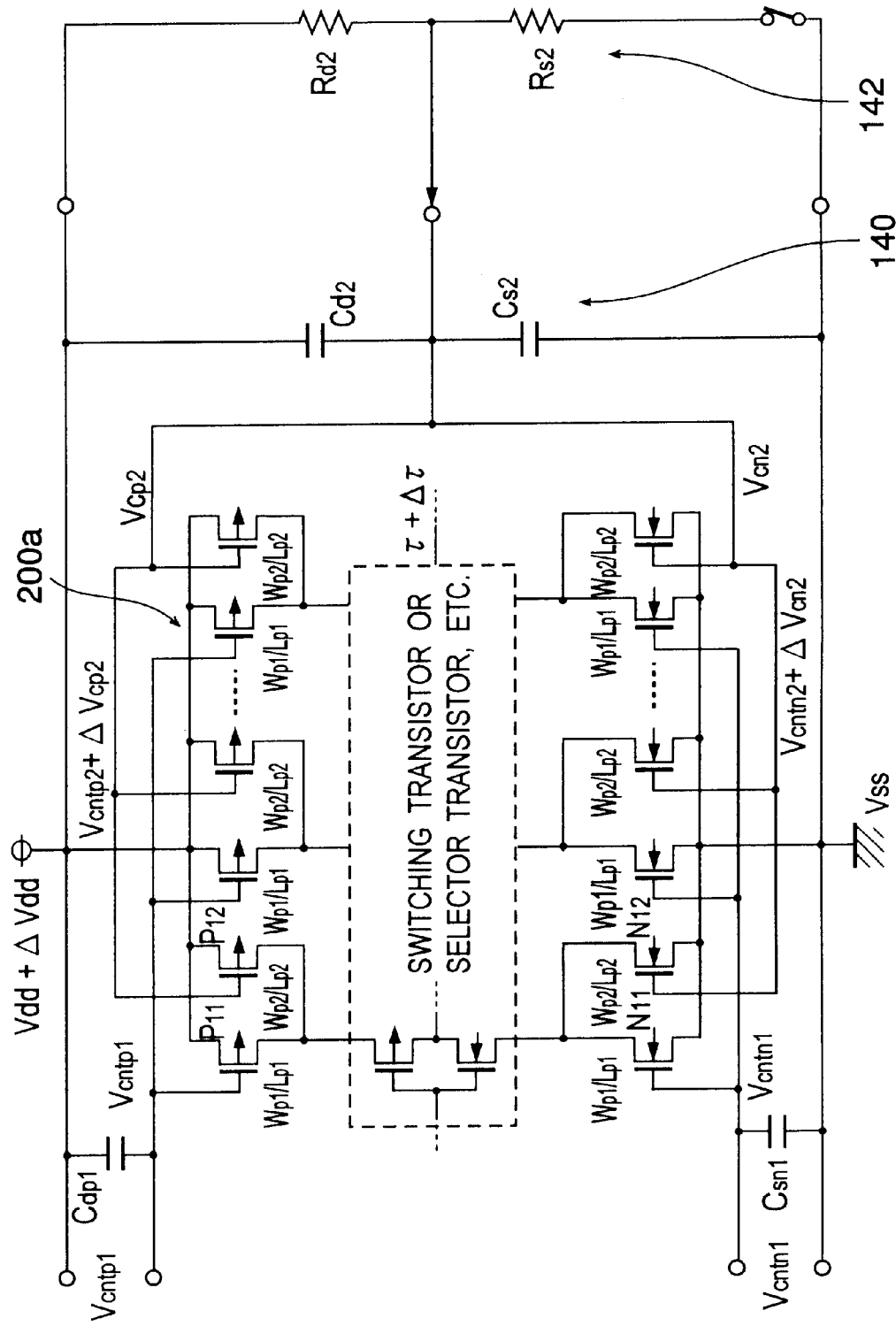
FIG. 17 is a circuit diagram of a third circuit example of the second embodiment of the present invention.

FIG. 17 is a circuit diagram of a third circuit example using the second embodiment of the delay circuit according to the present invention. The point where the present circuit example differs from the second circuit example shown in FIG. 16 is that Vcntp2 and Vcntn2 among Vcntp1, Vcntp2, Vcntn1, and Vcntn2 supplied as control voltages or bias voltages are supplied by a common line.

As shown in FIG. 17, in the delay unit 200a, a control voltage Vcp2=Vcntp2+ΔVcp2 supplied to the current source transistor on the power source line side of the respective delay stages and a control voltage Vcn2=Vcntn2+ΔVcn2 supplied to the current source transistor on the ground line side are supplied by the same control voltage line.

For example, in the first delay stage, the gate input line of the current source transistor N12 on the ground line side and the gate input line of the current source transistor P12 on the power source line side are in common, and control voltages (Vcp2 and Vcn2) are supplied from a reference voltage generation circuit 140 so that effective voltages between the gate and source of the transistor N12 and the transistor P12 become about the same.

Namely, the following formula stands:

$$\Delta Vcntn2-Vthn\approx|Vcntp2-Vthp| \quad (92)$$

Since Vcntn2+|Vcntp2|=Vdd, the following formulas are obtained:

$$Vcntn2\approx(Vdd+Vthn-|Vthp|)/2\approx Vdd/2 \quad (93)$$

$$|Vcntp2|\approx(Vdd+|Vthp|-Vthn)/2\approx Vdd/2 \quad (94)$$

As shown in FIG. 17, the reference voltage generation circuit serving also as the DC adding means preferably includes a voltage division circuit 142 comprised of a resistance component Rs2 between the gate input line common to the current source transistors n12 and P12 and the ground line and resistance component Rd2 between the gate input line common to the current source transistors N12 and P12 and the power source line.

Namely, the bias voltage is generated by DC voltage division.

$$Vcntn2=\{Rs2/(Rs2+Rd2)\}\times Vdd\approx Vdd/2 \quad (95)$$

$$|Vcntp2|=\{Rd2/(Rs2+Rd2)\}\times Vdd\approx Vdd/2 \quad (96)$$

Note that Rs2≈Rd2 here.

The resistance components Rs2 and Rd2 may be formed by MOS transistors etc.

Figure 18:
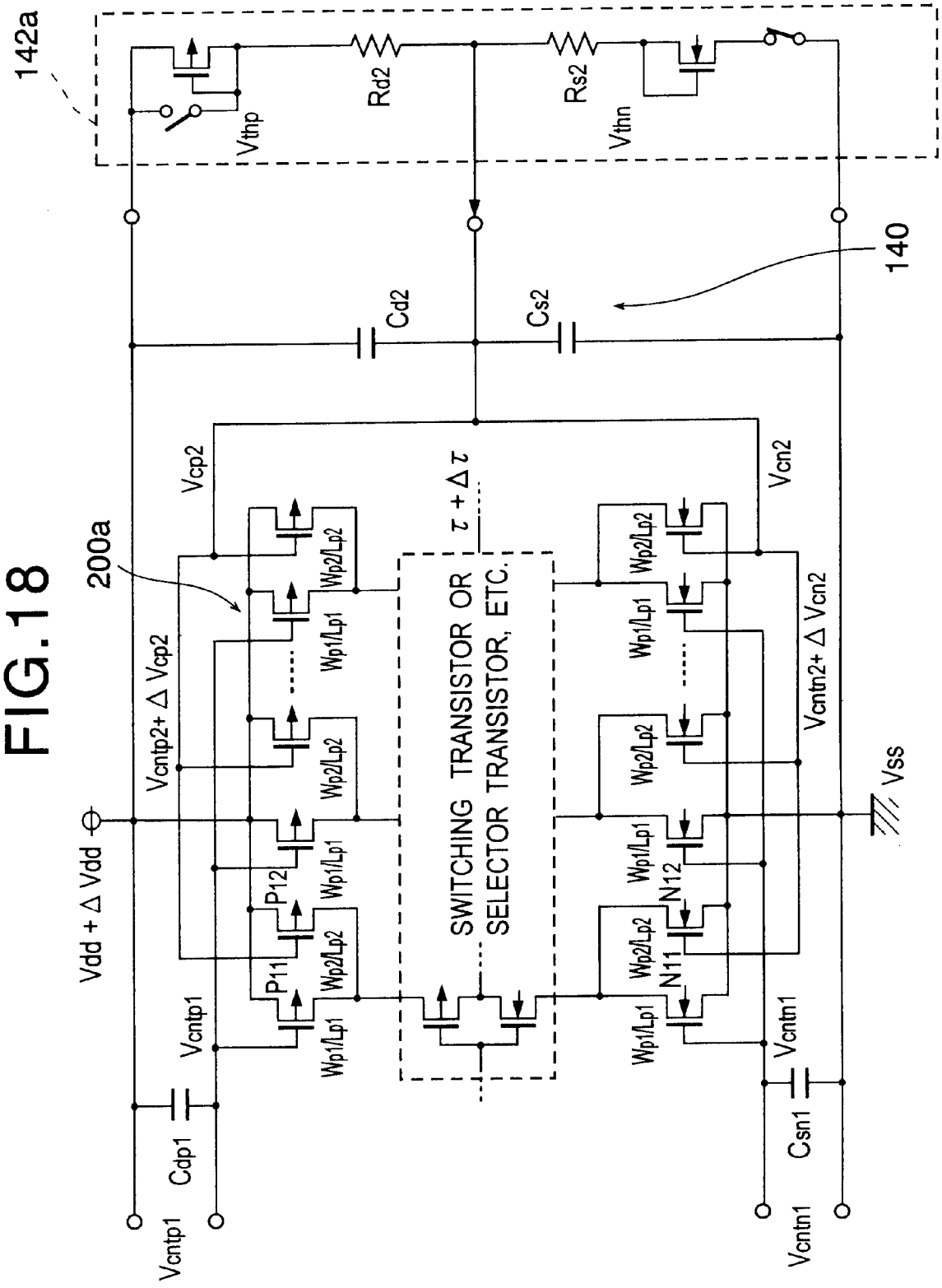
FIG. 18 is a circuit diagram of another example of the configuration of the third circuit example of the second embodiment of the present invention.

Alternatively, as shown in FIG. 18, the reference voltage generation circuit serving also as a DC adding means preferably includes a voltage division circuit 142a comprised of a PMOS transistor provided on the power source line side and having a gate and a drain connected for generating a voltage in an amount of Vthp, an NMOS transistor provided on the ground line side and having a gate and a drain connected for generating a voltage in an amount of Vthn, and two resistance elements Rd2 and Rs2 of the same resistance values serially connected between the gates of the above two transistors. In the voltage division circuit 142a, a reference voltage (bias voltage) is output from a middle point of connection of the two resistors Rd2 and Rs2.

Note that in FIG. 18, the components other than the voltage division circuit 142a are substantially the same as those in the third circuit example shown in FIG. 17.

In the delay unit 200a, for example, the AC adding means to Vgs of the current source transistor N12 and the AC adding means to Vgs of the current source transistor P12 of the first delay stage use AC voltage division by the capacitor Cs2 provided between the common gate input line and the ground line and the capacitor Cd2 provided between the common gate input line and the power source line. Note that Cs2≈Cd2 in FIG. 17 and FIG. 18.

Namely, the control voltage Vcp2 supplied to the current source transistor on the power source line side and the control voltage Vcn2 supplied to the transistor on the ground line side of the delay unit 200a are found from the following formulas:

$$\Delta Vcn2=\{Cd2/(Cs2+Cd2)\}\times\Delta Vdd\approx\Delta Vdd/2 \quad (97)$$

$$|\Delta Vcp2|=\{Cs2/(Cs2+Cd2)\}\times\Delta Vdd\approx\Delta Vdd/2 \quad (98)$$

When Vcntn2≈|Vcntp2|≈Vdd/2 at the bias voltage side, that is, at the voltage vcntn2 and Vcntp2 side, and Vcntn1≈|Vcntp1|≈Vdd/2 at the control voltage side, that is, at the voltage vcntn1 and Vcntp1 side, the ratios of transistor sizes capable of reducing an effect of power source noise are given from the following formulas from formulas (86) and (87):

$$\{(Wn1/Ln1)/(Wn2/Ln2)\}=[\{(Vdd/2)+Vthn\}/\{(Vdd/2)-Vthn\}] \quad (99)$$

$$\{(Wp1/Lp1)/(Wp2/Lp2)\}=[\{(Vdd/2)+|Vthp|\}/\{(Vdd/2)-|Vthp|\}] (100)$$

For example, when Vthn≈|Vthp|≈(⅙)Vdd, {(Wn1/Ln1)/(Wn2/Ln2)}≈{(Wp1/Lp1)/(Wp2/Lp29]≈2 stands.

If configuring the circuit in this way, the number of capacitors necessary for the AC adding means and the number of resistors necessary for the DC adding means can be halved. Preferably, by utilizing as is an output of the reference voltage (≈Vdd/2) generation circuit for generating an inverted voltage of the control voltage, there is an advantage that the increase of the circuit scale can be suppressed to only an increase of the current source transistors of the delay stages.

Figure 20:
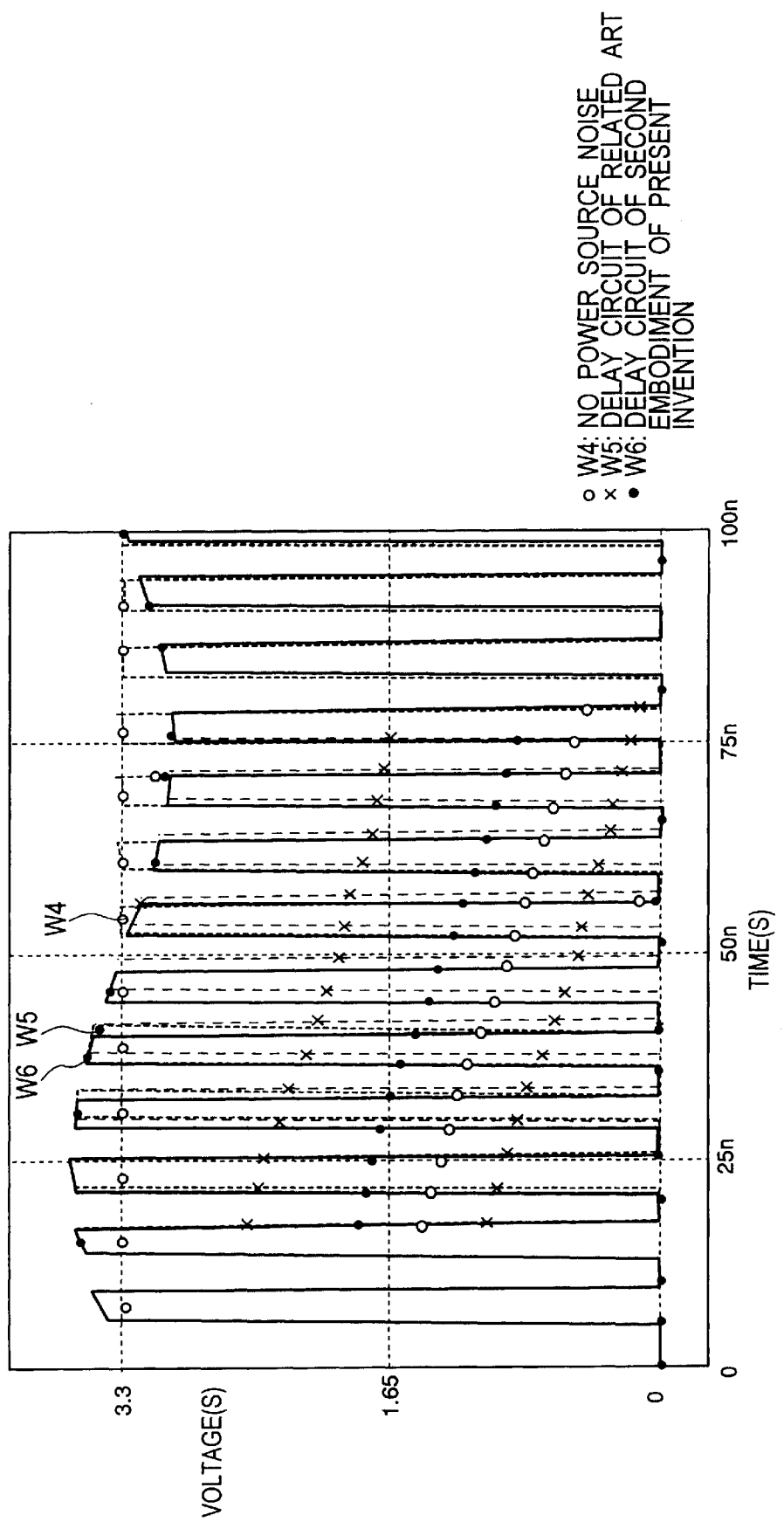
FIG. 20 is a view of results of simulation of the third circuit example of the second embodiment of the present invention.

FIG. 20 is a view of the results of simulation in the case of using the third circuit example using the second embodiment of the present invention shown in FIG. 17 and FIG. 18 for a voltage-controlled oscillation circuit. In FIG. 20, W4 indicates a waveform of simulation when there is no power source noise, W5 indicates a waveform of simulation of a conventional example when there is power source noise, and W6 is a waveform of simulation when using the present third circuit example when there is power source noise. As shown in the figure, it is obvious that the effect of power source noise can be largely reduced and jitter can be largely reduced by the delay circuit using the second embodiment of the present invention.

Figure 19:
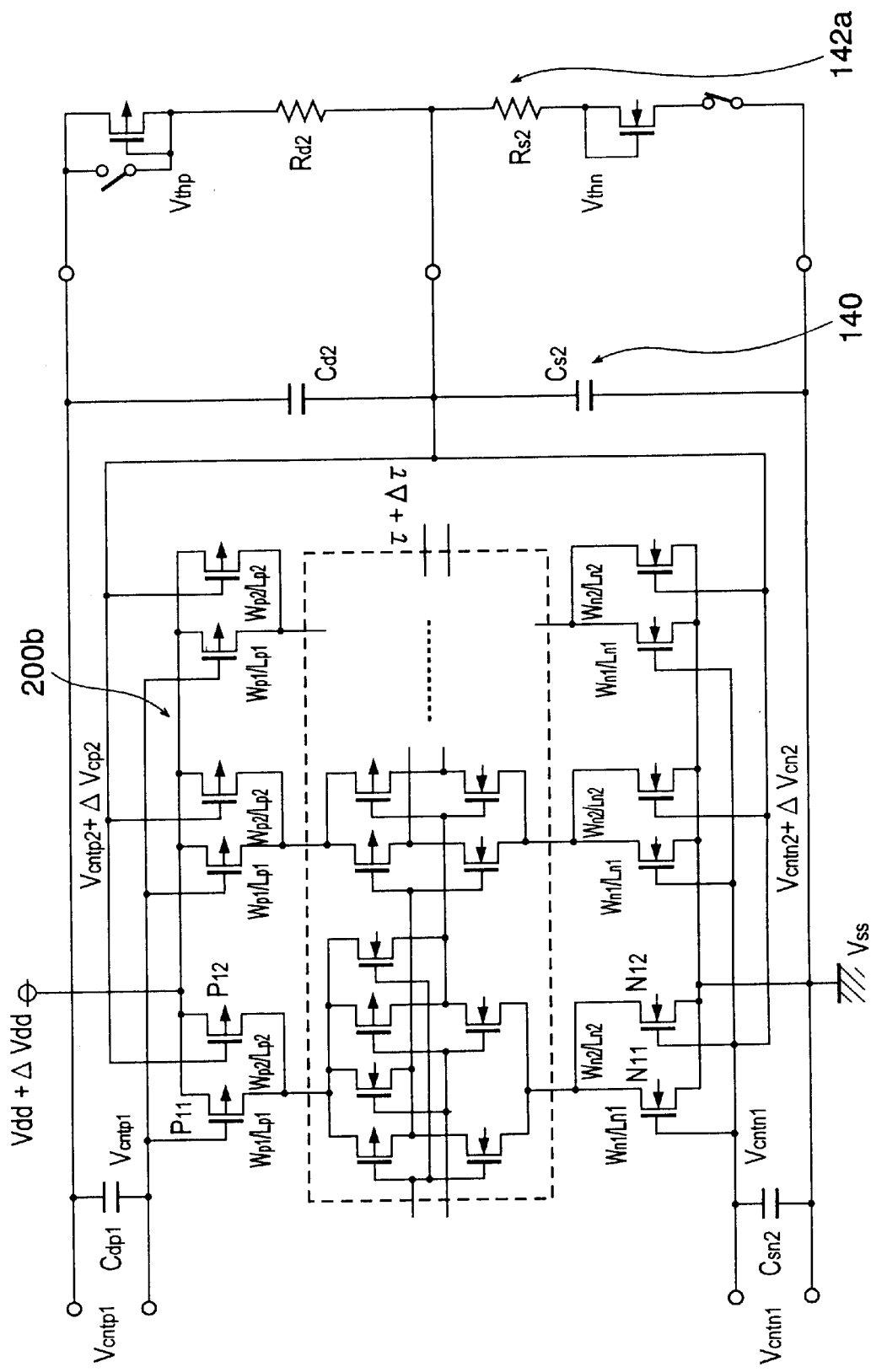
FIG. 19 is a circuit diagram of another example of the configuration of the third circuit example of the second embodiment of the present invention.

FIG. 19 is another example of the configuration of the third circuit example of the second embodiment of the present invention.

The point where this differs from the example of the configuration shown in FIG. 18 is that an inverter constituting the delay stage is differentially configured. While the delay stage is configured differentially, since the control voltage dependency of a delay time is closer to the characteristics of an inverter type delay stage than the characteristics of a true differential type delay stage like a current mirror type, the method of reducing the effect of power source noise of the present invention can be applied.

Third Embodiment

In the present embodiment, a method of expanding a range of control voltage or a range of oscillation frequency of a voltage-controlled delay circuit or voltage-controlled oscillator using the method of reducing the effect of power source noise according to the first and second embodiments of the present invention will be clarified.

First, when τofi is the delay time at the time of falling of a delay stage output and τori is a delay time at the time of rising of a delay stage output, the formulas summarizing the method of reducing the effect of power source noise in the first and second embodiment of the present invention can be rewritten as follows for a current source type delay stage:

$$\Delta\tau ofi=\tau ofi(\{(\Delta Vdd-\Delta VthL)/(Vdd-VthL)\}-[2\Sigma\{(Wnj/Lnj)(Vcntnj-Vthn)kcnj\Delta Vdd\}/\Sigma\{(Wnj/Lnj)(Vcntnj-Vthn)**2\}]) \quad (101)$$

$$\Delta\tau ori=\tau ori(\{(\Delta VthL/\Delta VthL)-[2\Sigma\{(Wpj/Lpj)(|Vcntpj-Vthp|)kcpj\Delta Vdd\}/\Sigma\{(Wpj/Lpj)(Vcntpj-Vthp)**2\}]) \quad (102)$$

When $Vdd-VthL\approx VthL\approx Vdd/2$ and $Vcntnj=|Vcntpj|=Vctyp$, formulas (101) and (102) are changed as follows:

$$\Delta\tau ofi=\tau ofi x(\Delta Vdd/Vdd)\times\{1-(\{vdd/(Vctyp-Vthn)\}\{2\Sigma\{(Wnj/Lnj)kcpj\}/\Sigma(Wpj/Lpj)\}\} \quad (103)$$

$$\Delta\tau ori=\tau ori x(\Delta Vdd/Vdd)\times\{1-(\{vdd/(Vctyp-|Vthp|)\})[2\Sigma\{(Wpj/Lpj)kcpj\}/\Sigma(Wpj/Lpj)] \quad (104)$$

In formulas (103) and (104), when the terms {Vdd/(Vctyp−Vthn)} and {Vdd/(Vctyp−|Vthp|)} are maintained at constant values regardless of the power source voltage $V_{dd}$ or control voltage Vctyp, $\Delta\tau ofi\approx\Delta\tau ori\approx 0$ can be attained with a particular combination of kcnj, kcpj, Wnj/Lnj, and Wpj/Lpj regardless of the control voltage Vctyp. That is, a feedback loop which satisfies the following formula should be provided:

$$k1\times Vdd\approx Vctyp-Vthn \quad (105)$$

Note that it is necessary to note that interfacing with other circuits has to be considered since Vdd also changes along with Vctyp, so the rate of change (that is, a gain of a VCO circuit) of a delay time with respect to Vctyp falls to about ⅔ and the oscillation frequency region becomes narrow and since the amplitude of a delay stage output changes in accordance with the voltage of Vctyp.

Figure 21:
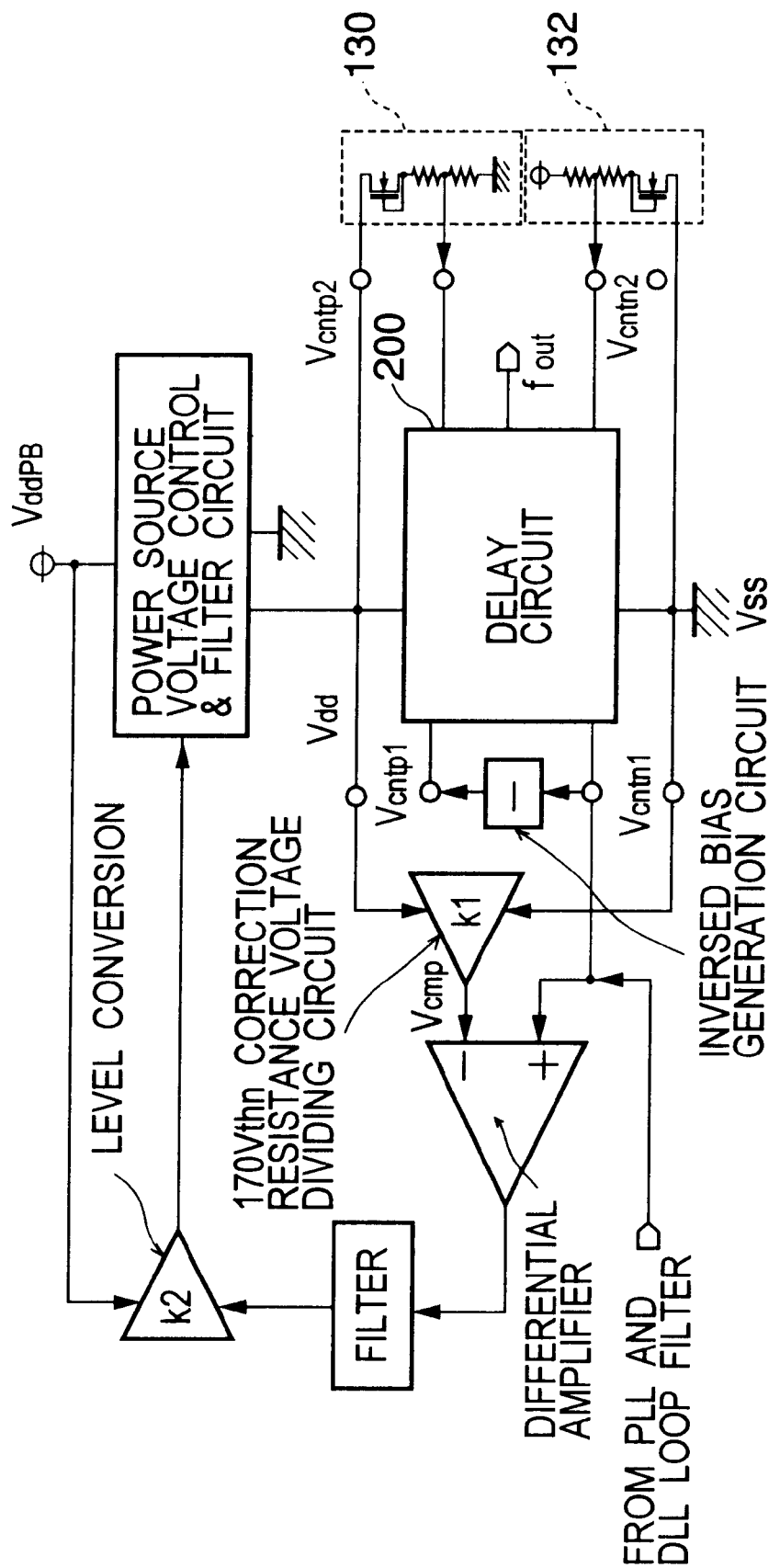
FIG. 21 is a view of the configuration of a third embodiment of the present invention.

FIG. 21 is a view of the configuration of a delay circuit, a voltage-controlled delay circuit, and a voltage-controlled oscillation circuit according to the third embodiment of the present invention.

As shown in the figure, in the present embodiment, a means for maintaining the control voltage and the power source voltage in a certain relationship is provided to expand the range of control voltage and the range of oscillation frequency by which an effect of power source noise can be reduced.

FIG. 21 shows a circuit example of the case of controlling the control voltage Vcntn1 by a PLL or a DLL and controlling the power source voltage $V_{dd}$ supplied to the delay circuit (or voltage-controlled delay circuit and voltage-controlled oscillation circuit) by Vcntn1.

Figure 22:
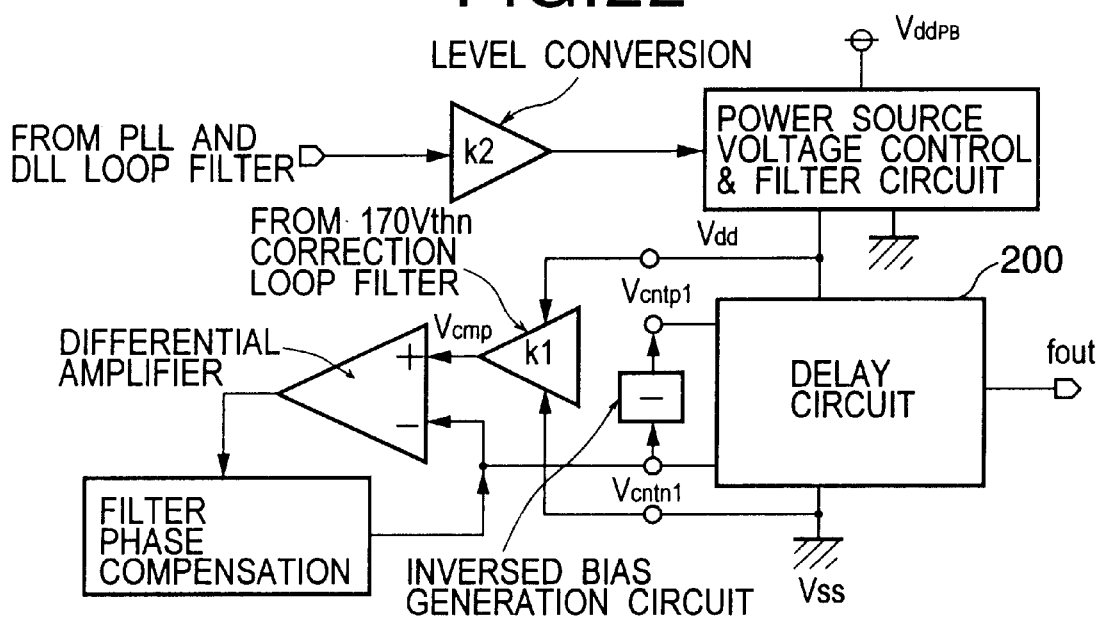
FIG. 22 is a view of another example of the configuration of the third embodiment of the present invention.

Note that FIG. 22 shows a circuit example of the case of controlling the power source voltage $V_{dd}$ supplied to the delay circuit by a PLL or DLL and controlling Vcntn1 by the power source voltage $V_{dd}$. Further, FIG. 23 is a circuit diagram of a reference voltage generation circuit 170 for generating a reference voltage Vcmp for fulfilling the relationship of formula (105).

Figure 23:
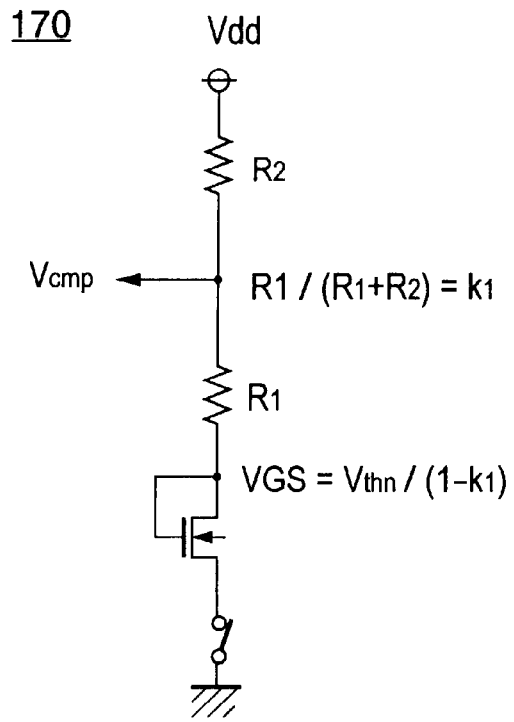
FIG. 23 is a circuit diagram of the configuration of a threshold correction resistance voltage division circuit.

In FIG. 23, the reference voltage Vcmp is given by the following formula:

$$Vcmp=\{R1/(R1+R2)\}\times(Vdd-VGS)+VGS \quad (106)$$

Furthermore, in the circuit shown in FIG. 21 and FIG. 22, control is performed so that Vctyp=Vcmp, so the following formulas are obtained from formulas (102) and (103):

$$(R2/R1)=\{(1-k1)/k1\} \quad (107)$$

$$VGS=\{1/(1-k1)\}\times Vthn \quad (108)$$

From formula (108), there may also be provided two or three transistors for generating a voltage Vgs in FIG. 23 depending on the value of k1. Also, a certain effect can be obtained even in the case of voltage division by just resistors and not a transistor for generating VGS.

As another method of maintaining constant values of {Vdd/(Vctyp−Vthn)} and {Vdd/(Vctyp−|Vthp|)} in formulas (103) and (104), the method of reducing a change of a value obtained by multiplying these terms with kcnj and kcpj can be considered. Kcnj and kcpj are given by formulas (74) and (75), but the capacitors are formed by junction capacitances.

Fourth Embodiment

Figure 24:
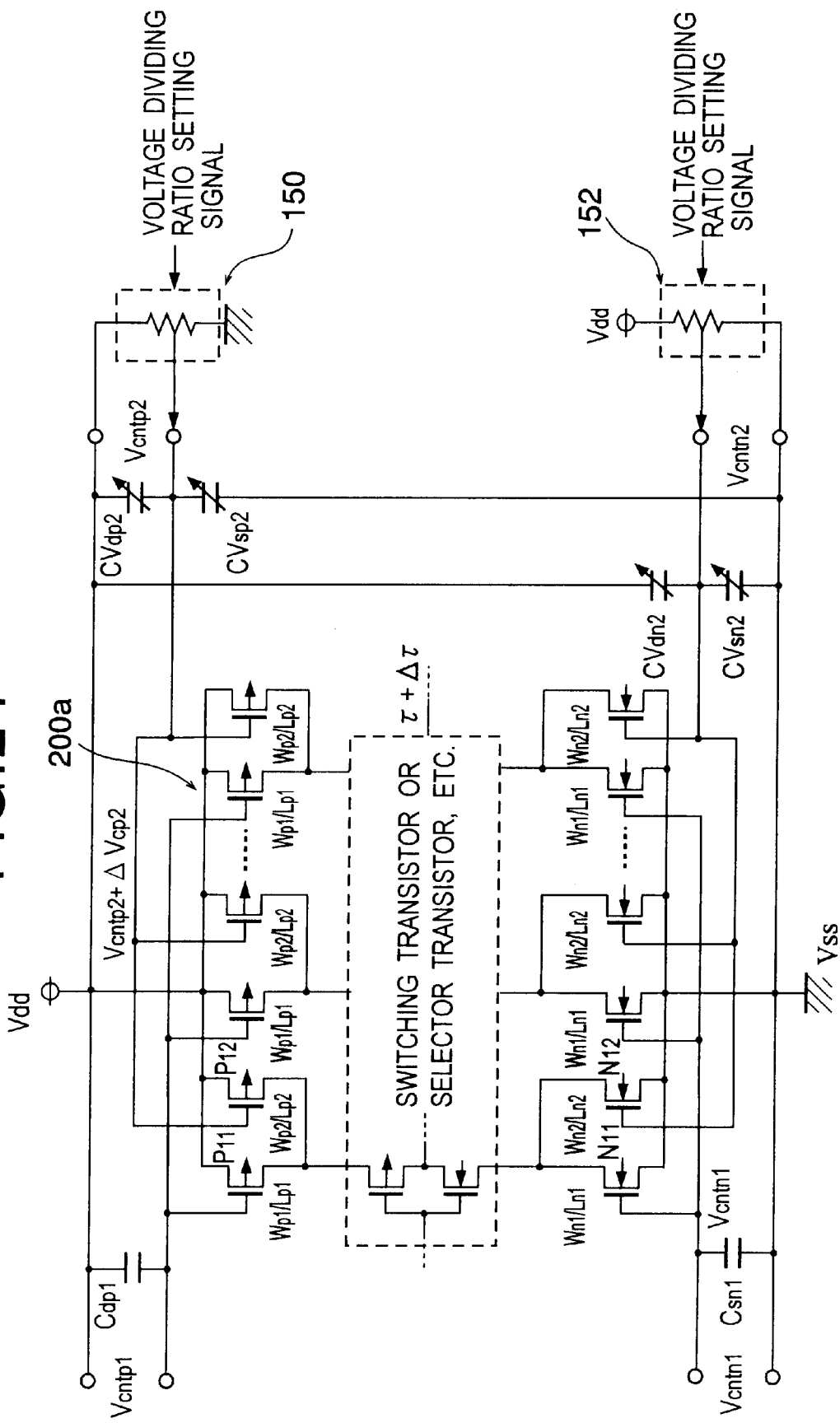
FIG. 24 is a view of the configuration of a fourth embodiment of the present invention.

FIG. 24 is a circuit diagram of a fourth embodiment of a delay circuit, a voltage-controlled delay circuit, or a voltage-controlled oscillation circuit according to the present invention. In the present embodiment, a variable-voltage capacitor, that is, a junction capacitor, is used for the capacitor constituting an AC adding means for expanding the range of control voltage or range of oscillation frequency where the effect of power source noise can be reduced.

Normally, the value of a junction capacitance Cj generated in a semiconductor element is given by the following formula:

$$Cj(VBD)\approx C0/\{(Vpb+VBD)**mj\} \quad (109)$$

In formula (109), VBD indicates an inverse bias voltage applied from the outside to a PN junction, Cj indicates a capacitance value at the time when the voltage VBD is applied, and Vpd and mj are device constants.

Normally in a silicon (Si) semiconductor chip, the values are about Vpb≈1.0V and mj≈0.5, but a graded junction (m≈⅓) and a step junction (mj≈½) are often used for a varactor for frequency multiplication or parametric amplification, while super step junction (mj≈½ to 8) is often used for a variable-capacitance diode for electronic tuning.

The formulas of voltage dependencies of junction capacitances corresponding to FIG. 24 are given as next:

$$Cdnj\approx Cdn0j/\{(Vpb+V_{dd}-Vcntnj)**mjp\}$$

$$Csnj\approx Csn0j/\{(Vpb+Vcntnj)**mjn\}$$

$$Csnj\approx Csp0j/\{(Vpb+V_{dd}-|Vcntpj|)**mjn\}$$

$$Cdpj \approx Cdp0j/\{(Vpb+|Vcntpj|)^{**}mjp\}$$

The rate of change $\Delta Cj/Cj$ standardized at a certain voltage is given from the following formula:

$$\Delta Cj/Cj \approx mjVBD/(Vpb+VBD) \quad (110)$$

At a standard power source voltage Vdd and a standard control voltage $Vcntnj=|Vntpj|=Vctyp$, the standardized rates of change $\Delta Cj/Cj$ of the capacitors elements with respect to the changes $\Delta Vcnj$ and $\Delta |Vcpj|$ of a drain voltage become as follows:

$$\Delta Cdnj/Cdnj \approx mjp \times \Delta Vcnj/(Vpb+V_{dd}-Vctyp)$$

$$\Delta csnj/Csnj \approx mjn \times \Delta Vcnj/(Vpb+Vctyp)$$

$$\Delta cspj/Cspj \approx mjn \times \Delta 51\, Vcpj|/(Vpb+V_{dd}-VctYp)$$

$$\Delta cdpj/Cdpj \approx mjp \times \Delta |Vcpj|/(Vpb+Vctyp)$$

The following formulas are obtained from formulas (73) and (74):

$$\Delta kcnj/kcnj \approx (\Delta Cdnj/Cdnj) - \{(\Delta Csnj+\Delta Cdnj)/(Csnj+Cdnj)\} \approx (1-kcnj)\{(\Delta Cdnj/Cdnj)-(\Delta Csnj/Csnj)\} \approx (1-kcnj)\Delta Vcnj[\{mjp/(Vpb+Vdd-Vctyp)\}+\{mjn/(Vpb+Vctyp)\}] \quad (111)$$

$$\Delta kcpj/kcpj \approx (Cspj/Cspj) - \{(\Delta Cdpj+\Delta Cspj)/(Cdpj+Cspj)\} \approx (1-kcpj)\{(\Delta Cspj/Cspj)-(\Delta Cdpj/Cdpj)\} \approx (1-kcpj)\Delta |Vcpj|[\{mjn/(Vpb+Vdd-Vctyp)\{+\}mjp/(Vpb+Vctyp)\}] \quad (112)$$

The terms $\{Vdd/(Vctyp-Vthn)\}$ and $\{Vdd/(Vctyp-|Vthp|)\}$ in formulas (103) and (104) are set as shown in the following formulas:

$$kvn=\{Vdd/(Vctyp-Vthn)\} \quad (113)$$

$$kvp=\{Vdd/(Vctyp-|Vthp|)\} \quad (114)$$

At a standard power source voltage $V_{dd}$ and a standard control voltage $Vcntnj=|Vcntpj|=Vctyp$, the standardized rates of change $\Delta kvn/kvn$ and $\Delta kvp/kvp$ of kvn and kvp with respect to a change $\Delta vctyp$ of the control voltage are obtained by the following formulas:

$$\Delta kvn/kvn \approx -\Delta Vctyp/(Vctyp-Vthn) \quad (115)$$

$$\Delta kvp/kvp \approx -\Delta Vctyp/(Vctyp-|Vthp|) \quad (116)$$

To obtain the same effects of reducing the effect of power source noise even when the standard control voltage Vctyp is shifted, it is sufficient that the relative rates of change of formulas (111), (112), (115), and (116) cancel each other out. Accordingly, the following formulas are obtained:

$$1/(Vctyp-Vthn) \approx (1-kcnj)[\{mjp/(Vpb+Vdd-Vctyp)\}+\{mjn/(Vpb+Vctyp)\}] \quad (117)$$

$$1/(Vctyp-|Vthp|) \approx (1-kcpj)[\{mjn/(Vpb+Vdd-Vctyp)\}+\{mjp/(Vpb+Vdd-Vctyp)\}] \quad (118)$$

For example, when $Vctyp=Vdd/2$, $Vthn=|Vthp|=Vdd/6$, $kcnj=kcpj=kcj$ and $Vpb=1V$ and $mjn=mjp=mj$, mj is obtained from the following formula:

$$mj=(3/4)\{1/(1-kcj)\}\{(2+Vdd)/Vdd\} \quad (119)$$

Accordingly, a variable capacitance diode of a super step junction as below may be used:

when $kcj=\frac{1}{2}$ and $Vdd=3.3V$, $mj \approx 2.4$
when $kcj=\frac{1}{2}$ and $Vdd=2.2V$, $mj \approx 2.9$
when $kcj=\frac{1}{6}$ and $Vdd=3.3V$, $mj \approx 1.4$
when $kcj=\frac{1}{6}$ and $Vdd=2.2V$, $mj \approx 1.7$ The case where one of Csnj and Cdnj and one of Cdpj and Cspj are made capacitors without any voltage dependency (for example, when only one of a P+ diffusion layer or an N+ diffusion layer is made able to form a variable capacitance diode of a super step junction as a process) corresponds to $\Delta csnj=0$ or $\Delta cdnj=0$ in formula (111) and $\Delta cdpj=0$ or $\Delta cspj=0$ in formula (112), so a value of two times as much is necessary for mj. Namely, mj is found by the following formula:

$$mj=(3/2)\{1/(1-kcj)\}\{(2+Vdd)/Vdd\} \quad (120)$$

Accordingly, a variable capacitance diode of a super step junction as below may be used:

when $kcj=\frac{1}{2}$ and $Vdd=3.3V$, $mj \approx 4.8$
when $kcj=\frac{1}{2}$ and $Vdd=2.2V$, $mj \approx 5.7$
when $kcj=\frac{1}{6}$ and $Vdd=3.3V$, $mj \approx 2.9$
when $kcj=\frac{1}{6}$ and $Vdd=2.2V$, $mj \approx 3.4$ Note that in a wafer producing process, patterning and implantation are necessary to form an impurity profile of a super step junction. Therefore it is necessary to take steps to reduce the increase in steps such as effectively combining existing implantation steps. Also, if the impurity concentrations of both P and N on a junction face are high, care is needed because the breakdown voltage will fall and the leak current will increase in some cases.

Note that when forming a super step junction capacitor, the wafer process becomes complicated. As a result, there is a high possibility of an increase of the cost of the semiconductor chip. To solve the problem, the method of controlling the control voltage by a pseudo variable capacitor is effective.

Fifth Embodiment

Figure 25:
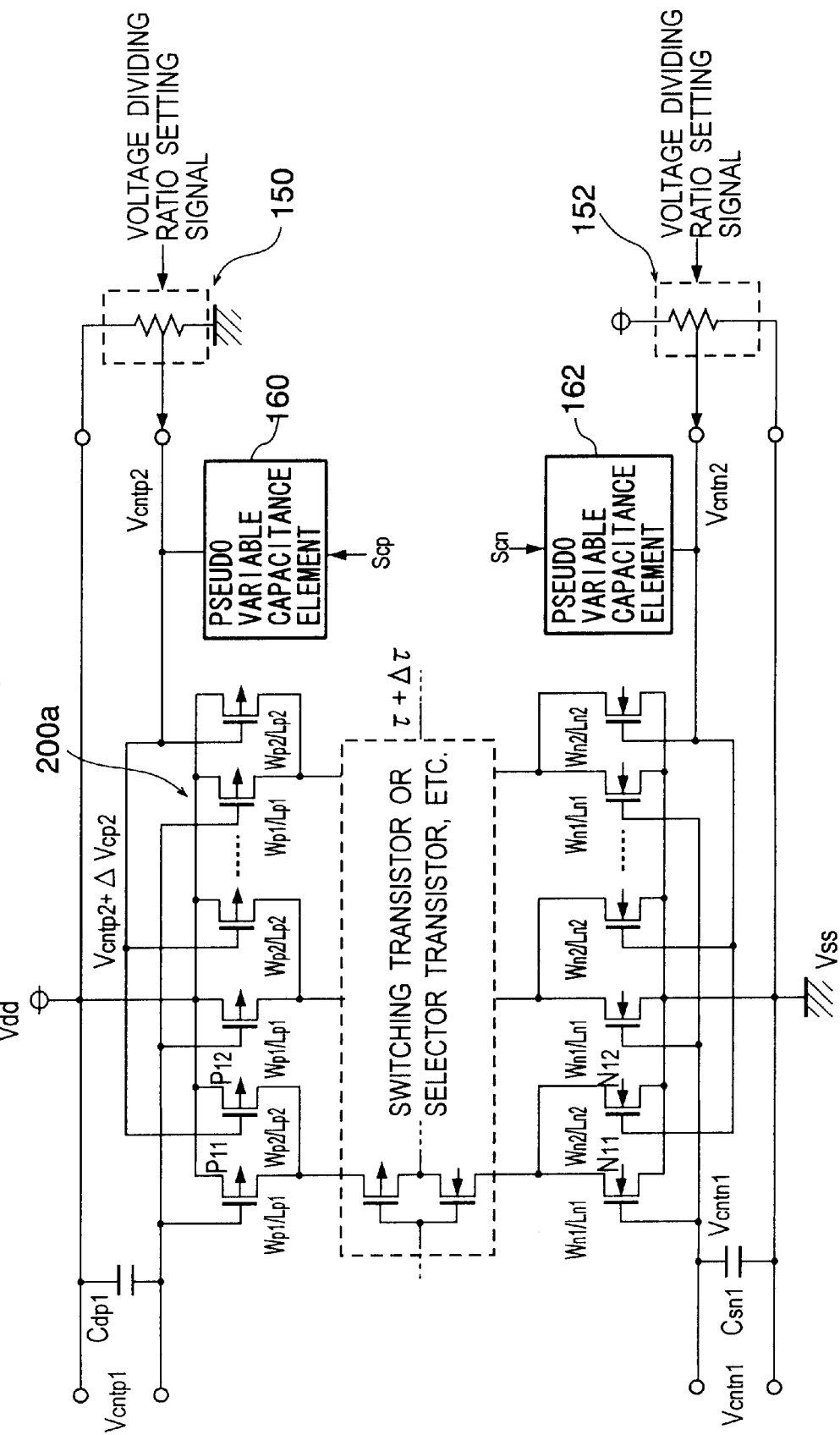
FIG. 25 is a view of the configuration of a fifth embodiment of the present invention.

FIG. 25 is a fifth embodiment of a circuit diagram of a delay circuit, a voltage-controlled delay circuit, or a voltage-controlled oscillation circuit according to the present invention. As shown in the figure, in the present embodiment, a pseudo variable capacitor is used to configure an AC adding means for generating control voltages Vcntn2 and Vcntp2 and thereby realize an expansion of the range of control voltage and the range of oscillation frequency range where the effect of power source noise can be reduced. In the present embodiment, by using a pseudo variable capacitor, a capacitor of a super step junction becomes unnecessary and simplification of the wafer process and suppression of the production costs can be realized.

Figure 26:
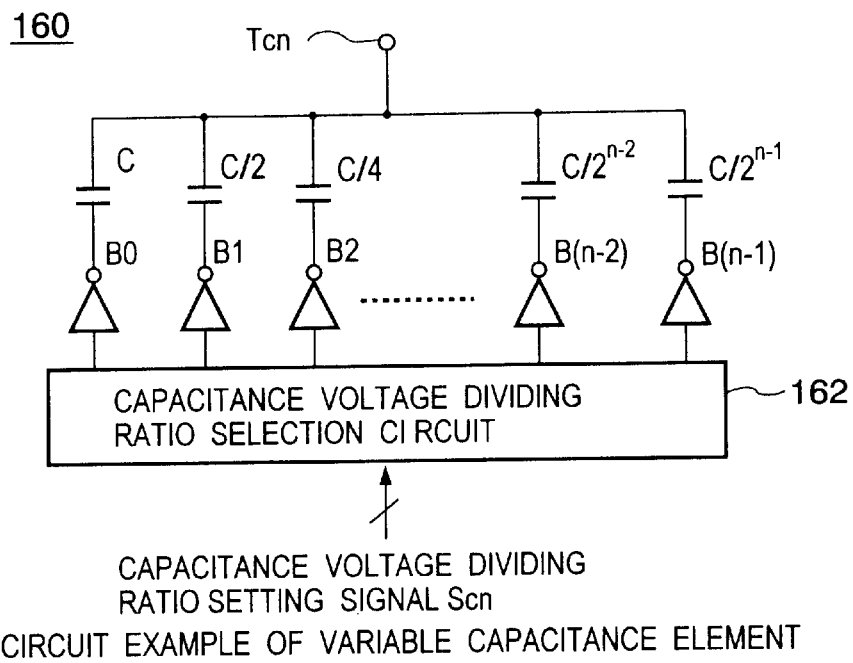
FIG. 26 is a circuit diagram of the configuration of a variable capacitor.

FIG. 26 is a circuit diagram of the configuration of a pseudo variable capacitor of the present invention.

As shown in the figure, a pseudo variable capacitor 160 is comprised of n number of capacitors set in capacitance in accordance with a power of 2, n number of inverters connected to the capacitors, and a capacitance voltage division ratio selection circuit 162 for supplying a control signal to these inverters.

One terminal of each capacitor is connected in common and the other terminal is connected to an output terminal of an inverter. An input terminal of each inverter is connected to the capacitance voltage division ratio selection circuit 162. The capacitance voltage division ratio selection circuit 162 outputs a control signal to each inverter in accordance with an input capacitance voltage division ratio setting signal Scn. The capacitances of the capacitors are controlled in accordance with output signals B0, B1, ..., B(n-1) of the inverters.

For example, when the output of an inverter is at a high level, the capacitor connected to the output terminal of the inverter works as a capacitor connected to the power source line. On the other hand, when the output signal of the inverter is at a low level, the capacitor connected to the output terminal of the capacitor serves as a capacitor connected to the ground line.

When using the variable capacitor 160 as an AC adding means, if Bi=1 when the inverter output is at a high level and Bi=0 when the inverter output is at a low level, the ratio kcj of feeding back a change of the power source voltage to the control voltage and bias voltage is given by the following formula:

$$kcj=(½)\{B0+B1/2^{}1+B2/2^{}2+\ldots+B(n-2)/2^{}(n-2)+B(n-1)/2^{}(n-2)\} \quad (121)$$

Namely, kcj is variable from 0 to 1 by increments of ½**(n−1).

Figure 27:
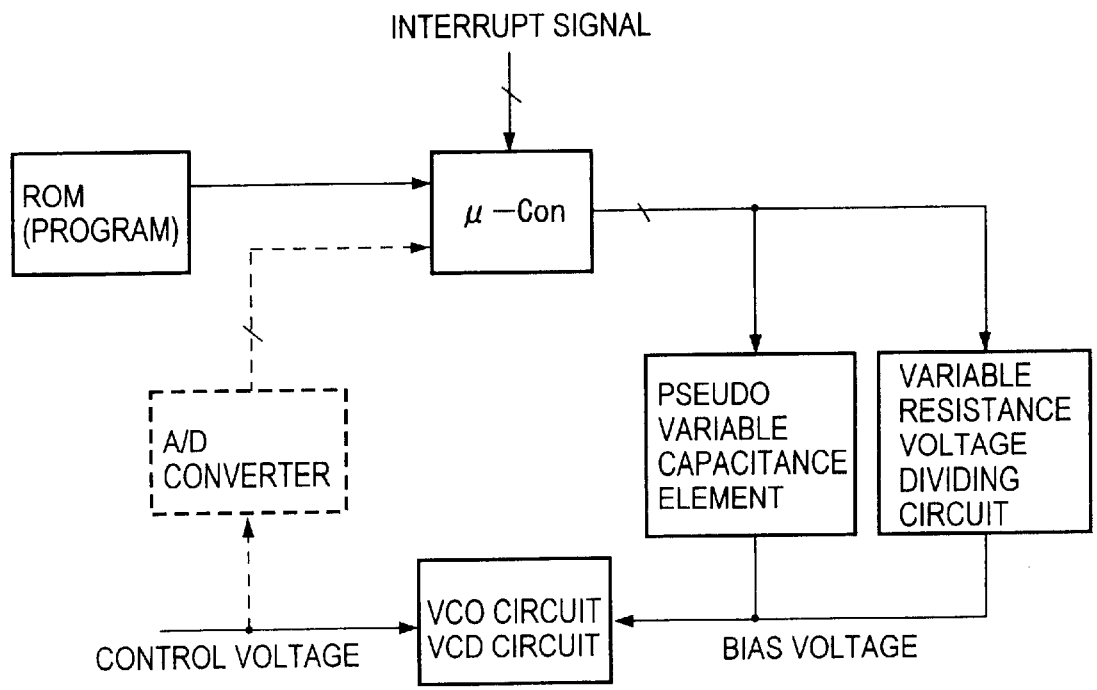
FIG. 27 is a circuit diagram of an example of a circuit of a pseudo variable capacitor.

FIG. 27 is an example of a control circuit for attaining pseudo variable characteristics. For example, when an interruption signal is generated and the mode is changed, a program for initialization for each mode gives the pseudo capacitor or variable resistance voltage division circuit optimal settings for the mode in a state of a standard power source voltage, temperature, or process variations. Since the actual conditions are different and the control voltage changes, preferably the control voltage is sometimes monitored by an AD converter and the circuits are reset and feedback is given to reduce the effect of power source noise.

By such control, a state where the effect of power source noise is reduced can be maintained even if the control voltage changes.

The size of the circuit of the control system is very large, but there is almost no increase of hardware in the case of mounting a PLL circuit for generating a dot clock on a microcomputer or other semiconductor chip. Almost everything can be realized by an improvement of the software (program). Therefore, a delay circuit, a voltage-controlled delay circuit, or a voltage-controlled oscillation circuit capable of suppressing an increase of the cost to a minimum and reducing an effect of power source noise can be realized.

Note that while not illustrated, the effect of reducing the effect of the power source noise of the present invention can be obtained even in embodiments wherein the delay stages shown in FIG. 3, FIG. 9, FIG. 15, FIG. 16, FIG. 17, FIG. 24, and FIG. 25 are replaced with delay stages having the differential configuration as shown in FIG. 19.

Sixth Embodiment

In a sixth embodiment of the present invention, by configuring a composite delay circuit by a combination of two or more types of groups of delay stages having power source voltage dependencies of opposite delay times, a delay circuit, voltage-controlled delay circuit, and voltage-controlled oscillation circuit having a delay time of the overall delay circuit reduced in dependency on a power source voltage can be provided.

Figure 28:
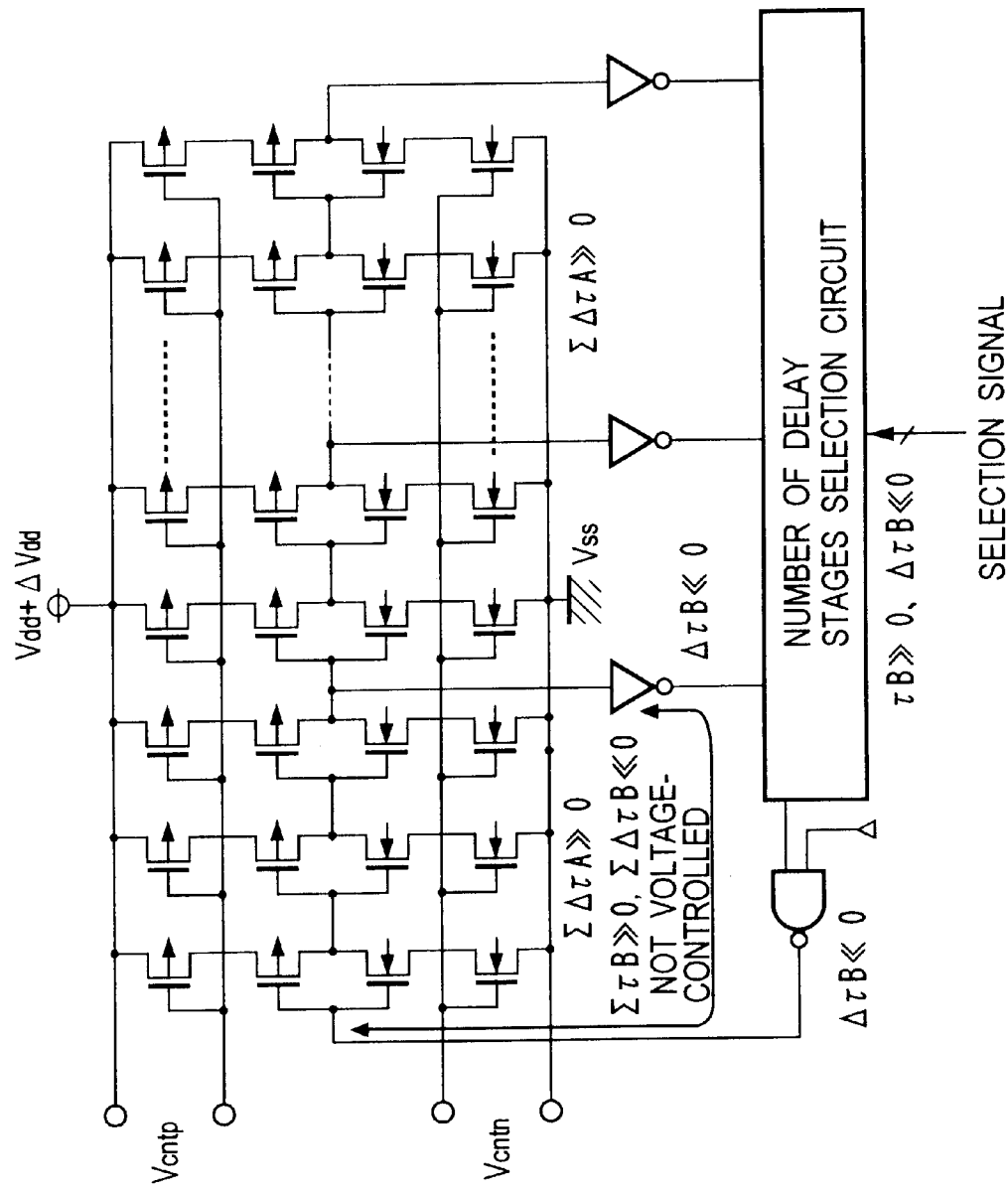
FIG. 28 is a circuit diagram of an example of the configuration of a general voltage-controlled oscillation circuit.

FIG. 28 is a circuit diagram of an example of a voltage-controlled oscillation circuit using a conventional inverter type delay stage. As shown in the figure, in a VCD and VCO using inverter type delay stages, an inverter serving as a buffer or a NAND gate or NOR gate or a transmission gate serving as a logic gate are often incorporated in at least one or two locations of the delay circuit so as to take out an output signal, to stop a circuit at the time of stand-by, to take out a plurality of phase-shifted signals, and to make the number of the delay stages variable for giving general-purpose usage.

Since the buffer and logic gate as above do not receive as input a control signal and bias signal, they are affected by power source noise. Therefore, a change of the delay time ends up occurring when there is power source noise in this part.

If the power source voltage is Vdd and a threshold of the MOS transistor is Vtht, a delay time $\tau_B$ of the buffer and a logical gate part is generally found by the following formula:

$$\tau_B\ Vdd/(Vdd-Vtht)^{**}2 \quad (122)$$

If the control voltage is Vcnt, a delay time $\tau_A$ of delay stages of a current source type wherein current source transistors are provided on both of the power source line side and the ground line side is generally found by the following formula:

$$\tau_A\ Vdd/(Vcnt-Vtht)^{**}2 \quad (123)$$

Also, if the control voltage is Vsht, a delay time $\tau_S$ of shunt type delay stages is generally found by the following formula:

$$\tau_S\ Vsht-Vtht(VSB)\}/(Vdd-Vtht)^{**}2 \quad (124)$$

Accordingly, the delay time of the buffer and logical gate is inversely proportional to the power source voltage. As the power source voltage becomes higher, the delay time becomes smaller. Conversely, the delay time of a current source type delay stage is proportional to the power source voltage. As the power source voltage becomes higher, the delay time becomes larger. The delay time of a shunt type delay stage is inversely proportional to a square of the power source voltage. As the power source voltage becomes higher, the delay time becomes smaller.

First Circuit Example

Figure 29:
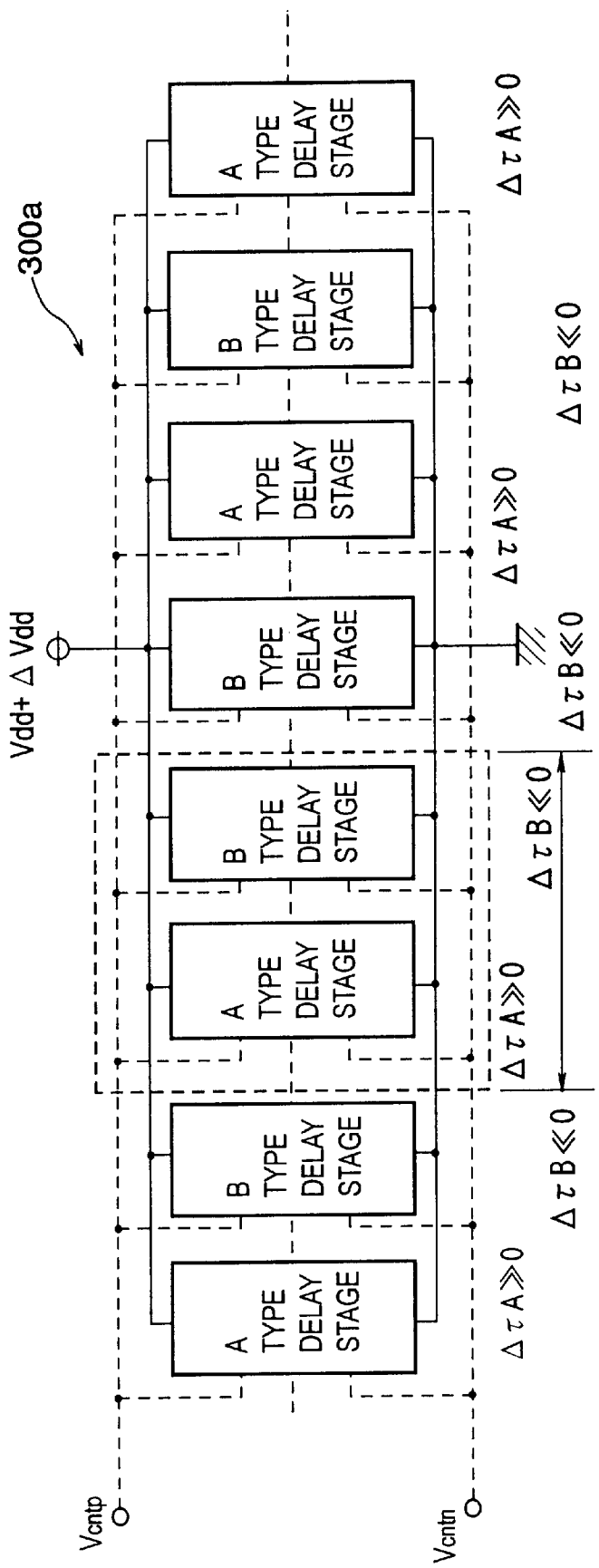
FIG. 29 is a circuit diagram of a first circuit example of a sixth embodiment of the present invention.

FIG. 29 is a circuit diagram of a first circuit example of a delay unit in a delay circuit of the present embodiment. As shown in the figure, the delay unit 300a is configured of two types of delay stages having different power source voltage dependencies, that is, A-type delay stages and B-type delay stages, adjacent to each other.

Figure 30B:
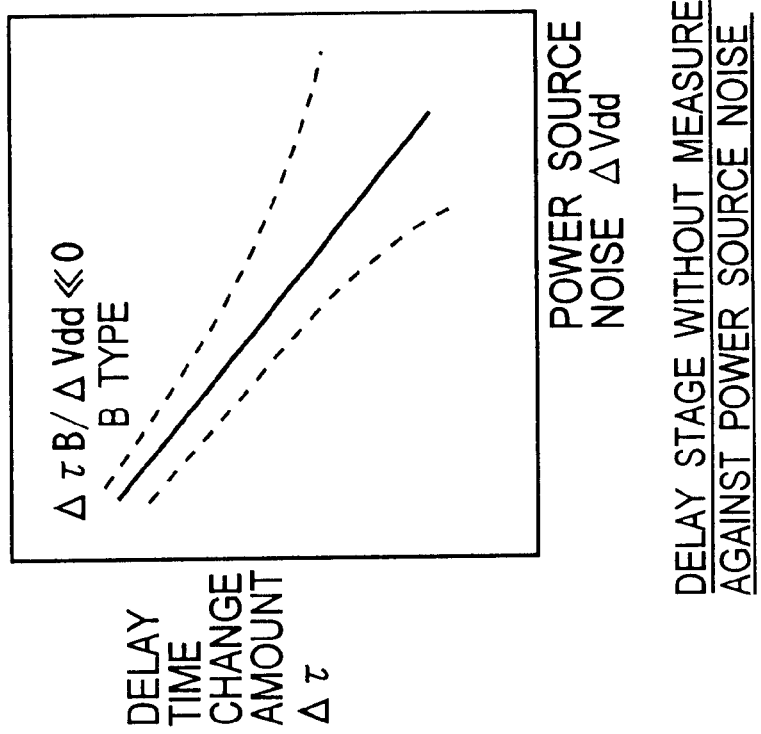
FIGS. 30A and 30B are views showing a principle of the first circuit example of the sixth embodiment of the present invention.
Figure 30A:
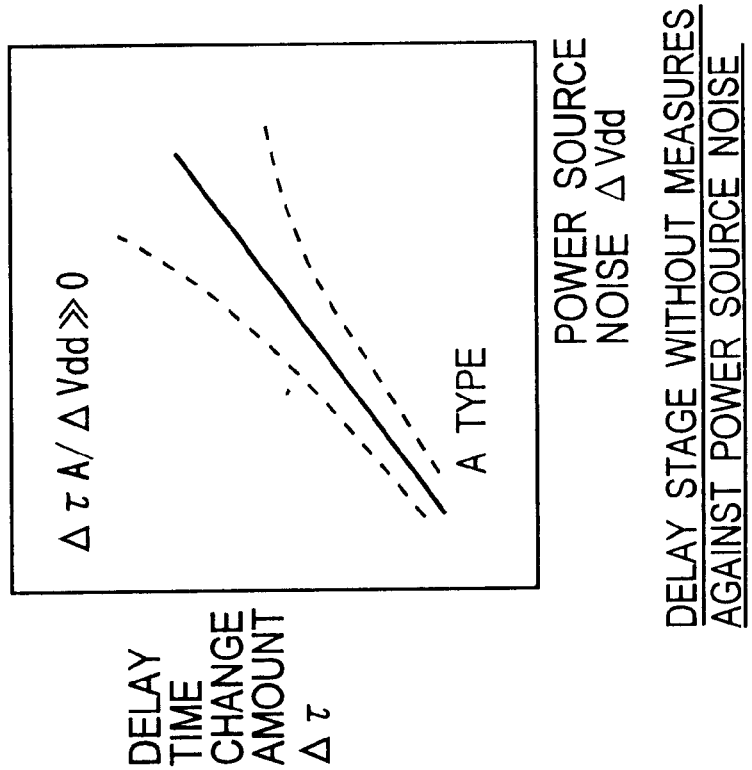

FIGS. 30A and 30B are graphs of delay characteristics of the A-type delay stages and B-type delay stages. FIG. 30A shows delay characteristics of the A-type delay stages, and FIG. 30B shows delay characteristics of the B-type delay stages.

Note that here, each A-type delay stage is for example comprised of an inverter type delay stage provided with a current source transistor on the power source line side or a ground line side, while each B-type delay stage is for example comprised of a shunt type delay stage, a buffer, a logic gate, etc.

As shown in FIG. 30A, an A-type delay stage exhibits characteristics of a positive change $\Delta\tau_A$ of a delay time with respect to a change $\Delta V_{dd}$ of the power source voltage. Namely, along with an increase of the power source voltage $V_{dd}$, the delay time $\tau_A$ increases, conversely, when the power source voltage $V_{dd}$ falls, the delay time $\tau_A$ decreases. On the other hand, as shown in FIG. 30B, a B-type delay stage exhibits characteristics of a negative change $\Delta\tau_B$ of a delay time with respect to a change $\Delta V_{dd}$ of the power source voltage. Namely, along with an increase of the power source voltage $V_{dd}$, the delay time $\tau_A$ decreases, while when the power source voltage $V_{dd}$ falls, the delay time $\tau_A$ increases.

By combining two types of delay stages having opposite delay characteristics as above, when a power source voltage $V_{dd}$ changes in the configured delay unit 300*a*, changes of the delay times of adjacent A-type delay stages and B-type delay stages cancel each other out, so a change of the delay time of the overall delay unit can be suppressed. Particularly, by adjusting the delay characteristics of the A-type delay stages and the B-type delay stages and by designing the total of changes of delay times of the delay stages to satisfy $(\Sigma\tau_A+\Sigma\tau_B\approx0)$ with respect to the amount of change $\Delta V_{dd}$ of the power source voltage $V_{dd}$, the power source voltage dependency of the delay circuit can be substantially canceled.

Also, according to a delay circuit of the present embodiment, the effect of power source noise on a delay time can be reduced with respect to power source noise having a sufficiently wider width than the delay time of two delay stages or four delay stages.

Second Circuit Example

Figure 31:
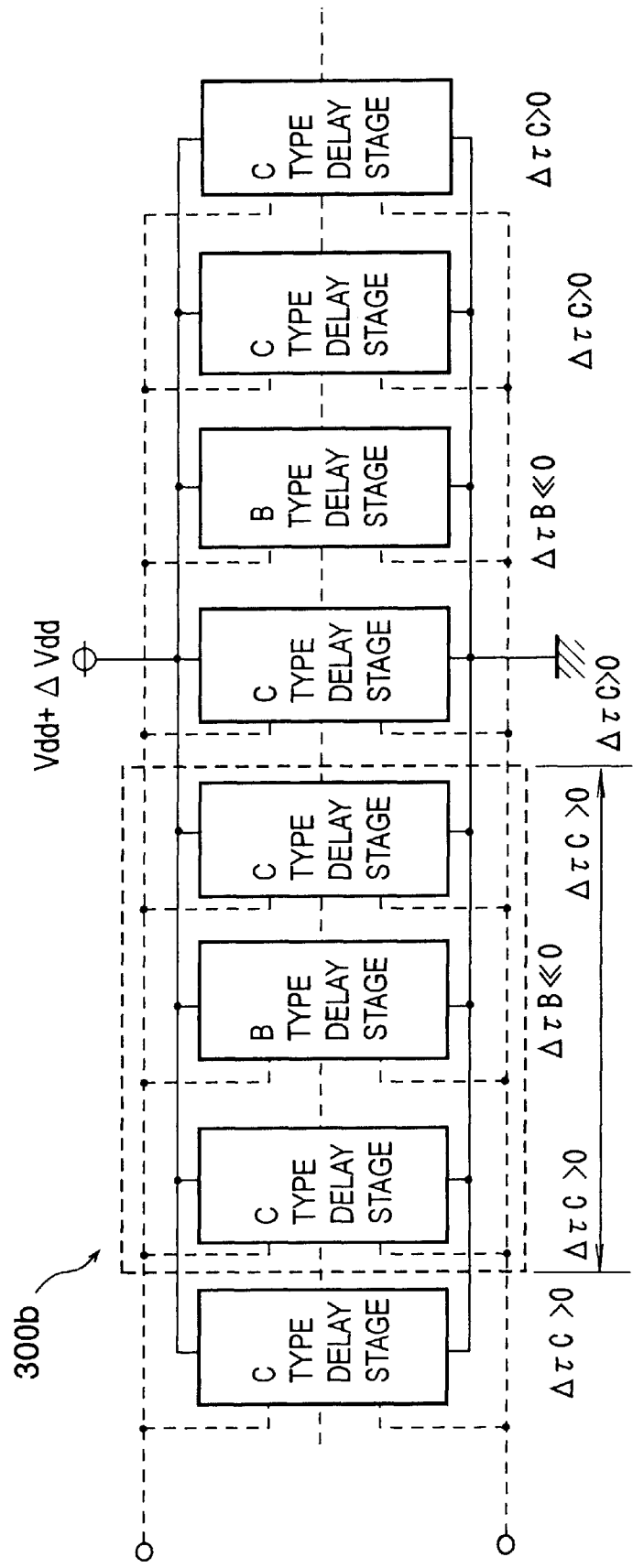
FIG. 31 is a circuit diagram of an example of a second example of the sixth embodiment of the present invention.

FIG. 31 is a circuit diagram of a second circuit example of the delay unit of a delay circuit of the present embodiment. As shown in the figure, the delay unit 300*b* is comprised using predetermined numbers of two types of delay stages having different power source voltage dependencies, that is, C-type delay stages and B-type delay stages. For example, as shown in the figure, in the delay unit 300*b*, one B-type delay stage is connected after two C-type delay stages.

Figure 32A:
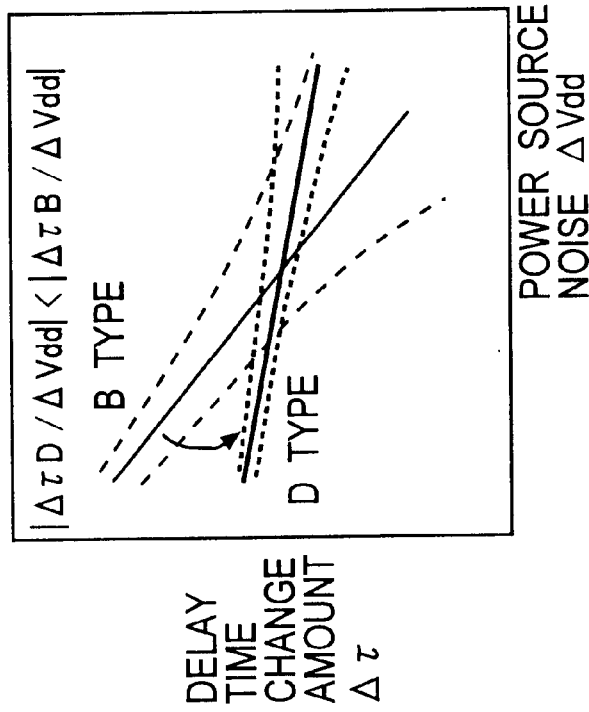
FIGS. 32A and 32B are views showing a principle of the second circuit example of the sixth embodiment of the present invention.
Figure 32B:
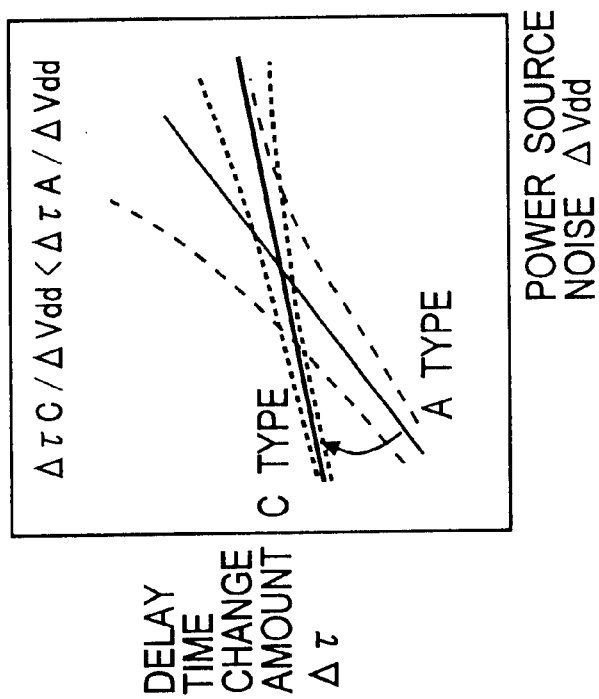

FIGS. 32A and 32B show the delay characteristics of a C-type delay stage. As shown in FIG. 32A, a C-type delay stage exhibits characteristics of a positive change $\Delta\tau_C$ of the delay time with respect to a change $\Delta V_{dd}$ of the power source voltage. Namely, along with an increase of the power source voltage $V_{dd}$, the delay time $\tau_A$ increases. Conversely, as the power source voltage $V_{dd}$ declines, the delay time $\tau_A$ becomes smaller.

Namely, a C-type delay stage exhibits positive characteristics in the same way as in an A-type delay stage. Note that the amount of change $\Delta\tau_C$ of the delay time of a C-type delay stage with respect to the amount of change $\Delta V_{dd}$ of the power source voltage $V_{dd}$ is smaller than the amount of change of the delay time of an A-type delay stage. Namely, $(\Delta\tau_C/\Delta V_{dd}<\Delta\tau_A\Delta V_{dd})$.

A C-type delay stage has countermeasures taken against power source noise in as an A-type delay stages, but is formed so that the effect of the power source noise partially remains.

Note that the delay characteristic of a B-type delay stage has, as shown in FIG. 32B, a negative delay characteristic. Also, here, a B-type delay stage is comprised for example of a shunt type delay stage, buffer, or logic gate.

As explained above, a C-type delay stage has a slight power source voltage dependency as a result of countermeasure against the power source noise. On the other hand, a B-type delay stages does not have any countermeasure against the power source noise and has a large power source dependency. Therefore, as shown in FIG. 31, more C-type delay stages are provided than B-type delay stages in the delay unit 300*a* of the present invention to suppress the power source voltage dependency of the overall delay unit. For example, by setting the numbers of C-type delay stages and B-type delay stages constituting the delay unit 300*a* so as to for example satisfy $(\Sigma\tau_C+\Sigma\tau_B\approx0)$, the power source voltage dependency of the C-type delay stages and the power source dependency of the B-type delay stages cancel each other out and the power source voltage dependency of the delay unit 300*a* can be substantially eliminated.

Also, according to the delay circuit of the present embodiment, the effect of the power source noise on the delay time can be reduced for power source noise having a sufficiently wider width than the delay time of about three delay stages.

Note that the delay circuit of the present embodiment is not limited to the configuration shown in FIG. 31. For example, it may be configured by a suitable ratio of A-type delay stages and D-type delay stages having the delay characteristics shown in FIG. 32A and 32B.

Third Circuit Example

Figure 33:
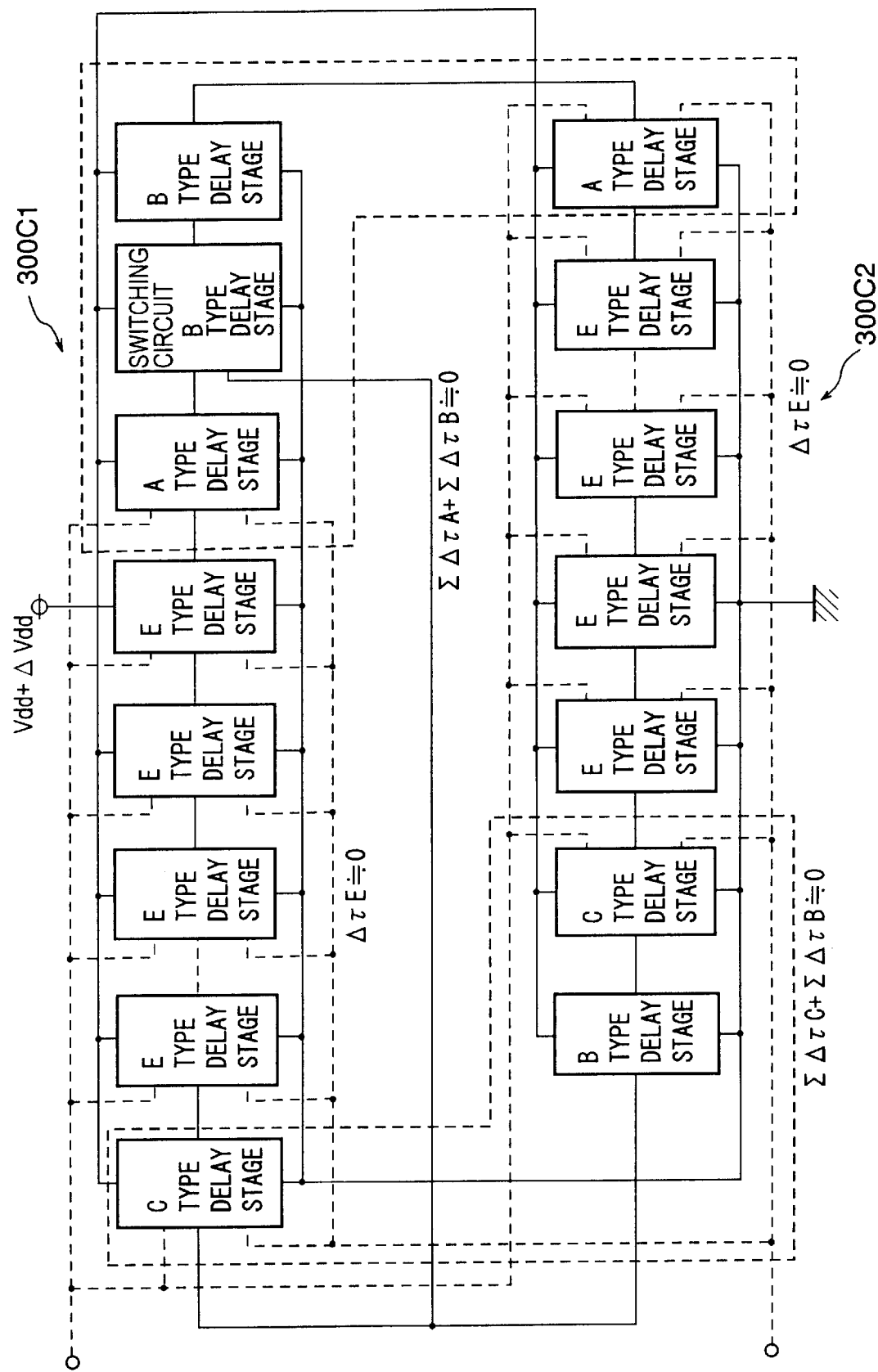
FIG. 33 is a circuit diagram of a third circuit example of the sixth embodiment of the present invention.
Figure 34B:
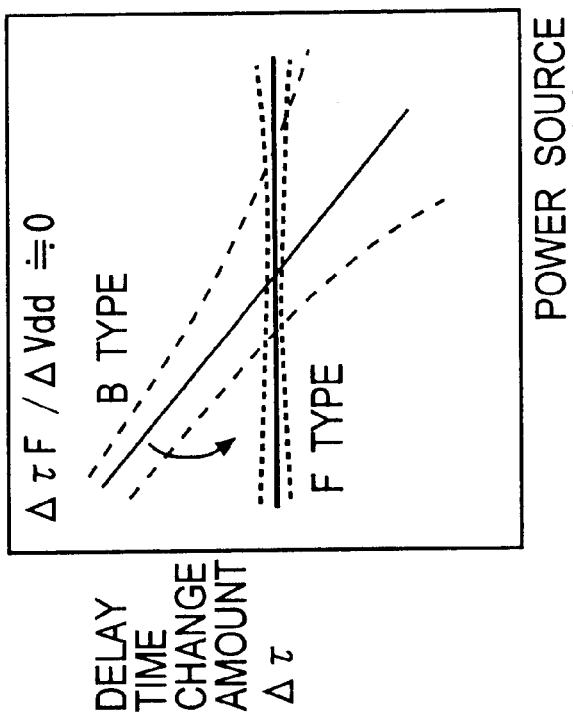
FIGS. 34A and 34B are views showing a principle of the third circuit example of the sixth embodiment of the present invention.
Figure 34A:
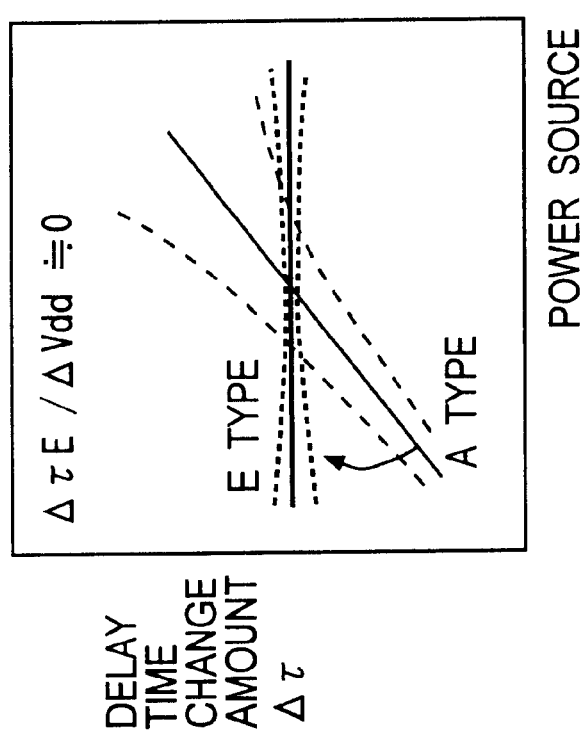

FIG. 33 is a circuit diagram of a third circuit example of a delay unit in a delay circuit of the present embodiment. As shown in the figure, the delay unit 300*c* is comprised of a plurality of types of delay stages having different power source voltage dependencies, for example configured by using predetermined numbers of the A-type delay stages, B-type delay stages, C-type delay stages, and E-type delay stages.

For example, as shown in the figure, the delay unit 300*c* is provided with E-type delay stages where measures are taken to reduce the effect of the power source noise and B-type delay stages comprised of buffers and logic gates affected by the power source noise other than the A-type delay stages for inputting a control voltage or a bias voltage.

In an actual inverter type delay circuit, buffers for taking out output signals of the delay stages in the middle or buffers, logic gates, or transmission gates serving as a switching circuit for making the number of delay stages variable are incorporated at various places. The buffers and logic gates may be considered as B-type delay stages, but B-type delay stages are provided especially as portions of the switching circuit for making the number of delay stages variable.

As a result, for delay stages around which there is no buffer or logic gate, an E-type or F-type delay stage for which measures are taken to reduce the effect of the power source noise are provided.

Also, to cancel out the characteristics of the concentrated B-type delay stages before and after the circuit for switching the number of delay stages, where there is a high concentration of buffer or logic gate B-type delay stages, A-type delay stages or C-type delay stages similar to the A-type are provided so as to obtain the smallest effect of the power source noise on the delay time of a composite delay circuit 300*c*1 having A-type delay stages and B-type delay stages or having C-type delay stages and B-type delay stages.

The delay stages present relatively isolatedly in the front of and behind a B-type delay stage comprised of a buffer or a logical gate are designed as C-type delay stages so that the effect of the power source noise on the delay time of the composite delay circuit 300*c*2 of the C-type and B-type becomes the smallest.

Due to this variety of innovations, the effect of the power source noise on the delay time can be reduced in an actual inverter type delay circuit, voltage-controlled delay circuit, or voltage-controlled oscillator.

Seventh Embodiment

Figure 35:
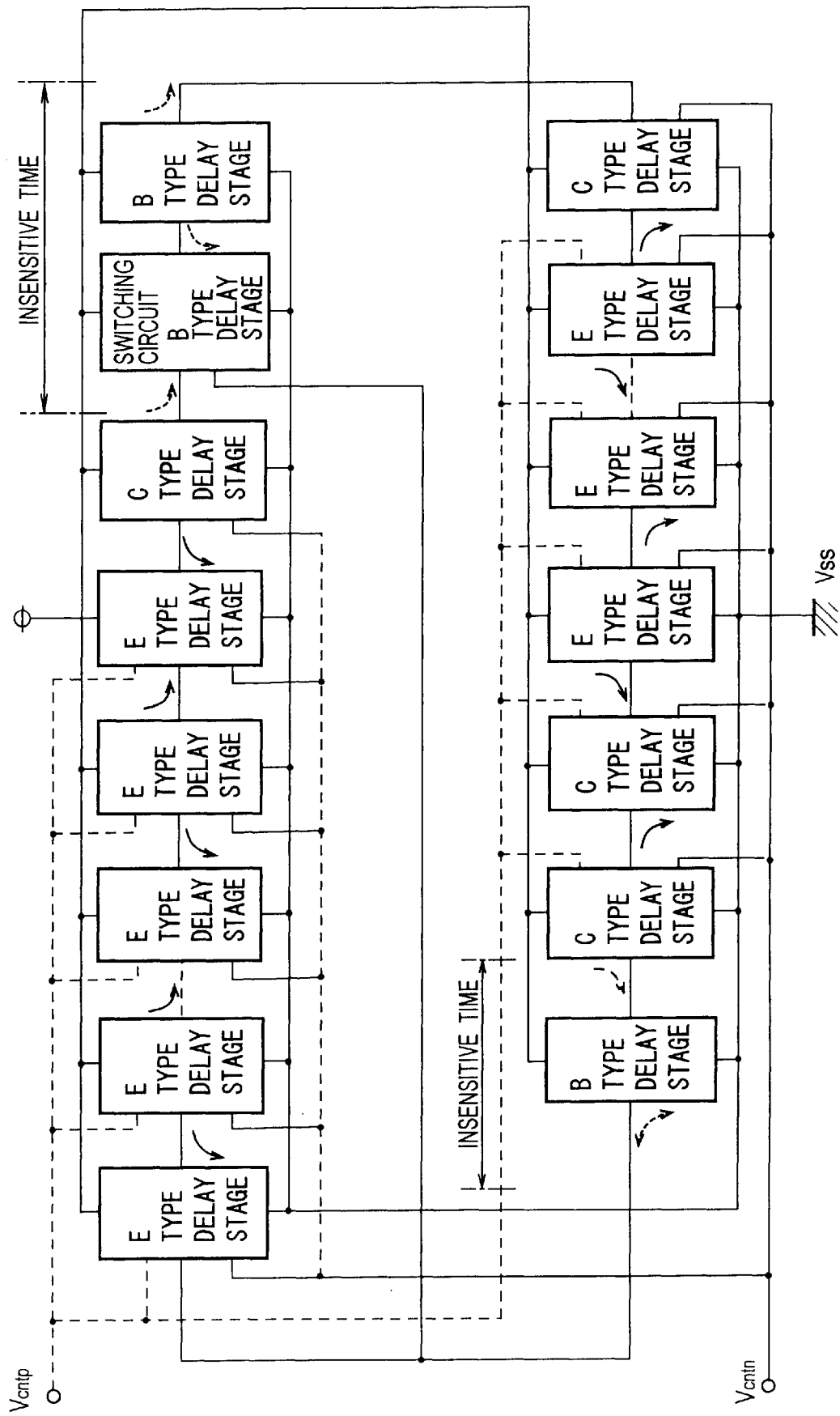
FIG. 35 is a circuit diagram of the configuration of a seventh embodiment of the present invention.

FIG. 35 is a circuit diagram of a seventh embodiment of a voltage-controlled oscillation circuit according to the present invention. As shown in the figure, in the voltage-controlled oscillation circuit of the present embodiment, a ring oscillation circuit is comprised by a plurality of delay stages connected in a ring shape.

In the delay circuit, voltage-controlled delay circuit, or voltage-controlled oscillation circuit, the number of the delay stages is often made variable so as to be enable handling of a wide range of delay times and oscillation frequencies. In this case, buffers, logical gates, or transmission gates not controlled by the control voltage or bias voltage are intensively arranged at and around a switching circuit of the number of stages.

As shown in FIG. 35, in this example, a switching circuit comprised of a B-type delay stage is provided. The B-type delay stage is for example comprised of a buffer or logical gate, performs switching in accordance with a switching control signal input from the outside, and switches an oscillation frequency of the ring oscillation circuit by switching the number of delay stages incorporated in the ring oscillation circuit.

Since the B-type delay stage provided as the switching circuit is not controlled by a control voltage Vcntn or a bias voltage Vcntp, the delay time sometimes changes due to the effect of power source noise. Therefore, to control the power source voltage dependency of the delay time of the overall delay circuit, as shown in FIG. 35, other delay stages having different power source voltage dependencies, for example, C-type delay stages, are provided in front of and behind the B-type delay stages so that changes of delay times of these delay stages when the voltage is changed are canceled out, whereby the dependency on the power source voltage of the delay time of the overall delay circuit can be reduced.

In a circuit portion wherein other delay stages having different power source voltage dependencies are connected in front of and behind B-type delay stages not controlled by the control voltage, there sometimes arises a dead time. Below, a dead time in a PLL circuit using a Lag-Lead filter will be explained with reference to FIGS. 36, 37A to 37E, and 38.

Figure 36:
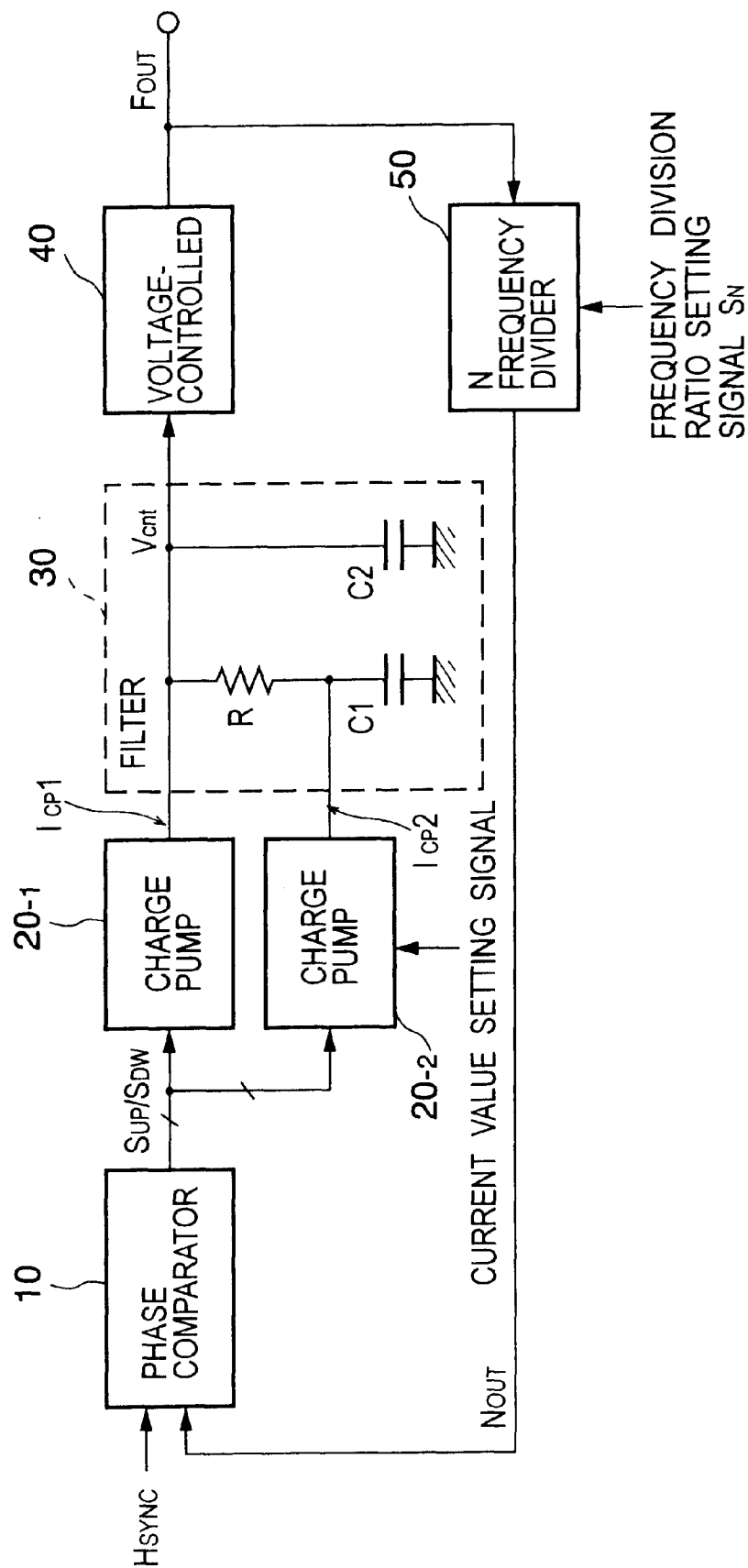
FIG. 36 is a circuit diagram of a circuit example of a PLL circuit using a Lag-Lead filter.
Figure 37:
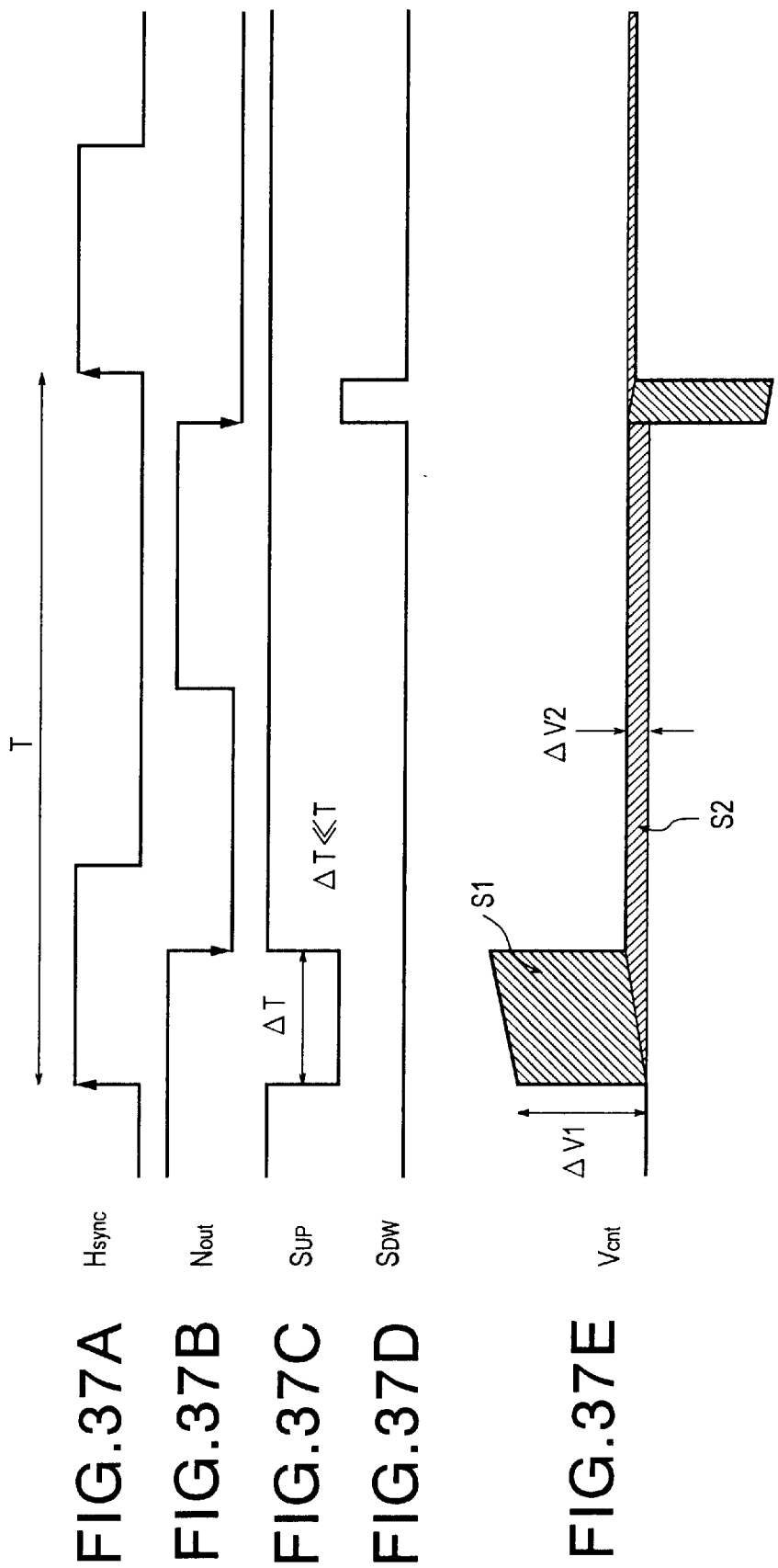
FIGS. 37A to 37E are waveform diagrams of an operation of a Lag-Lead filter.
Figure 38:
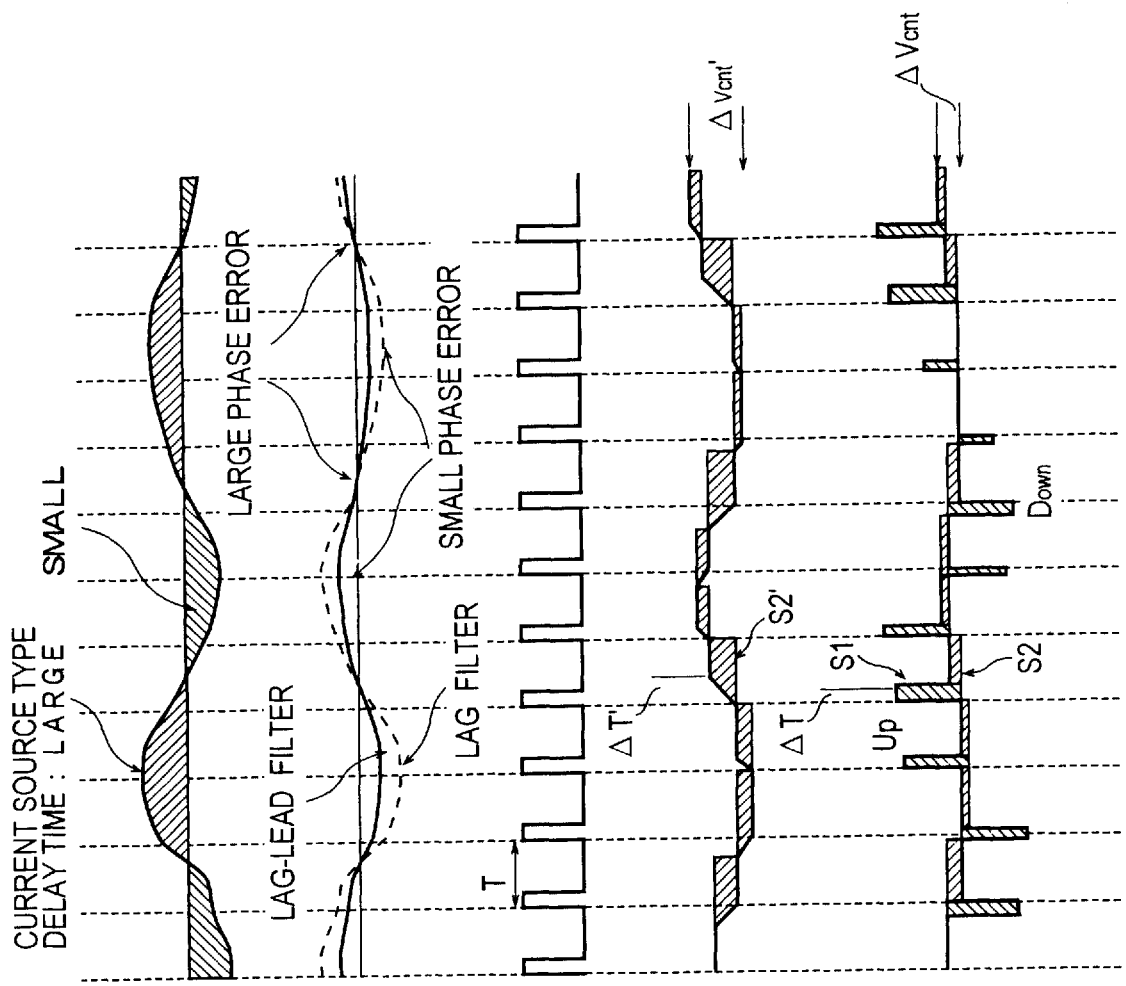
FIGS. 38A to 38E are views of a response waveform of a Lag filter and a Lag-Lead filter with respect to power source noise.

FIG. 36 is a circuit diagram of an example of a PLL circuit for generating a dot clock using a Lag-Lead filter. Note that the dot clock here is for example a clock signal used for displaying letters and other information by superimposition on a normal video screen on a TV monitor. The clock signal needs to be synchronized with a horizontal synchronization signal for displaying a video signal, so it is normally generated by a PLL circuit using the horizontal synchronization signal as a reference clock.

The PLL circuit shown in FIG. 36 is comprised of a phase comparator 10, charge pump circuits 20-1 and 20-2, a filter 30, a voltage-controlled oscillator (VCO) 40, and a frequency divider 50.

The frequency divider 50 performs frequency division on a clock $F_{out}$ generated by the VCO 40 by a frequency dividing ratio N set in accordance with a frequency dividing ratio setting signal $S_N$ and outputs a frequency dividing signal $N_{out}$.

The phase comparator 10 compares phases of a horizontal synchronization signal Hsync serving as a reference clock signal with the frequency dividing signal $N_{out}$ and outputs an up signal $S_{up}$ or a down signal $S_{DW}$ in accordance with a phase difference of the signals.

The charge pump circuits 20-1 and 20-2 generate currents Icp1 and Icp2 in accordance with the up signal $S_{UP}$ or the down signal $S_{DW}$ output from the phase comparator 10 and supply the same to the filter 30.

The filter 30 is comprised of a Lag-Lead filter as shown in the figure. The capacitance value of a capacitor C1 is sufficiently larger than that of a capacitor C2, that is, C1>>C2. The capacitor C1 is for example attached outside.

A control signal Vcnt is generated by the filter 30 in accordance with output currents of the charge pump circuits 20-1 and 20-2.

The VCO 40 oscillates at an oscillation frequency controlled by the control signal Vcnt and outputs an oscillation signal $F_{out}$.

Note that, while not illustrated, the dot clock signal is generated by the frequency divider which receives the output signal Fout of the PLL circuit, synchronizes the same with a falling edge of the horizontal synchronization signal Hsync, and then starts frequency division.

FIGS. 38A to 38E are waveform diagrams of a signal waveform of the Lag-Lead filter during operation. The difference between a rising edge of the horizontal synchronization signal Hsync serving as a reference clock signal and a falling edge of the output signal Nout of the frequency divider is detected by the phase comparator, and an up signal $S_{up}$ or a down signal $S_{DW}$ for driving the charge pump circuits is generated. When the falling edge of the frequency dividing signal Nout is delayed from the rising edge of the horizontal synchronization signal Hsync, an up signal $S_{UP}$ is generated, while when the rising edge of the horizontal synchronization signal Hsync is delayed from the falling edge of the frequency dividing signal Nout, a down signal $S_{DW}$ is generated. When the two come at the same time, neither of the signals is generated.

Here, a cycle of the horizontal synchronization signal Hsync is designated as T, and a width (jitter of the PLL) of the up signal $S_{UP}$ or the down signal $S_{DW}$ is designated as ΔT. The output voltage Vcnt of the Lag-Lead filter includes a voltage change S1 generated in a resistor R and a voltage change S2 generated in the capacitor C1.

The voltage change S1 generated in the resistor R is a change of a pulse signal S1=V1×ΔT wherein a voltage change of ΔV1=Icp1×R is generated by a current Icp1 flowing in the resistance R during the period of ΔT when the up signal $S_{UP}$ or down signal $S_{DW}$ is generated.

A voltage change S2 generated in the capacitor C1 is a change of S2≈V2×T extending elongated along with a time axis wherein a voltage change of ΔV2≈(Icp1+Icp2)S2 ≈V2× ΔT/(C1+C2)caused by charge of an amount of the flow of current (Icp1+Icp2) remaining in the capacitor of (C1+C2) ≈C1 exactly for a time of ΔT even after the end of the up signal $S_{UP}$ or the down signal $S_{DW}$ continues for a period of(T±α)≈T.

In the Lag-Lead filter 30, phase pull-in is performed by a change of angular speed ( change of frequency  change of control voltage)×time, is performed by a sum of S1 and S2, but frequency pull-in is performed by a change of frequency ( change of control voltage), so S1, where the voltage change returns to the original state, becomes irrelevant. The pull-in is performed only by the S2 which does not return to the original state.

Accordingly, (S1+S2)/S2  phase correction amount/ frequency correction amount. A stable operation of the PLL circuit can be obtained by setting the ratio of S1 and S2 constant even when the frequency of the horizontal synchronization signal Hsync changes.

Namely, in the PLL circuit shown in FIG. 36, even if the capacitance value of the external capacitance C1 is fixed, by setting the frequency division ratio N of the frequency divider to be proportional to the cycle T of the horizontal synchronization signal Hsync, making the output current Icp1 of the charge pump 20-1 fixed, and setting a sum of the output current value of the charge pump circuits 20-1 and 20-2 (Icp1+Icp2) to be inversely proportional to the cycle T of the horizontal synchronization signal Hsync, the ratio of (S1+S2)/ΔT　phase pull-in amount/phase offset amount (=at what ratio correction is made for one time) and the ratio of (S1+S2)/S2　phase pull-in amount/frequency pull-in amount become constant, and stable characteristics can be obtained. Also, the VCO 40 may operate at an almost constant frequency.

When mounted on a large scale integrated circuit, since the voltage of ΔV1 cannot be made larger than several hundred mV, the only available choice is whether to make the voltage a fixed voltage or a voltage variable by 2 or 3 times. Accordingly, when making Icp1 a fixed current value and enabling rough lock detection and fine lock detection, S2, that is, Icp2, becomes relevant to the frequency pull-in and (S1+S2), that is, (Icp1+Icp2), becomes relevant to the phase pull-in, so if the frequency of the horizontal synchronization signal Hsync changes and becomes offset from the rough lock detection standard, Icp2 is increased to make S2>S1 and thereby shorten the frequency pull-in time.

When the rough lock detection standard is satisfied, Icp2 is decreased to make S2≈S1 and perform phase pull-in. When the fine lock detection standard is also satisfied, the frequency requires almost no correction, thus Icp2 is further decreased to make S2<S1 and reduce excessive frequency correction due to a delay of a feedback loop of the PLL circuit.

FIGS. 38A to 38E compare response waveforms of a Lag filter and a Lag-Lead filter with respect to digital power source noise. In the Lag filter, there is no portion corresponding to S1. There is only S2' corresponding to S2.

When considering phase pull-in amounts of the Lag filter and the Lag-Lead filter to be the same (S1+S2=S2'), ΔT'=2ΔT stands when Icp1+Icp2=Icp2', that is, the Lag-Lead filter comes to have an amount of jitter of half that of the Lag filter. Also, ΔT'=ΔT stands when 2×(Icp1+Icp2)=Icp2', but 2ΔVcnt=Δvcnt', that is, the change of the control voltage becomes twice as much in the Lag filter. Namely, since there is no portion corresponding to S1 in the Lag filter, a large amount of the effect of digital power source noise remains as the inherently not desirable change of the control voltage, consequently the amount of jitter becomes large.

Since the S1 portion is originally generated as an up signal $S_{UP}$ or a down signal $S_{DW}$ of the phase comparator, there is the problem of a dead band of the phase comparator. Accordingly, even if an output of the phase comparator has a pulse width of less than a target value of jitter, when it has almost the same pulse width as that at the first or a little broader pulse width than that at the time it reaches the VCO circuit or a VCD circuit via the charge pump circuit, loop filter, bias circuit, etc., the effectiveness of the S1 portion cannot be obtained, the area of S2 becomes small, and the jitter becomes large.

From the above explanation, the S1 portion in the Lag-Lead filter is effective against digital power source noise.

The VCO circuit and VCD circuit receiving the S1 portion also have the same problem of a dead band as a phase comparator.

Figure 39:
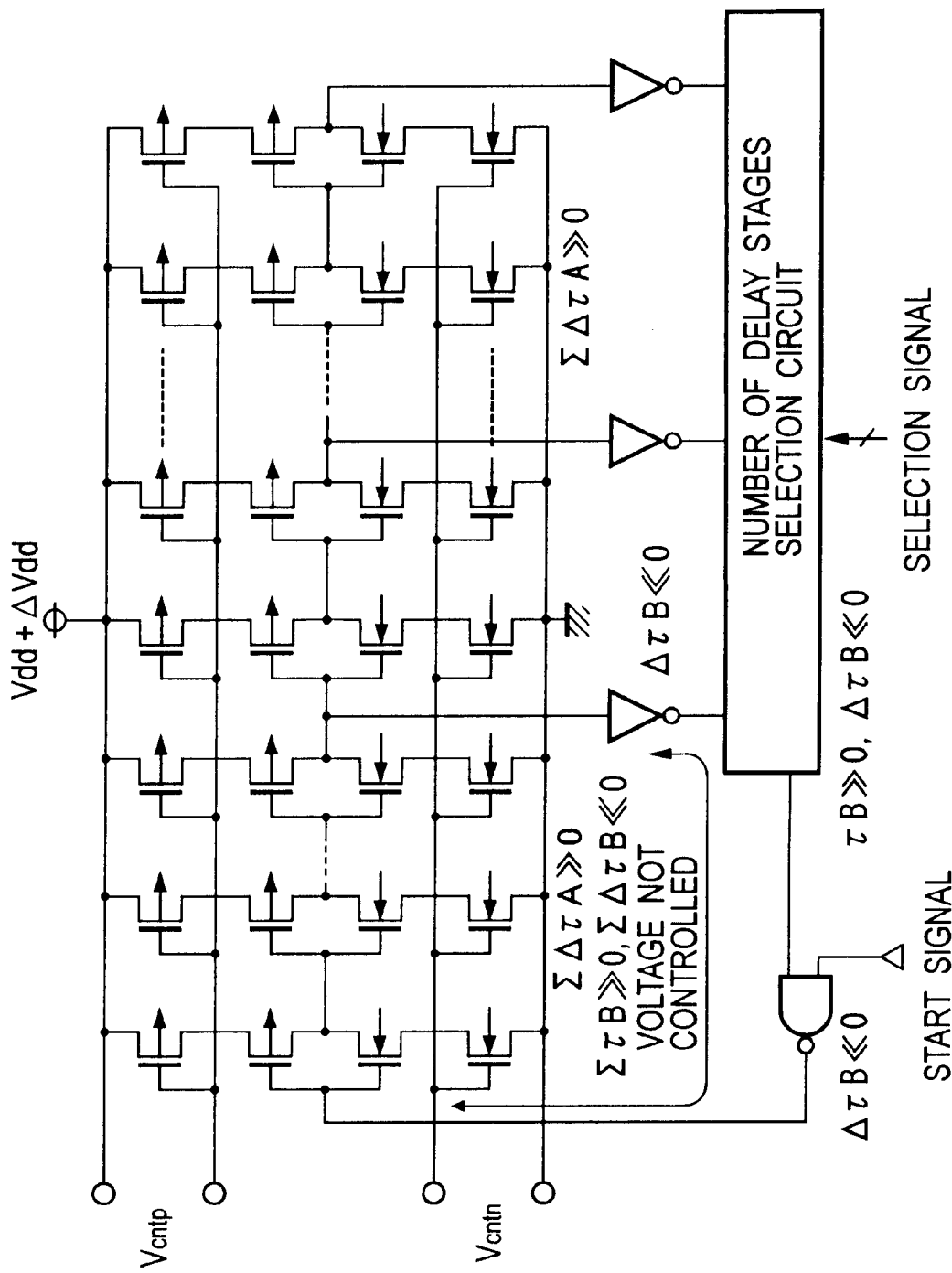
FIG. 39 is a circuit diagram of a circuit example of a general inverter type voltage-controlled oscillation circuit.

FIG. 39 shows an example of a circuit of a general inverter type voltage-controlled oscillator. Conventionally, the number of delay stages has often been made variable to enable handling of a wide range of oscillation frequency etc. In this case, buffers, transmission gates, and logical gates which are not controlled by the control voltage and bias voltage are clustered at and around the stage number switching circuit. When coincidentally designed so that a change of the S1 portion unfortunately arises while a portion not related with the control voltage and bias voltage is in operation, it is considered that an effect of phase pull-in of the S1 portion is not obtained and jitter becomes large when a width of the S1 portion is small.

In the voltage control generation circuit of the present embodiment shown in FIG. 35, a dead time of a voltage-controlled oscillator and a voltage-controlled delay circuit necessary for effectively drawing out the effect of a method of reducing an effect of power source noise of the present invention is shown. For the portion where buffers, transmission gates, and logical gates which are not controlled by the control voltage and bias voltage are arranged, it is necessary that their continuous delay time be designed to be sufficiently smaller than the target value of the amount of jitter. As a result, for example by configuring the PLL circuit shown in FIG. 36 by using this voltage-controlled oscillation circuit, the dependency of the power source voltage can be reduced, an oscillation signal having a stable oscillation frequency can be obtained, and a stabilized dot clock signal can be provided.

Eighth Embodiment

In the present embodiment, examples of application of the delay circuit, voltage-controlled delay circuit, or voltage-controlled oscillation circuit of the present invention will be described.

First Example of Application

Figure 40:
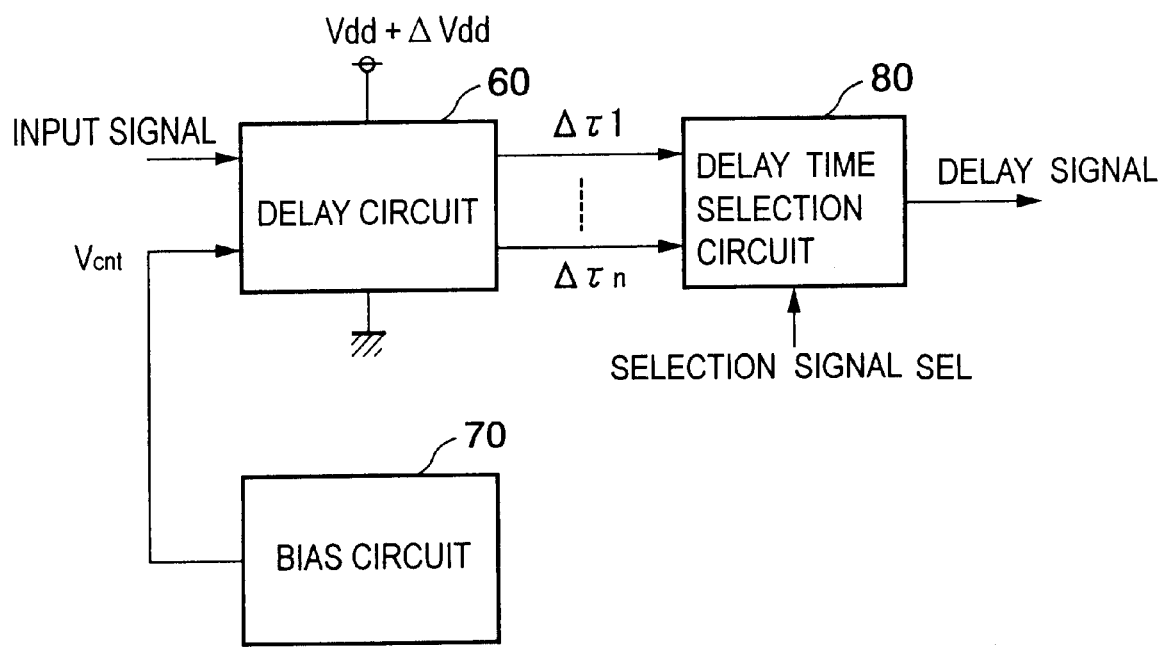
FIG. 40 is a circuit diagram of the configuration of a delay time adjustment circuit as a first example of application of the present invention.

FIG. 40 is a circuit diagram of an example of application of the delay circuit of the present invention.

This example of application is of a delay time adjustment circuit using the delay circuit of the present invention. As shown in the figure, the delay time adjustment circuit is comprised of a delay circuit 60, a bias circuit 70, and a delay time selection circuit 80.

The delay time adjustment circuit is a circuit used for adjusting timing when the timings of a data signal and a clock signal become off in a semiconductor chip. Output buffers connected to output pins of the semiconductor chip generate large power source noise during operation because they drive large load capacitances. The amount of adjustment of timing of the delay time adjustment circuit sometimes becomes erroneous due to such power source noise. If applying the present invention, it is possible to reduce the error of the amount of adjustment caused by the power source noise.

The delay circuit 60 is for example the above delay circuit of the present invention and is comprised of a plurality of inverter type delay stages having measures taken against the power source noise. A delay signal obtained by delaying an input signal $S_{in}$ by a predetermined delay time is output. Note that the delay circuit 60 outputs for example a plurality of delay signals obtained by giving different delay times $\Delta\Sigma_1, \ldots \Delta\tau_n$ to the input signal $S_{in}$.

The bias circuit 70 generates a bias voltage Vcnt and supplies the same to the delay stages of the delay circuit 60. Furthermore, the bias circuit 70 controls a level of the bias voltage Vcnt in accordance with a change $\Delta V_{dd}$ of the power source voltage $V_{dd}$ so that delay times of the delay stages become almost constant. As a result, the dependencies on the power source voltage of the delay times $\Delta\tau_1, \ldots, \Delta\tau_n$ of the delay circuit 60 are reduced.

The delay time selection circuit 80 selects a predetermined delay signal from a plurality of delay signals output from the delay circuit 60 in accordance with a selection signal SEL input from the outside and outputs the same.

As explained above, according to the delay time adjustment circuit, the effect due to a change of the power source voltage $V_{dd}$ can be suppressed and a stable delay time can be obtained, so error in the amount of delay time adjustment caused by power source noise can be reduced.

Second Example of Application

Figure 41:
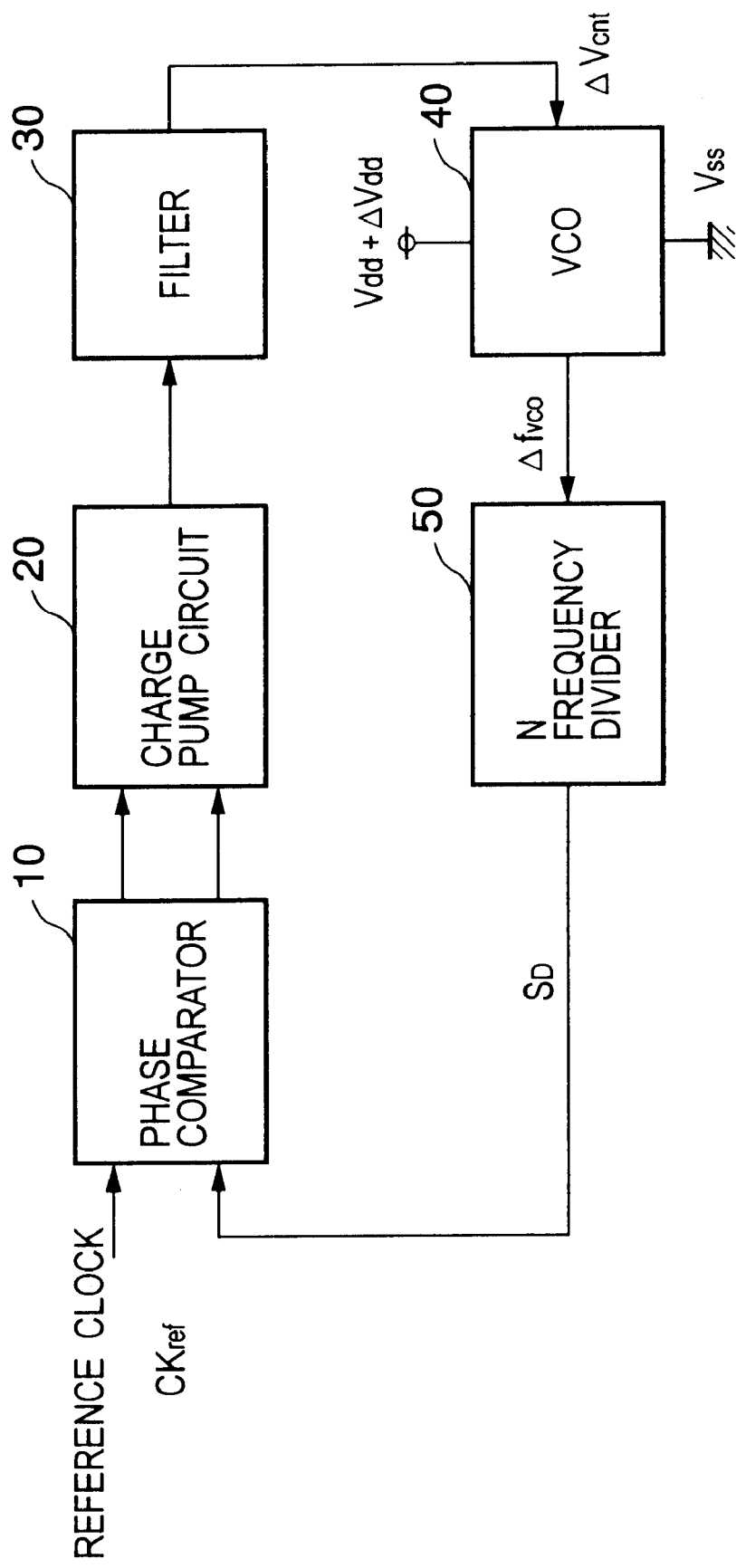
FIG. 41 is a circuit diagram of the configuration of a PLL circuit as a second example of application of the present invention.

FIG. 41 is a circuit diagram of an example of application of the voltage-controlled oscillation circuit (VCO) of the present invention and shows a PLL circuit configured by using the VCO of the present example.

As shown in the figure, the PLL circuit of the present example is comprised of a phase comparator 10, a charge pump circuit 20, a filter 30, a VCO 40, and a frequency divider 50.

Note that, as shown in FIG. 41, the PLL circuit of the present example of application has almost the same configuration as a conventional PLL circuit. Note that even when the phase comparator 10, charge pump circuit 20, or the filter 30 is as same as a conventional type, it is possible to obtain an effect of remarkably reducing jitter caused by the power source voltage after pull-in by the PLL circuit by using the VCO of the present invention.

Note that since the effect of the present invention is obtained when a variety of conditions are attained well, the invention is not suited well for a voltage-controlled delay circuit or voltage-controlled oscillator used in a wide range of control voltage or a wide range of oscillation frequency. Also, since the basic form is an inverter type, it can be used in applications of up to several hundred MHZ.

Third Example of of Application

Figure 42:
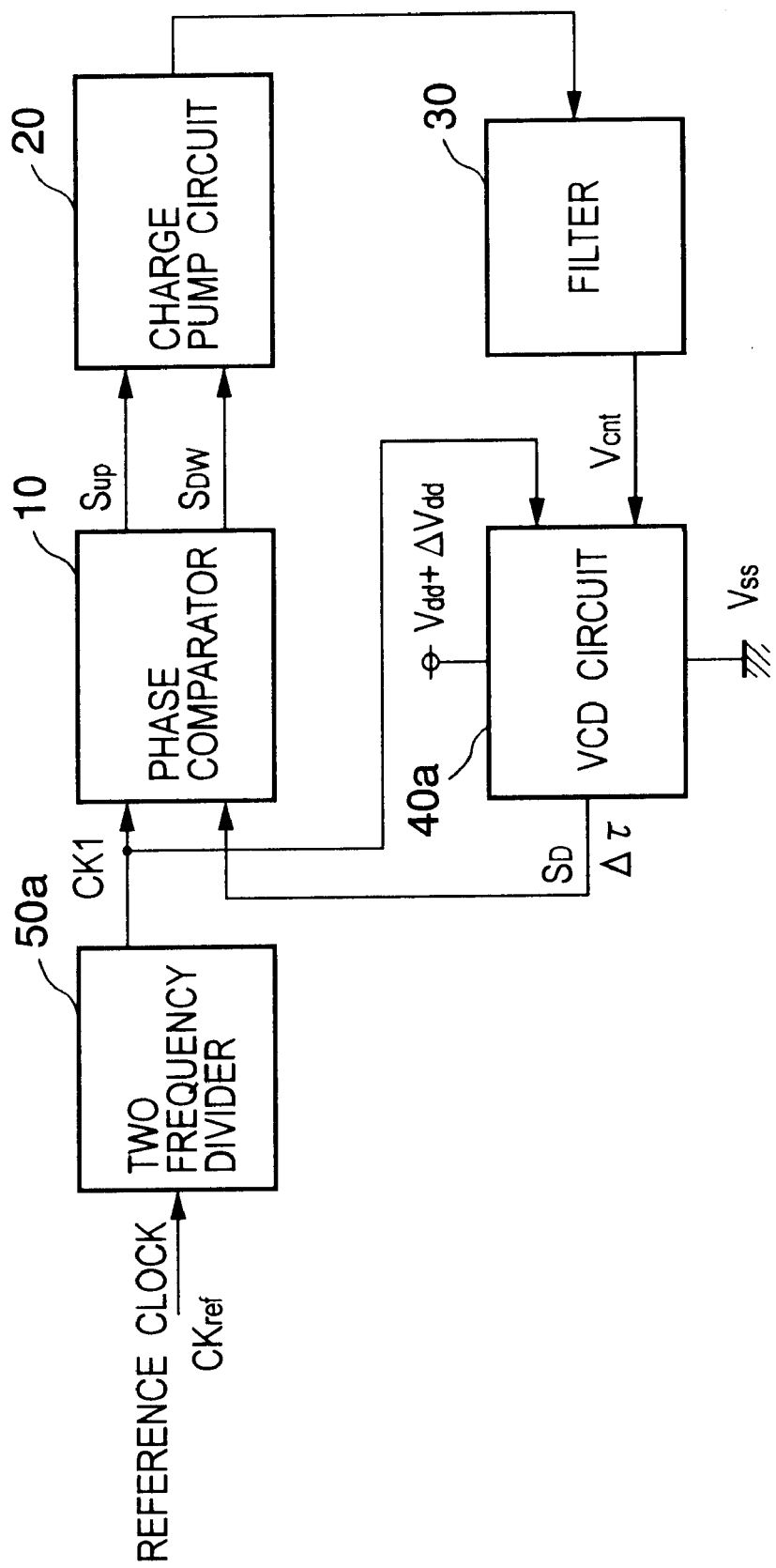
FIG. 42 is a circuit diagram of the configuration of a DLL circuit as a third example of application of the present invention.

FIG. 42 is a circuit diagram of an example of a DLL (Delay Locked Loop) using the voltage-controlled delay circuit (VCD) of the present invention. As shown in the figure, the DLL is comprised of a phase comparator 10, a charge pump circuit 20, a filter 30, a vco 40$a$, and a $\lambda/2$ frequency divider 50$a$.

The $\lambda/2$ frequency divider 50$a$ supplies to the phase comparator 10 a frequency division signal CK1 obtained by $\frac{1}{2}$ division of a reference clock signal $Ck_{ref}$ input from the outside.

The VCD 40$a$ is controlled in its delay time in accordance with a control signal Vcnt output from the filter 30. The VCD 40$a$ delays an input signal CK1 by the controlled delay time and outputs a delay signal $S_D$.

The phase comparator 10 compares phases of the clock signal CK1 and the delay signal $S_D$ output from the VCO 40$a$ and outputs either of an up signal $S_{UP}$ or a down signal $S_{DW}$ in accordance with the phase difference of these signals.

In this example of application, the phase comparator 10, charge pump circuit 20, and filter 30 are comprised as conventional components. That is, in accordance with the result of the phase comparison by the phase comparator 10, the charge pump circuit 20 and filter 30 generate a control signal Vcnt according to the phase difference between the frequency division clock CK1 and delay signal $S_D$ and supply the same to the VCD 40$a$.

As a result, a delay time $\Delta\tau$ of the VCD 40$a$ is controlled in accordance with a phase difference of the frequency clock signal CK1 and the delay signal $S_D$. As a result, an oscillation signal $S_D$ synchronized in phase with the frequency division clock signal CK1 is obtained from the VCD 40$a$.

As in the present example of application, a loop oscillation circuit configured by using the VCD of the present invention can provide a signal synchronized in phase with the input reference clock signal $Ck_{ref}$. Furthermore, by using the VCD of the present invention, the effect due to a change of a power source voltage $V_{dd}$ on a delay time of the VCD can be reduced and a stabilized oscillation signal can be provided.

Third Example of Application

Figure 43:
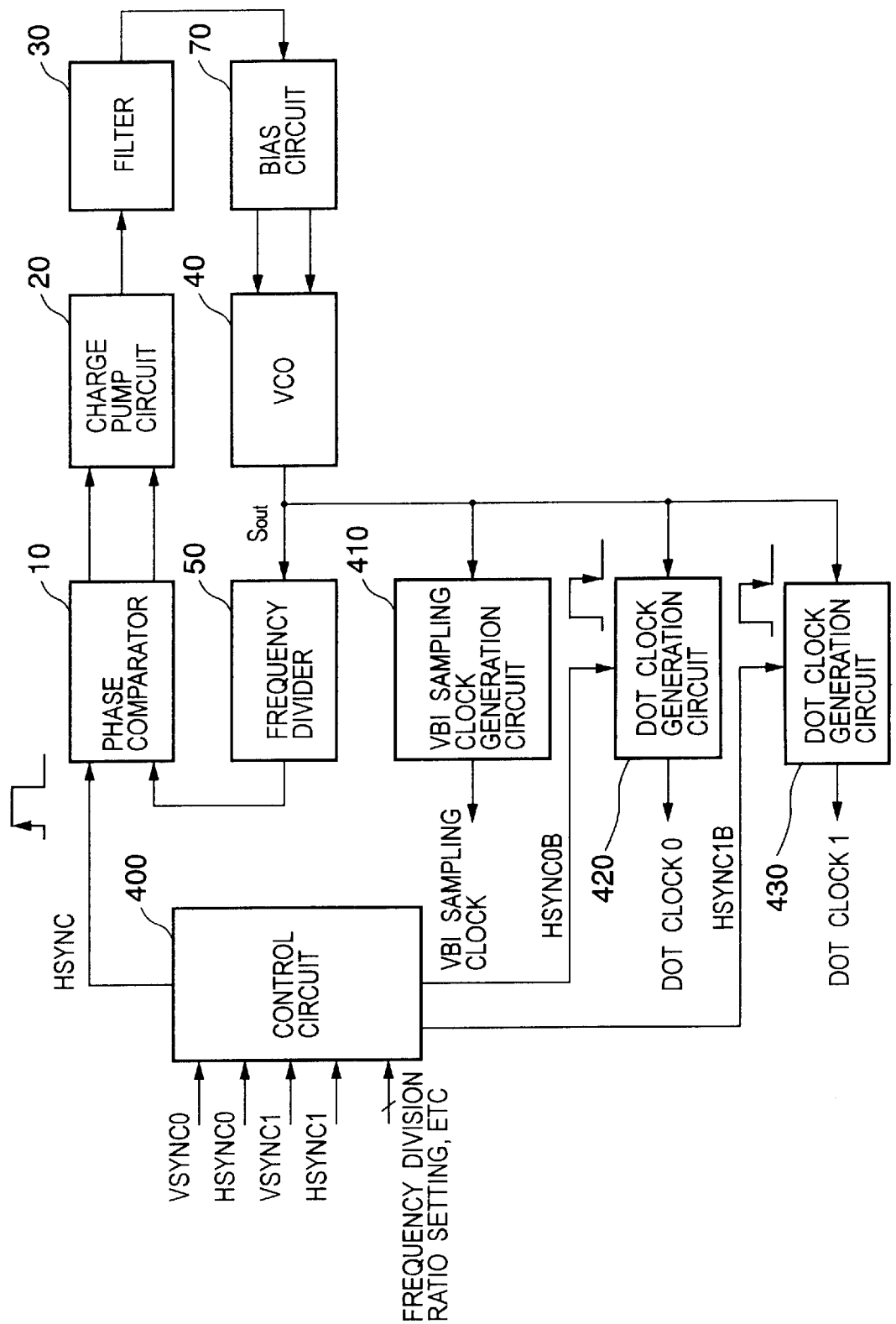
FIG. 43 is a circuit diagram of the configuration of a dot clock generation circuit as a fourth example of application of the present invention.

FIG. 43 is a circuit diagram of a PLL circuit configured by using the VCO of the present invention and a dot clock generation circuit including this PLL circuit.

The dot clock generation circuit of the present example can be applied for example to a generation circuit for generating a dot clock and a VBI sampling clock for digital TV. The PLL circuit for example uses as a reference clock a horizontal synchronization signal HSYNC selected from a horizontal synchronization signal HSYNC0 of a main screen or a horizontal synchronization signal HSYNC1 of a sub-screen and synchronizes with a frequency divider output at a rising edge (corresponding to a right end of the screen) of the same. The charge pump circuit operates at the right end of the screen.

As shown in the figure, the PLL circuit portion is comprised of a phase comparator 10, charge pump 20, filter 30, VCO 40, frequency divider 50, and bias circuit 70. Other than the PLL circuit, a control circuit 400, a VBI sampling clock generation circuit 410$m$ and dot clock generation circuits 420 and 430 are provided. These circuits configure a dot clock generation circuit for generating a dot clock.

In the PLL circuit portion, by using as an inverter type VCO circuit a voltage-controlled oscillator resistant to the effect of power source noise of the present invention, a low jitter PLL circuit is realized. The dot clock generation circuits 420 and 430 receive an output clock $S_{out}$ of the VCO circuit, synchronize the same with the falling edge of the buffer signals HSYNC0B and HSYNC1B of the horizontal synchronization signal, and thereby generate a dot clock signal.

Figure 44:
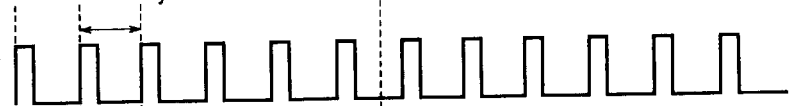
FIGS. 44A to 44F are waveform diagrams of operation of a fourth example of application of the present invention.
Figure 45:
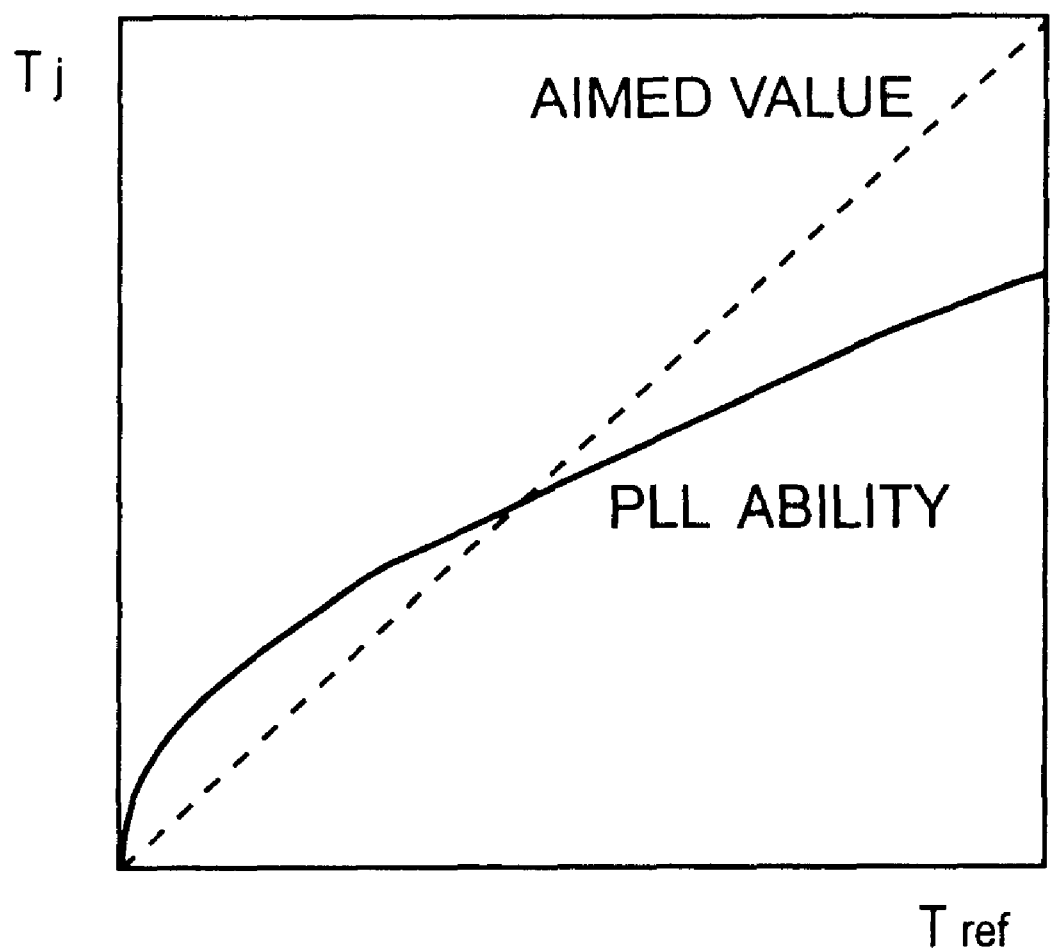
FIG. 45 is a graph of a relationship of an amount of jitter and a reference clock cycle in a conventional high multiplication PLL circuit.

FIGS. 44A to 44F are waveform diagrams of power source noise of a system wherein the dot clock generation circuit of the present example of application operates. The dot clock generation circuit of the present example generates a dot clock signal using as a reference clock a horizontal synchronization signal Hsync shown in FIG. 44A. FIGS. 44B, D, E, and F show digital noise, image display-based noise, servo-based noise, and motor noise mixed in the power source voltage $V_{dd}$, respectively. In the present example of application, by configuring a PLL circuit by using a VCO having measures taken against power source noise, the effect due to the variety of noise mixed in the power source voltage $V_{dd}$ can be reduced and a dot clock signal having a stable frequency can be generated.

By adoption of a VCO circuit resistant to power source noise and improvements to the method of synchronization with the horizontal synchronization signal, the effect due to a change of the power source voltage $V_{dd}$ can be suppressed and a dot clock signal having a stable frequency can be generated in spite of the high multiplication PLL circuit. Therefore, stable OSD letters can be displayed on a display screen and a display without any visible flickering and waving is obtained.

As explained above, according to the delay circuit, voltage-controlled delay circuit, and voltage-controlled oscillation circuit of the present invention, the effect of power source noise can be suppressed and a low jitter PLL circuit or DLL circuit can be realized.

Also, since the voltage-controlled oscillation circuit according to the present invention is capable of obtaining a sufficient jitter characteristic even when built-in in a semiconductor chip, it can be used as a source for generating a dot clock signal for displaying a video signal of a personal computer and displaying OSD letters on TV. As a result, the number of parts in a set can be reduced.

Also, by building the circuit in a semiconductor chip, a variety of control becomes possible such as enabling the setting of the frequency dividing ratio to be changed in accordance with a frequency of a reference clock, so the circuit can be used for a TV designed for digital broadcasting.

Furthermore, according to the present invention, since inverter type delay stages are the basic components of the delay circuit, voltage-controlled delay circuit, or voltage-controlled oscillation circuit, a low power consumption or a low power source voltage can be easily realized.

Note that the present invention is not limited to the above embodiments and includes modifications within the scope of the claims.

What is claimed is:

1. A delay circuit having a delay stage having a drive current controlled in accordance with a bias voltage and having a delay time determined by the drive current,
said delay circuit comprising
an adding means for adding a change of a power source voltage to said bias voltage by a predetermined ratio and supplying a result of the addition to said delay stage.

2. A delay circuit as set forth in claim 1, wherein said adding means includes an alternating current adding means for adding an alternating current component included in an amount of change of said power source voltage to said bias voltage.

3. A delay circuit as set forth in claim 2, wherein said alternating current adding means comprises:
a first capacitor connected between a supply line of said power source voltage and a supply line of said bias voltage and
a second capacitor connected between a supply line of said bias voltage and a supply line of a reference voltage (GND).

4. A delay circuit as set forth in claim 1, wherein said adding means comprises a direct current adding means for adding a direct current component included in an amount of change of said power source voltage to said bias voltage.

5. A delay circuit as set forth in claim 4, wherein said direct current adding means comprises:
a first resistor connected between a supply line of said power source voltage and a supply line of said bias voltage and
a second resistor connected between a supply line of said bias voltage and a supply line of the reference voltage.

6. A delay circuit as set forth in claim 1, wherein said delay stage comprises:
a MOS type inverter;
a first current source transistor connected between said inverter and a supply line of said power source voltage and having a gate to which is applied a first bias voltage; and
a second current source transistor connected between said inverter and a supply line of a reference voltage and having a gate to which is applied a second bias voltage.

7. A delay circuit as set forth in claim 6, wherein said MOS type inverter is an inverter of a differential configuration having a first current source transistor and a second current source transistor as current source transistors.

8. A delay circuit as set forth in claim 6, wherein said adding means comprises
a first alternating current adding means for adding alternating current components included in an amount of change of said power source voltage to said first bias voltage and
a second alternating current adding means for adding alternating current components included in an amount of change of said power source voltage to said second bias voltage.

9. A delay circuit as set forth in claim 8, wherein said alternating current adding means comprises:
a first capacitor connected between a supply line of said power source voltage and a supply line of said bias voltage and
a second capacitor connected between a supply line of said bias voltage and a supply line of a reference voltage (GND).

10. A delay circuit as set forth in claim 6, wherein said adding means comprises:
a first direct current adding means for adding direct current components included in an amount of change of said power source voltage to said first bias voltage and
a second direct current adding means for adding direct current components included in the amount of change of said power source voltage to said second bias voltage.

11. A delay circuit as set forth in claim 6, wherein said delay stage comprises:
a MOS type inverter;
a plurality of first current source transistors each having one terminal connected to a supply line of said power source voltage and having a gate to which is applied a first bias voltage;
a plurality of second current source transistors each having one terminal connected to a supply line of said power source voltage and having a gate to which is applied a second bias voltage;
a first switching circuit connected between said first current source transistor and said inverter for selecting any one or more of output currents of said plurality of first current source transistors and supplying the same to said inverter; and
a second switching circuit connected between said second current source transistor and said inverter for selecting any one or more of output currents of said plurality of second current source transistors and supplying the same to said inverter.

12. A delay circuit as set forth in claim 11, wherein said MOS type inverter is an inverter of a differential configuration having the plurality of first current source transistors and the plurality of second current source transistors as current source transistors.

13. A delay circuit as set forth in claim 11, wherein said alternating current adding means comprises:
a first capacitor connected between a supply line of said power source voltage and a supply line of said bias voltage and a second capacitor connected between a supply line of said bias voltage and a supply line of a reference voltage (GND).

14. A delay circuit as set forth in claim 1, wherein said delay stage comprises:
   a MOS type inverter;
   a switching transistor having one terminal connected to an output terminal of said inverter and a gate to which is applied said bias voltage; and
   a capacitor having one electrode connected to the other terminal of said switching transistor and having another electrode connected to a supply line of a reference voltage.

15. A delay circuit as set forth in claim 14, wherein:
   said adding means comprises a capacitor connected between a supply line of said power source voltage and a supply line of said bias voltage and couples the alternating current components of a change of said power source voltage with said bias voltage.

16. A delay circuit having a delay stage, wherein a delay time is determined by a supplied drive current, said delay stage comprising: a MOS type inverter;
   a first current source circuit for supplying a first drive current to said inverter in accordance with a first bias voltage;
   a second current source circuit for supplying a second drive current having a power source voltage dependency different from that of said first drive current to said inverter;
   a first adding means for adding a change of said power source voltage to said first bias voltage by a first ratio and supplying a result of the addition to said first current source circuit; and
   a second adding means for adding the change of said power source voltage to said second bias voltage by a second ratio and supplying a result of the addition to said second current source circuit.

17. A delay circuit as set forth in claim 16, wherein:
   said first adding means comprises a capacitor connected between a supply line of said power source voltage and a supply line of said first bias voltage and couples the alternating current components of a change of said power source voltage with said bias voltage.

18. A delay circuit as set forth in claim 16, wherein said second adding means comprises:
   a first capacitor connected between a supply line of said power source voltage and a supply line of said second bias voltage and
   a second capacitor connected between a supply line of said bias voltage and a supply line of a reference voltage.

19. A delay circuit as set forth in claim 16, wherein:
   said MOS type inverter is an inverter of a differential configuration having a first current source circuit and a second current source circuit having a common current output terminal as current source circuits; and
   further comprising:
      a means for supplying to a control voltage of a first current source circuit alternating current components of a change of a power source voltage by a first ratio by a first capacitor connected between a supply line of the power source voltage and a supply line of a first bias voltage and a second capacitor connected between the supply line of the first bias voltage and a supply line of a reference voltage (GND) and
      a means for supplying to a control voltage of a second current source circuit alternating current components of the change of the power source voltage at a second ratio by a third capacitor connected between the supply line of the power source voltage and a supply line of a second bias voltage and a fourth capacitor connected between the supply line of the second bias voltage and the supply line of the reference voltage (GND).

20. A delay circuit as set forth in claim 16, wherein:
   said MOS type inverter is an inverter of a differential configuration having a first current source circuit and a second current source circuit having a common current output terminal as current source circuits; and
   further comprising:
      a means for not supplying to a control voltage of a first current source circuit alternating current components of a change of a power source voltage by a first capacitor connected between a supply line of a power source voltage and a supply line of a first bias voltage or a second capacitor connected between the supply line of the first bias voltage and a supply line of a reference voltage (GND) and
      a means for supplying to a control voltage of a second current source circuit alternating current components of the change of the power source voltage by a second ratio by a second capacitor connected between the supply line of the power source voltage and a supply line of a second bias voltage and a third capacitor connected between the supply line of the second bias voltage and the supply line of the reference voltage (GND).

21. A delay circuit as set forth in claim 18, wherein said first capacitor has a variable capacitance.

22. A delay circuit as set forth in claim 18, wherein said second capacitor has a variable capacitance.

23. A delay circuit as set forth in claim 16, wherein said second adding means comprises:
   a first resistor connected between a supply line of said power source voltage and a supply line of said second bias voltage and
   a second resistor connected between a supply line of said bias voltage and a supply line of a reference voltage.

24. A delay circuit as set forth in claim 16, wherein said second adding means comprises:
   a first diode and a first resistor connected in series between a supply line of said power source voltage and a supply line of said second bias voltage and
   a second resistor and a second diode connected in series between the supply line of said second bias voltage and a supply line of a reference voltage.

25. A delay circuit comprised of a plurality of delay stages having different power source voltage dependency,
   said delay circuit comprising:
      first delay stages having a first power source voltage dependency and
      second delay stages having a second power source voltage dependency opposite to said first power source voltage dependency;
      numbers of said first delay stages and the second delay stages being determined by a predetermined ratio,
      wherein the ratio of said first delay stages and the second delay stages are determined within a delay time when jitter of said delay circuit is not more than a desired target value.

26. A delay circuit as set forth in claim 25, further providing third delay stages having suppressed power source voltage dependency of a delay time in addition to said first and second delay stages.

27. A delay adjustment circuit for outputting a delay signal obtained by adding a predetermined time to an input signal, comprising:
   a bias circuit for generating a bias voltage;
   a delay circuit for delaying said input signal by a plurality of different delay times controlled in accordance with said bias voltage and outputting a plurality of delay signals; and
   a selection circuit for selecting any one or more of the plurality of delay signals output from said delay circuit in accordance with a selection signal;
   said delay circuit being a delay circuit as set forth in claims 1–15, 16–24 and 25–26.

28. A voltage-controlled delay circuit including a delay stage having a drive current controlled in accordance with a control voltage and having a delay time determined by the drive current, comprising
   an adding means for adding a change of a power source voltage to said control voltage by a predetermined ratio and supplying a result of the addition to said delay stage.

29. A voltage-controlled delay circuit as set forth in claim 28, wherein said adding means comprises an alternating current adding means for adding alternating current components included in an amount of change of said power source voltage to said control voltage.

30. A voltage-controlled delay circuit as set forth in claim 28, wherein said adding means comprises a direct current adding means for adding direct current components included in an amount of change of said power source voltage to said control voltage.

31. A voltage-controlled delay circuit as set forth in claim 28, wherein said delay stage comprises:
   a MOS type inverter;
   a first power source transistor connected between said inverter and a supply line of said power source voltage and having a gate to which is applied a first control voltage; and
   a second current source transistor connected between said inverter and a supply line of a reference voltage and having a gate to which is applied a second control voltage.

32. A voltage-controlled delay circuit as set forth in claim 31, wherein said MOS type inverter is an inverter of a differential configuration having the first current source transistor and the second current source transistor as current source transistors.

33. A voltage-controlled delay circuit as set forth in claim 29, wherein said alternating current adding means comprises:
   a first capacitor connected between a supply line of said power source voltage and a supply line of said bias voltage and
   a second capacitor connected between the supply line of said bias voltage and a supply line of a reference voltage (GND).

34. A voltage-controlled delay circuit as set forth in claim 31, wherein said adding means comprises:
   a first alternating current adding means for adding alternating current components included in an amount of change of said power source voltage to said first control voltage and
   a second alternating current adding means for adding alternating current components included in the amount of change of said power source voltage to said second control voltage.

35. A voltage-controlled delay circuit as set forth in claim 31, wherein said adding means comprises:
   a first direct current adding means for adding direct current components included in an amount of change of said power source voltage to said first control voltage and
   a second direct current adding means for adding direct current components included in the amount of change of said power source voltage to said second control voltage.

36. A voltage-controlled delay circuit as set forth in claim 29, wherein said delay stage comprises:
   a MOS type inverter;
   a plurality of first current source transistors each having one terminal connected to a supply line of a reference voltage and having a gate to which is applied a first control voltage;
   a plurality of second current source transistors each having one terminal connected to a supply line of said power source voltage and having a gate to which is applied a second control voltage;
   a first switching circuit connected between said first current source transistors and said inverter for selecting any one or more of output currents of said plurality of first current source transistors and supplying the same to said inverter; and
   a second switching circuit connected between said second current source transistors and said inverter for selecting any one or more of output currents of said plurality of second current source transistors and supplying the same to said inverter.

37. A voltage-controlled delay circuit as set forth in claim 36, wherein said MOS type inverter is an inverter of a differential configuration having the plurality of first current source transistors and the plurality of second current source transistors as current source transistors.

38. A voltage-controlled delay circuit as set forth in claim 36, wherein said alternating current adding means comprises:
   a first capacitor connected between a supply line of said power source voltage and a supply line of said bias voltage and
   a second capacitor connected between the supply line of said bias voltage and a supply line of a reference voltage (GND).

39. A voltage-controlled delay circuit as set forth in claim 28, wherein said delay stage comprises:
   a MOS type inverter;
   a switching transistor each having one terminal connected to an output terminal of said inverter and a gate to which is applied said control voltage; and
   a capacitor having one electrode connected to the other terminal of said switching transistor and having another electrode connected to a supply line of a reference voltage.

40. A voltage-controlled delay circuit as set forth in claim 39, wherein:
   said adding means comprises a capacitor connected between a supply line of said power source voltage and a supply line of said control voltage and couples the alternating current components of a change of said power source voltage with said control voltage.

41. A voltage-controlled delay circuit having a delay stage, wherein a delay time is determined by supplied drive currents, said delay stage comprising:

a MOS type inverter;

a first current source circuit for supplying a first drive current to said inverter in accordance with a first control voltage;

a second current source circuit for supplying a second drive current having a power source voltage dependency different from that of said first drive current to said inverter;

a first adding means for adding a change of said power source voltage to said first control voltage by a first ratio and supplying a result of the addition to said first current source circuit; and a second adding means for adding the change of said power source voltage to said second control voltage by a second ratio and supplying a result of the addition to said second current source circuit.

42. A voltage-controlled delay circuit as set forth in claim 41, wherein:

said MOS type inverter is an inverter of a differential configuration having a first current source circuit and a second current source circuit having a common current output terminal as current source circuits; and further comprising:

a means for supplying to a control voltage of a first current source circuit alternating current components of a change of the power source voltage by a first ratio by a first capacitor connected between a supply line of the power source voltage and a supply line of a first bias voltage and a second capacitor connected between the supply line of the first bias voltage and a supply line of a reference voltage (GND) and a means for supplying to a control voltage of a second current source circuit alternating current components of the change of the power source voltage by a second ratio by a third capacitor connected between the supply line of the power source voltage and a supply line of a second bias voltage and a fourth capacitor connected between the supply line of the second bias voltage and the supply line of the reference voltage (GND).

43. A voltage-controlled delay circuit as set forth in claim 41, wherein:

said MOS type inverter is an inverter of a differential configuration having a first current source circuit and a second current source circuit having a common current output terminal as current source circuits; and further comprising:

a means for not supplying to a control voltage of a first current source circuit alternating current components of a change of the power source voltage by a first capacitor connected between a supply line of the power source voltage and a supply line of a first bias voltage or a first capacitor connected between the supply line of the first bias voltage and a supply line of a reference voltage (GND) and a means for supplying to a control voltage of a second current source circuit alternating current components of the change of the power source voltage by a certain ratio by a second capacitor connected between the supply line of the power source voltage and a supply line of a second bias voltage and a third capacitor connected between the supply line of the second bias voltage and the supply line of the reference voltage (GND).

44. A voltage-controlled delay circuit comprised of a plurality of delay stages having different power source voltage dependency, comprising:

first delay stages having a delay time controlled in accordance with a control voltage and having a first power source voltage dependency and second delay stages having a delay time controlled in accordance with said control voltage and having a second power source voltage dependency opposite to said first power source voltage dependency;

numbers of said first delay stages and the second delay stages being determined by a predetermined ratio, wherein the ratio of said first delay stages and the second delay stages is determined within a delay time when jitter of said voltage-controlled delay circuit is not more than a desired target value.

45. A voltage-controlled delay circuit as set forth in claim 44, further providing third delay stages suppressed in power source voltage dependency of a delay time in addition to said first and second delay stages.

46. A DLL circuit comprising:

a phase comparison means for comparing phases of an input signal and a delay signal and outputting a phase difference signal in accordance with a result of the comparison;

a voltage output means for outputting a control voltage in accordance with said phase difference signal; and a voltage-controlled delay circuit for delaying said input signal by a delay time controlled in accordance with said control voltage and outputting said delay signal; wherein said voltage-controlled delay circuit is a voltage-controlled delay circuit as set forth in claims 28–40, 41–43 and 44–45.

47. A voltage-controlled oscillation circuit having delay stages each having a drive current controlled in accordance with a control voltage and having a delay time determined by the drive current connected in a ring, comprising an adding means for adding a change of a power source voltage to said control signal by a predetermined ratio and supplying a result of the addition to said delay stages.

48. A voltage-controlled oscillation circuit as set forth in claim 47, wherein said adding means comprises an alternating current adding means for adding alternating current components included in an amount of change of said power source voltage to said control voltage.

49. A voltage-controlled oscillation circuit as set forth in claim 47, wherein said adding means comprises a direct current adding means for adding direct current components included in an amount of change of said power source voltage to said control voltage.

50. A voltage-controlled oscillation circuit as set forth in claim 47, wherein said delay stage comprises:

a MOS type inverter;

a first power source transistor connected between said inverter and a supply line of said power source voltage and having a gate to which is applied a first control voltage; and a second current source transistor connected between said inverter and a supply line of a reference voltage and having a gate to which is applied a second control voltage.

51. A voltage-controlled oscillation circuit as set forth in claim 50, wherein said adding means comprises:

a first alternating current adding means for adding alternating current components included in an amount of change of said power source voltage to said first control voltage and a second alternating current adding means for adding alternating current components included in the amount of change of said power source voltage to said second control voltage.

52. A voltage-controlled oscillation circuit as set forth in claim 51, wherein said MOS type inverter is an inverter of a differential configuration having a first current source transistor and a second current source transistor as current source transistors.

53. A voltage-controlled oscillation circuit as set forth in claim 51, wherein said alternating current adding means comprises:
 a first capacitor connected between a supply line of said power source voltage and a supply line of said bias voltage and
 a second capacitor connected between the supply line of said bias voltage and a supply line of a reference voltage (GND).

54. A voltage-controlled oscillation circuit as set forth in claim 50, wherein said adding means comprises:
 a first direct current adding means for adding direct current components included in an amount of change of said power source voltage to said first control voltage and
 a second direct current adding means for adding direct current components included in the amount of change of said power source voltage to said second control voltage.

55. A voltage-controlled oscillation circuit as set forth in claim 48, wherein said delay stage comprises:
 a MOS type inverter;
 a plurality of first current source transistors each having one terminal connected to a supply line of said power source voltage and having a gate to which is applied a first control voltage;
 a plurality of second current source transistors each having one terminal connected to a supply line of said power source voltage and having a gate to which is applied a second control voltage;
 a first switching circuit connected between said first current source transistors and said inverter for selecting any one or more of output currents of said plurality of first current source transistors and supplying the same to said inverter; and
 a second switching circuit connected between said second current source transistors and said inverter for selecting any one or more of output currents of said plurality of second current source transistors and supplying the same to said inverter.

56. A voltage-controlled oscillation circuit as set forth in claim 55, wherein said MOS type inverter is an inverter of a differential configuration having the plurality of first current source transistor and the plurality of second current source transistor as current source transistors.

57. A voltage-controlled oscillation circuit as set forth in claim 48, wherein said alternating current adding means comprises:
 a first capacitor connected between a supply line of said power source voltage and a supply line of said bias voltage and
 a second capacitor connected between the supply line of said bias voltage and a supply line of a reference voltage (GND).

58. A voltage-controlled oscillation circuit as set forth in claim 47, wherein said delay stage comprises:

a MOS type inverter;
 a switching transistor each having one terminal connected to an output terminal of said inverter and a gate to which is applied said control voltage; and
 a capacitor having one electrode connected to the other terminal of said switching transistor and having another electrode connected to a supply line of a reference voltage.

59. A voltage-controlled oscillation circuit as set forth in claim 48, wherein:
 said adding means comprises a capacitor connected between a supply line of said power source voltage and a supply line of said control voltage and couples the alternating current components of a change of said power source voltage with said control voltage.

60. A control voltage oscillation circuit comprised of delay stages each having a delay time determined by supplied drive currents connected in a ring, wherein:
 said delay stage comprises:
 a MOS type inverter;
 a first current source circuit for supplying a first drive current to said inverter in accordance with a first control voltage;
 a second current source circuit for supplying a second drive current having a power source voltage dependency different from that of said first drive current to said inverter;
 a first adding means for adding a change of said power source voltage to said first control voltage by a first ratio and supplying a result of the addition to said first current source circuit; and
 a second adding means for adding a change of said power source voltage to said second control voltage by a second ratio and supplying a result of the addition to said second current source circuit.

61. A voltage-controlled oscillation circuit as set forth in claim 60, wherein:
 said MOS type inverter is an inverter of a differential configuration having a first current source circuit and a second current source circuit having a common current output terminal as current source circuits; and
 further comprising:
 a means for supplying to a control voltage of a first current source circuit alternating current components of a change of the power source voltage by a first ratio by a first capacitor connected between the supply line of the power source voltage and a supply line of a first bias voltage and a second capacitor connected between the supply line of the first bias voltage and a supply line of a reference voltage (GND) and
 a means for supplying to a control voltage of a second current source circuit alternating current components of the change of the power source voltage by a second ratio by a third capacitor connected between the supply line of a power source voltage and a supply line of a second bias voltage and a fourth capacitor connected between the supply line of the second bias voltage and the supply line of the reference voltage (GND).

62. A voltage-controlled oscillation circuit as set forth in claim 60, wherein:
 said MOS type inverter is an inverter of a differential configuration having a first current source circuit and a second current source circuit having a common current output terminal as current source circuits; and further comprising:
- a means for not supplying to a control voltage of a first current source circuit alternating current components of a change of the power source voltage by a first capacitor connected between a supply line of the power source voltage and a supply line of a first bias voltage or a first capacitor connected between the supply line of the first bias voltage and a supply line of a reference voltage (GND) and
- a means for supplying to a control voltage of a second current source circuit alternating current components of the change of the power source voltage by a certain ratio by a second capacitor connected between a supply line of a power source voltage and a supply line of a second bias voltage and a third capacitor connected between the supply line of the second bias voltage and the supply line of the reference voltage (GND).

63. A voltage-controlled oscillation circuit comprised of a plurality of delay stages each having a different power source voltage dependency connected in a ring, comprising:
- first delay stages having a delay time controlled in accordance with a control voltage and having a first power source voltage dependency and
- second delay stages having a delay time controlled in accordance with said control voltage and having a second power source voltage dependency opposite to said first power source voltage dependency;
- numbers of said first delay stages and the second delay stages being determined by a predetermined ratio,
- wherein the ratio of said first delay stages and the second delay stages is determined within a delay time when jitter of said voltage-controlled oscillation circuit is not more than a desired target value.

64. A voltage-controlled oscillation circuit as set forth in claim 63, further providing third delay stages suppressed in power source voltage dependency of a delay time in addition to said first and second delay stages.

65. A PLL circuit, comprising:
- a phase comparison means for comparing phases of a reference signal and an oscillation signal and outputting a phase difference signal in accordance with a result of the comparison;
- a voltage output means for outputting a control voltage in accordance with said phase difference signal; and
- a voltage-controlled oscillation circuit for oscillating at an oscillation frequency controlled in accordance with said control voltage and outputting said oscillation signal; wherein
- said voltage-controlled oscillation circuit is a voltage-controlled oscillation circuit as set forth in claims 47–59, 60–62 and 63–64.

* * * * *